United States Patent
Gladwin et al.

(10) Patent No.: US 10,020,826 B2
(45) Date of Patent: Jul. 10, 2018

(54) GENERATING MOLECULAR ENCODING INFORMATION FOR DATA STORAGE

(71) Applicant: CLEVERSAFE, INC., Chicago, IL (US)

(72) Inventors: S. Christopher Gladwin, Chicago, IL (US); Jason K. Resch, Chicago, IL (US); Manish Motwani, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 14/613,899

(22) Filed: Feb. 4, 2015

(65) Prior Publication Data
US 2015/0288384 A1    Oct. 8, 2015

Related U.S. Application Data

(60) Provisional application No. 61/974,110, filed on Apr. 2, 2014.

(51) Int. Cl.
| | |
|---|---|
| *H03M 13/00* | (2006.01) |
| *G06F 11/10* | (2006.01) |
| *H03M 13/05* | (2006.01) |

(52) U.S. Cl.
CPC ......... *H03M 13/65* (2013.01); *G06F 11/1008* (2013.01); *G06F 11/1092* (2013.01);
(Continued)

(58) Field of Classification Search
CPC ............ H03M 13/65; H03M 13/6502; H03M 13/6505
See application file for complete search history.

(56) References Cited

U.S. PATENT DOCUMENTS
| | | |
|---|---|---|
| 4,092,732 A | 5/1978 | Ouchi |
| 5,454,101 A | 9/1995 | Mackay et al. |

(Continued)

OTHER PUBLICATIONS

International Searching Authority; International Search Report and Written Opinion; International Application No. PCT/US2015/14625; dated May 14, 2015; 11 pgs.

(Continued)

*Primary Examiner* — Joseph D Torres
(74) *Attorney, Agent, or Firm* — Garlick & Markison; Timothy W. Markison; Harry S. Tyson, Jr.

(57) ABSTRACT

A method begins by a processing module of one or more processing modules of one or more computing devices generating a number for each encoded data slice of a set of encoded data slices based on the encoded data slice, identifying a gene based on the number to produce an identified gene, and creating a linking identifier that links the encoded data slice to the identified gene, where, for the set of encoded data slices, a set of identified genes and a set of linking identifiers are created. The method continues with the processing module generating molecular encoding information from the set of identified genes and the set of linking identifiers, where the molecular encoding information is used to create a molecular storage structure for each identified gene of the set of identified genes yielding a set of molecular storage structures.

18 Claims, 56 Drawing Sheets

(52) U.S. Cl.
CPC ....... *H03M 13/05* (2013.01); *H03M 13/6502* (2013.01); *H03M 13/6505* (2013.01); *G06F 2211/1028* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0055571 | A1* | 3/2003 | Sakakibara ............ B82Y 10/00 702/19 |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0269804 | A1* | 11/2007 | Liew ..................... G06F 19/24 435/6.11 |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2010/0281063 | A1 | 11/2010 | Ushiyama |
| 2012/0185513 | A1 | 7/2012 | Samukawa |
| 2012/0284257 | A1 | 11/2012 | Mousses et al. |
| 2013/0290809 | A1 | 10/2013 | Resch et al. |

OTHER PUBLICATIONS

Shamir; How to Share a Secret; Communications of the ACM; vol. 22, No. 11; Nov. 1979; pp. 612-613.

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

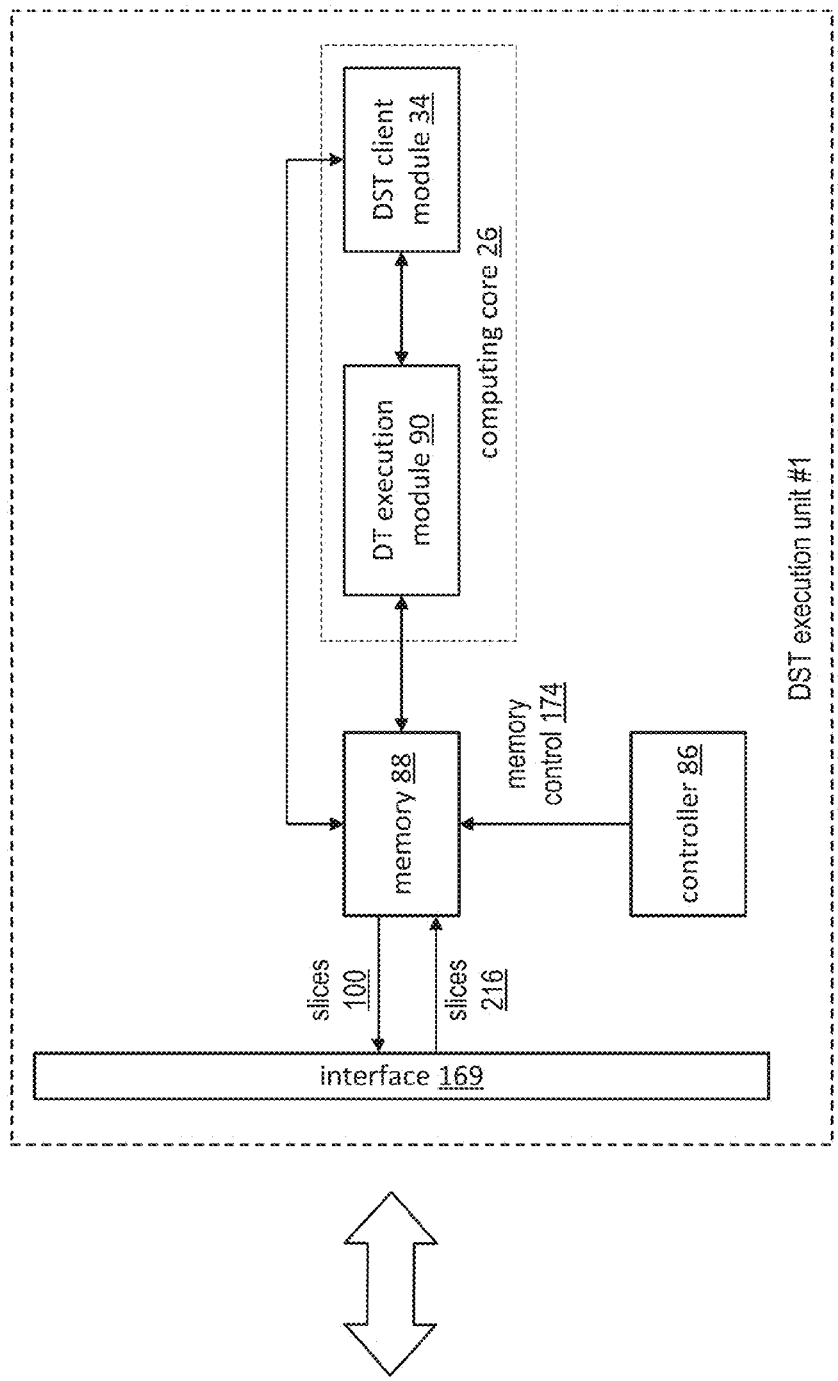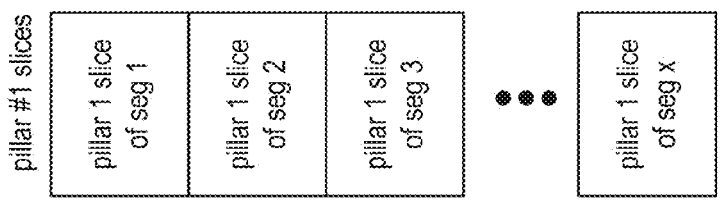
FIG. 24

FIG. 32

DST allocation info 242 data partition info 320: data ID; No. of partitions; Addr. info for each partition; format conversion indication

| task 326 | task ordering 328 | task execution info 322 | | | intermediate result info 324 | | | |
|---|---|---|---|---|---|---|---|---|
| | | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_1, 2_1, 3_1, 4_1, & 5_1 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 1_2, 2_2, 2_3, 2_4, 2_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

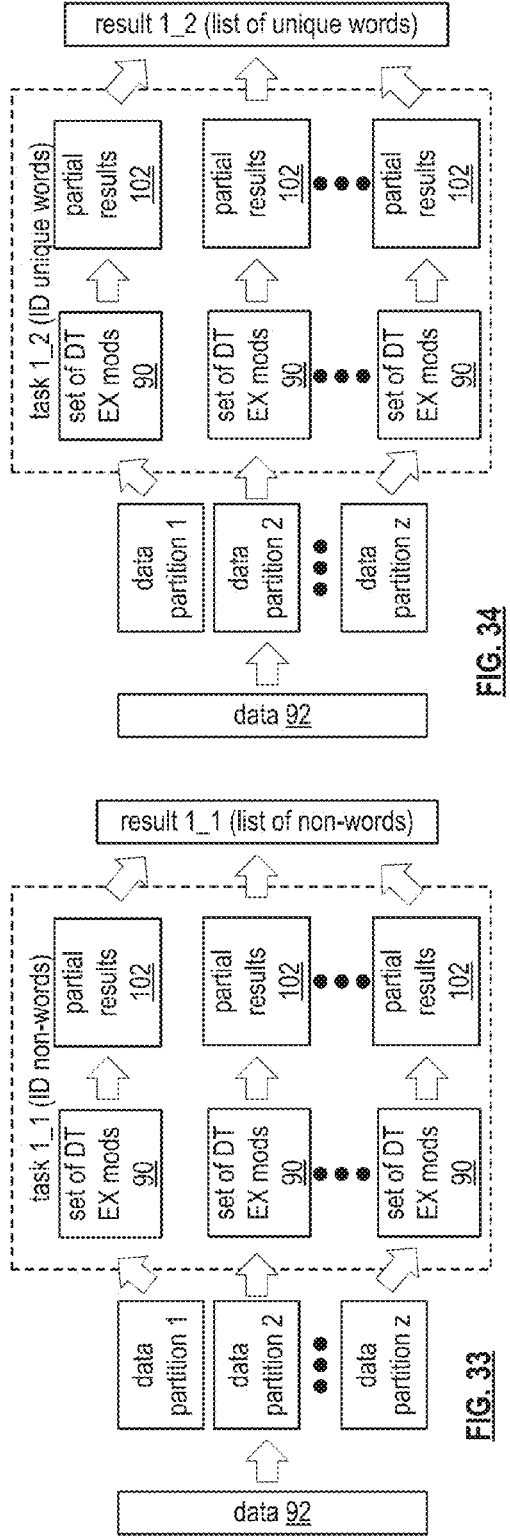
FIG. 33
FIG. 34
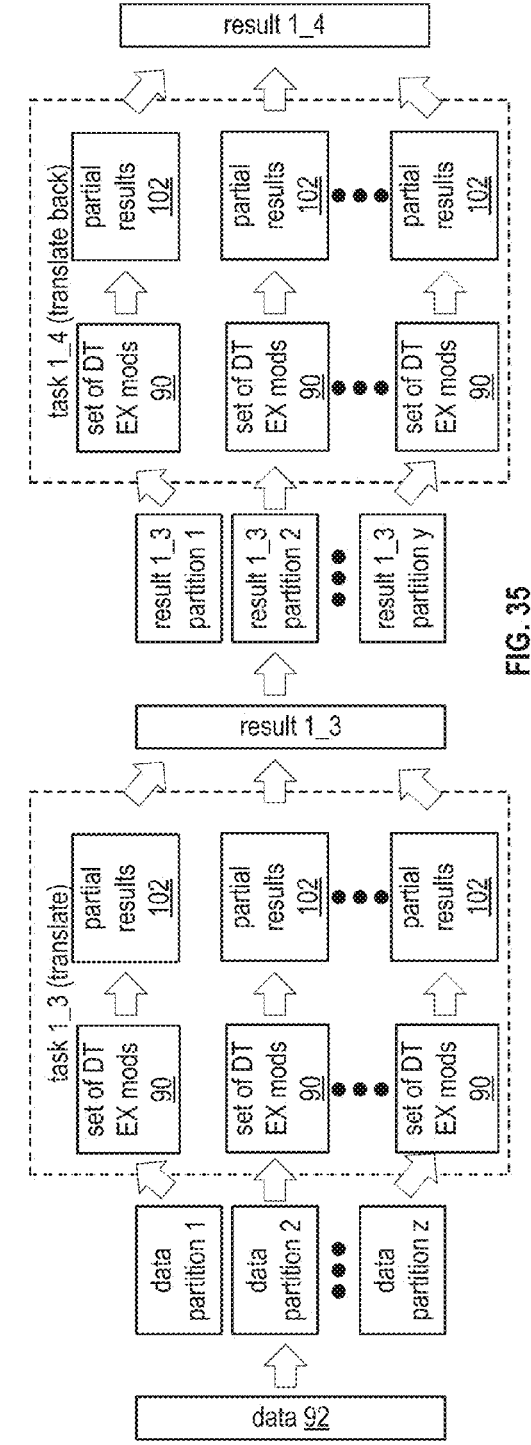
FIG. 35

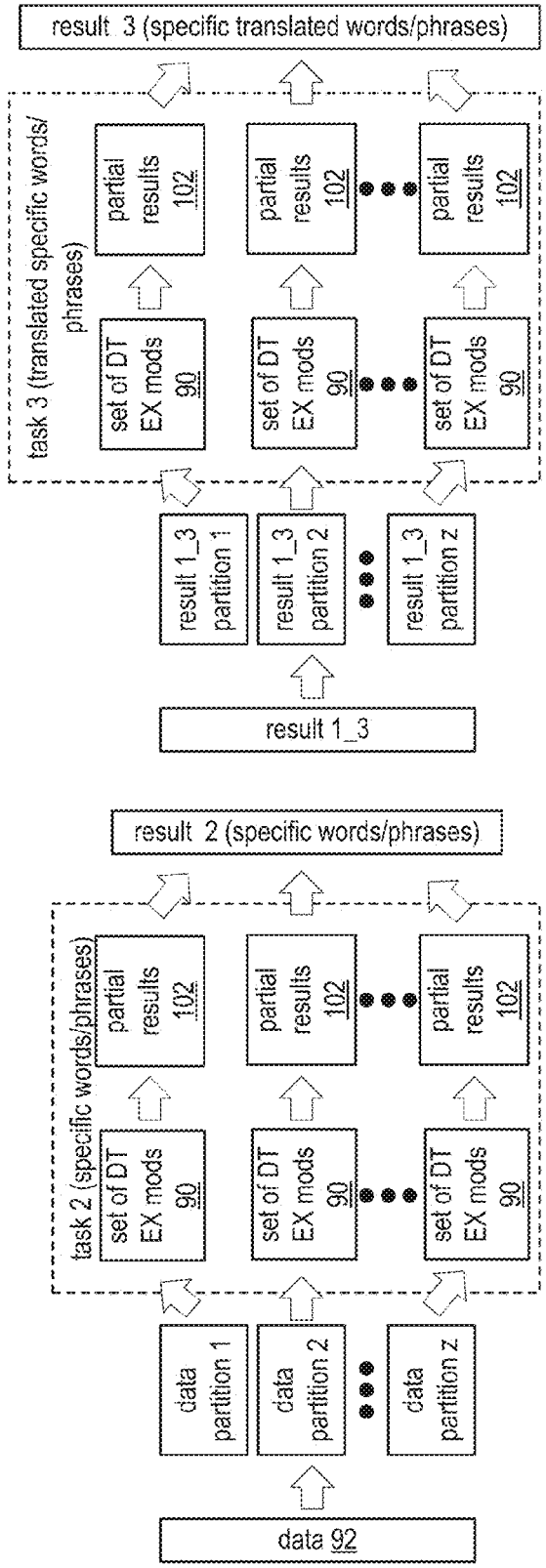
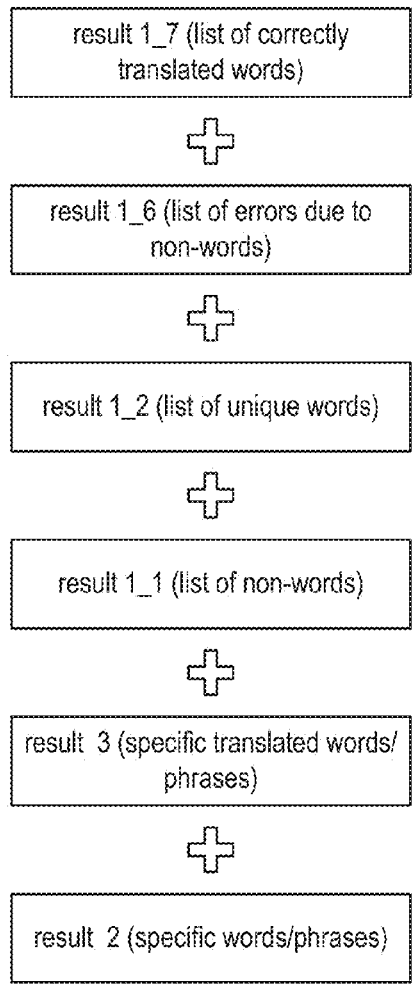
FIG. 38
FIG. 37
FIG. 39

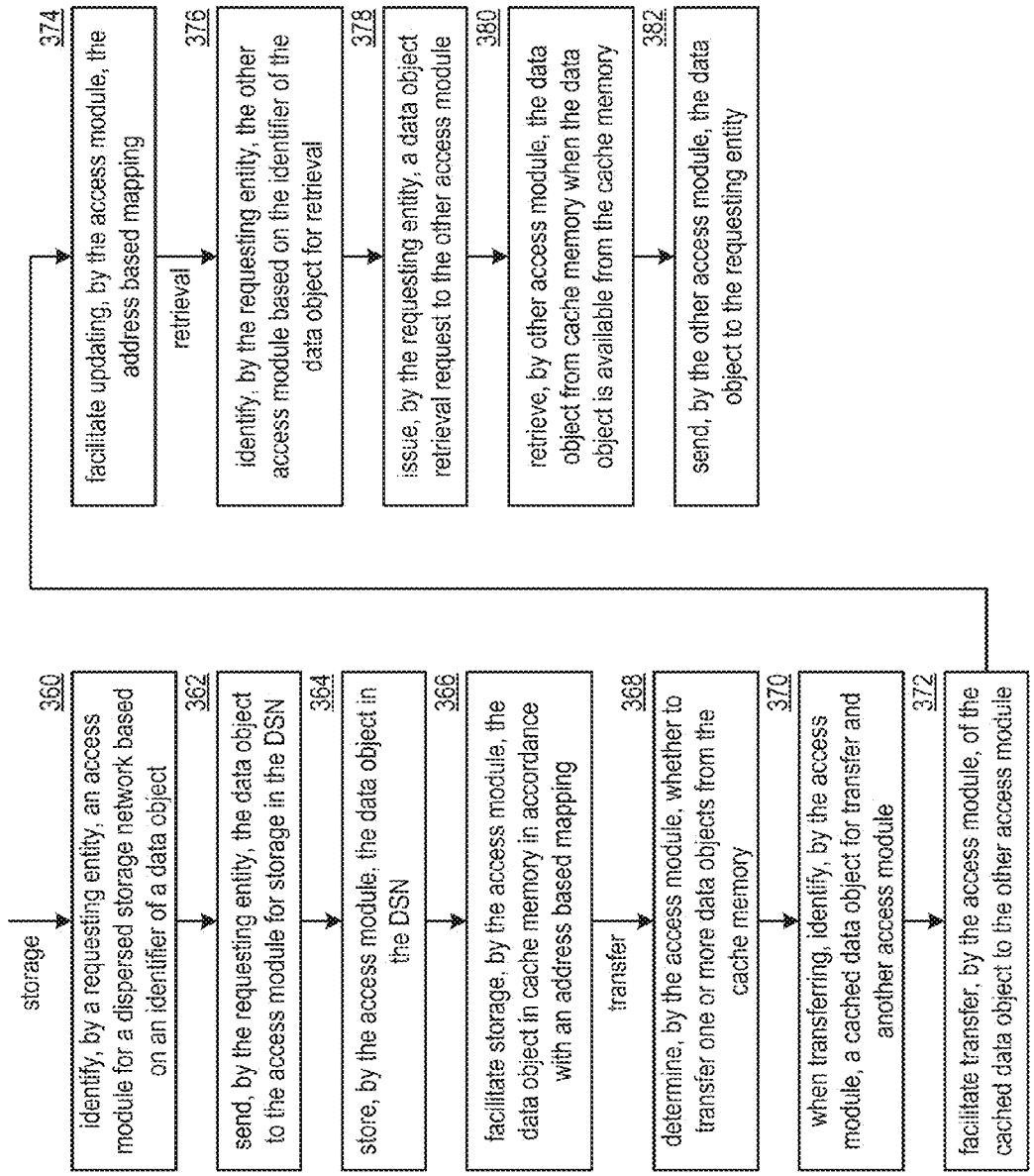

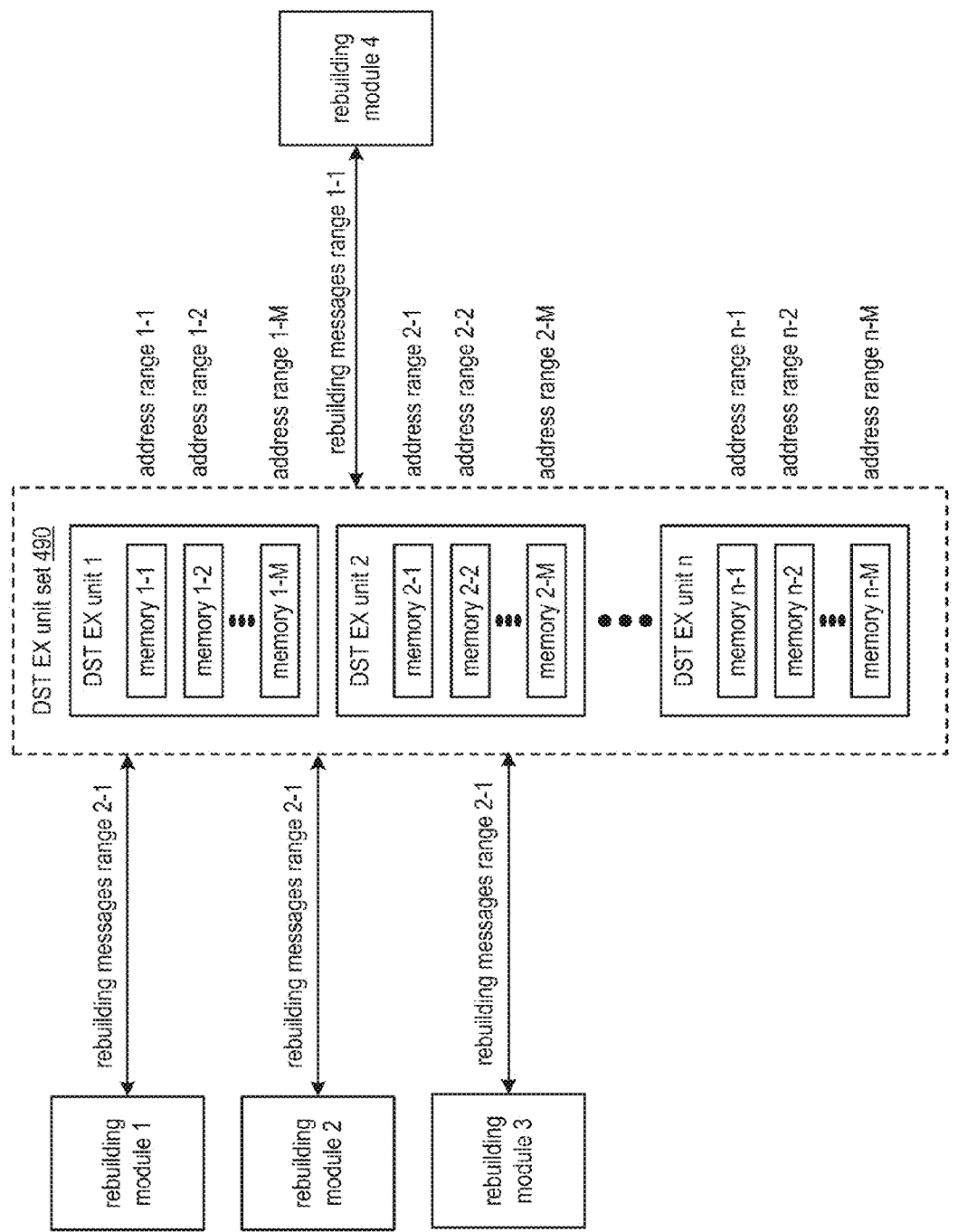

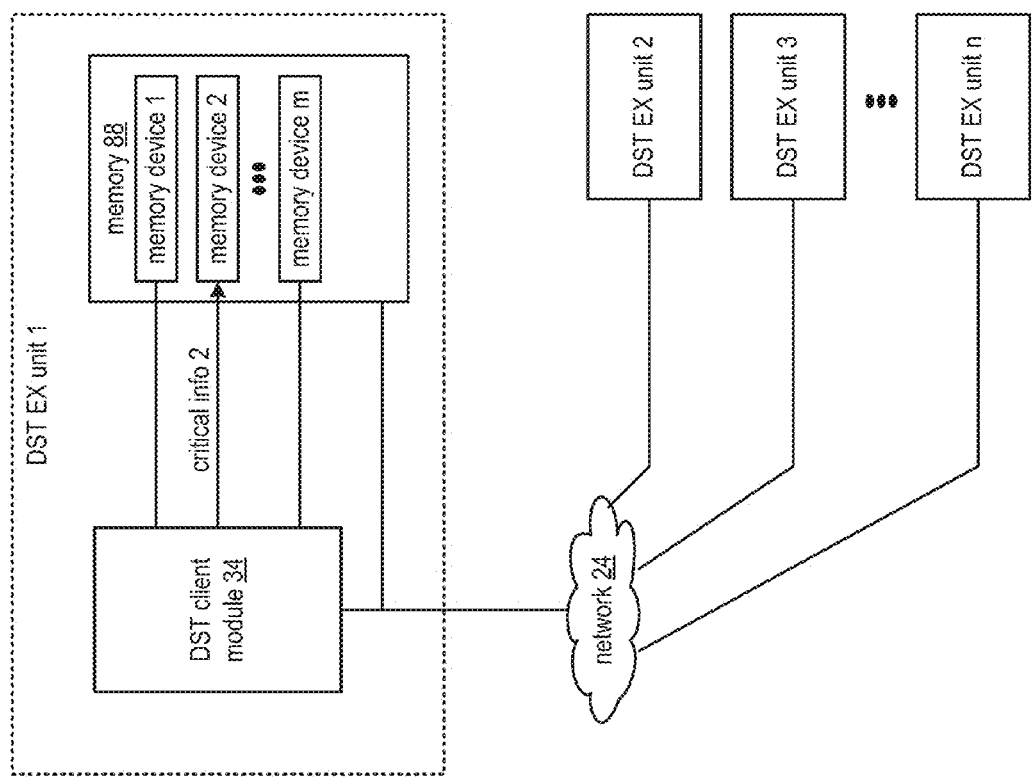

GENERATING MOLECULAR ENCODING INFORMATION FOR DATA STORAGE

CROSS REFERENCE TO RELATED PATENTS

The present U.S. Utility Patent Application claims priority pursuant to 35 U.S.C. § 119(e) to U.S. Provisional Application No. 61/974,110, entitled "ACCESSING DATA IN A DISPERSED STORAGE NETWORK", filed Apr. 2, 2014, which is hereby incorporated herein by reference in its entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 24 is a diagram of an example of a storage operation of a DST execution unit in accordance with the present invention;

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 40B is a flowchart illustrating an example of accessing data in accordance with the present invention;

FIG. 44A is a schematic block diagram of another embodiment of a dispersed storage network (DSN) in accordance with the present invention;

Figure 48A:
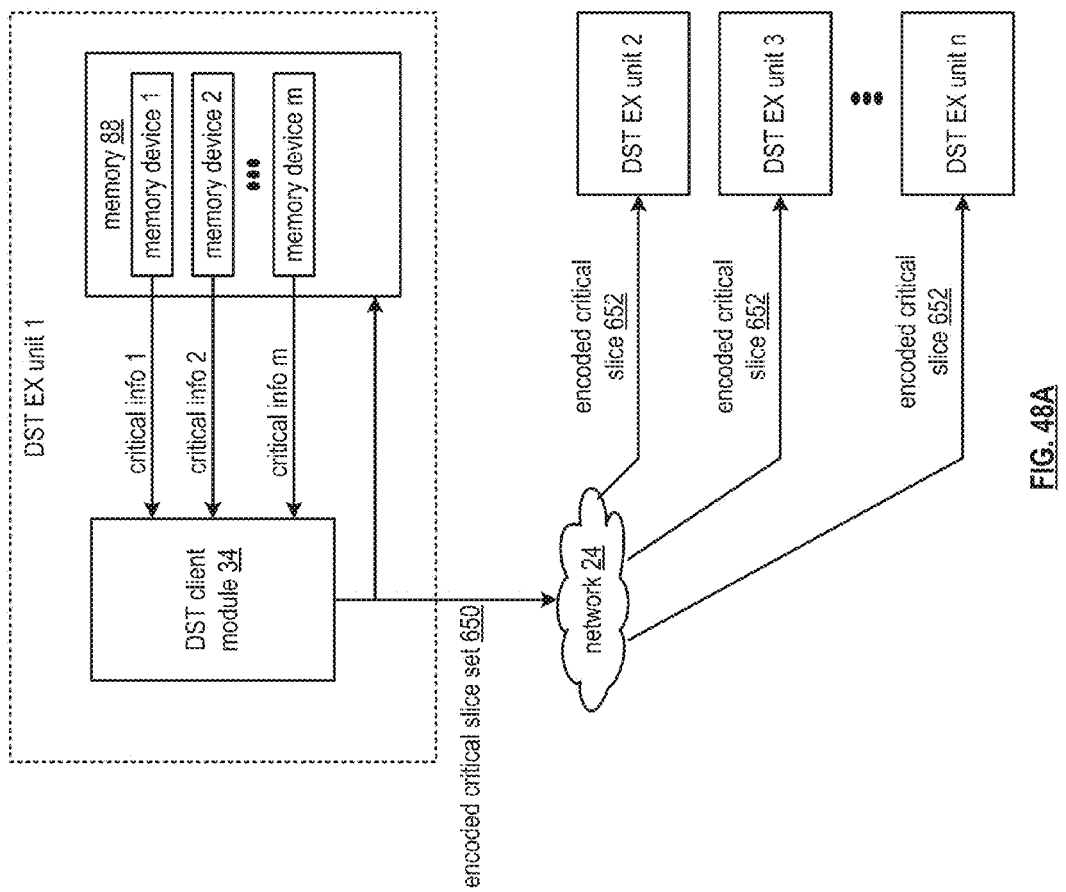
Figure 48B:
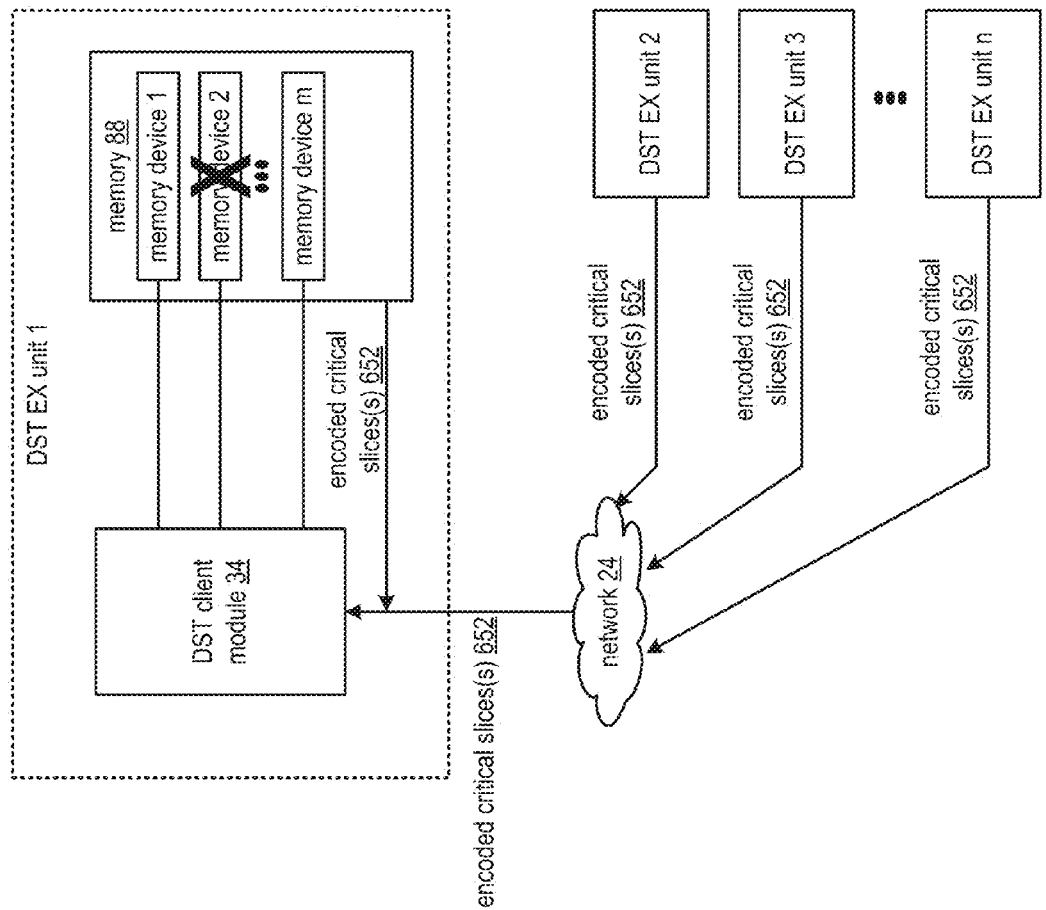
Figure 48D:
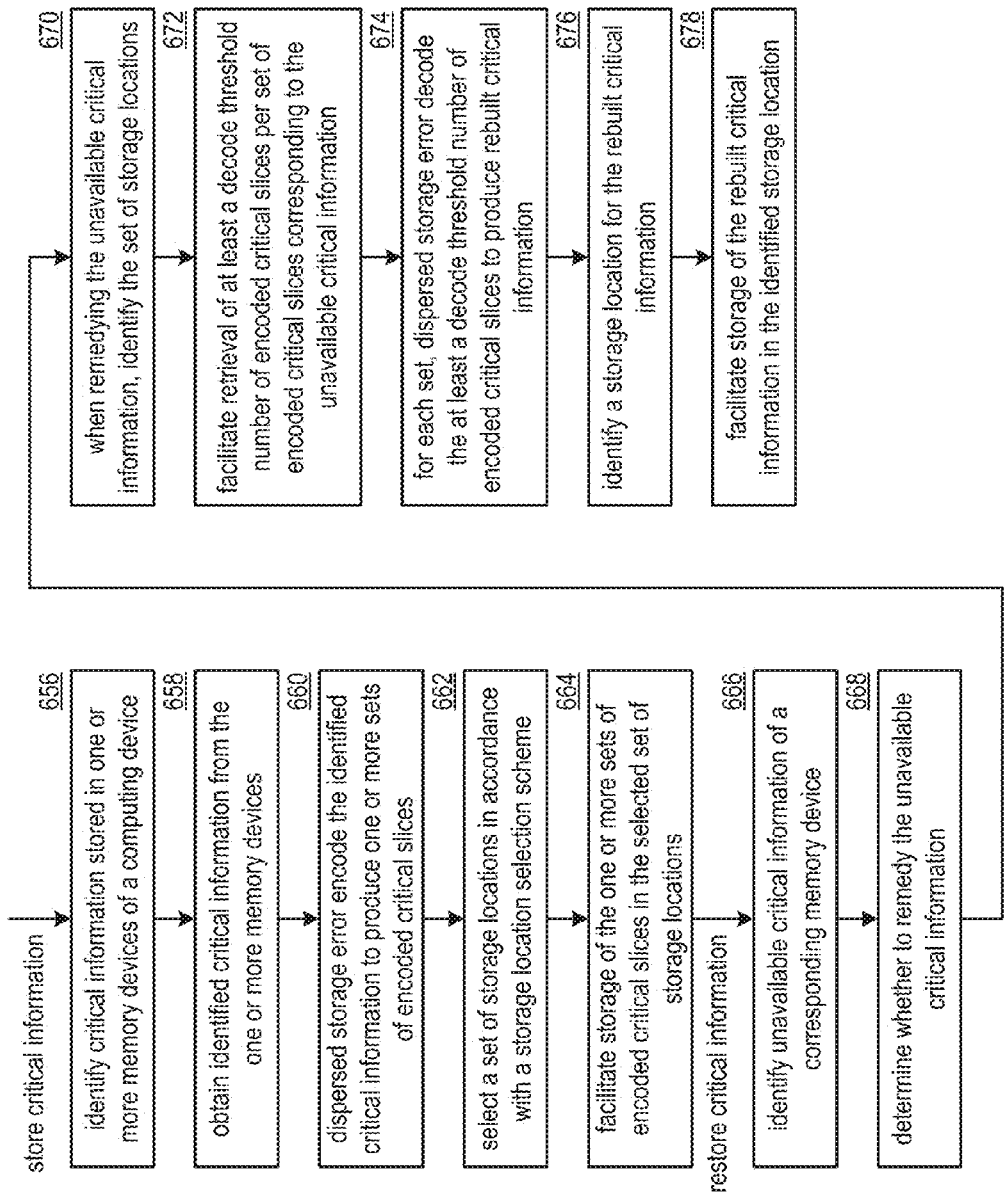

FIGS. 48A, B, C are schematic block diagrams of another embodiment of a dispersed storage network (DSN) illustrating an example of maintaining critical information in accordance with the present invention; and FIG. 48D is a flowchart illustrating an example of maintaining critical information in accordance with the present invention.

DETAILED DESCRIPTION OF THE INVENTION

Figure 1:
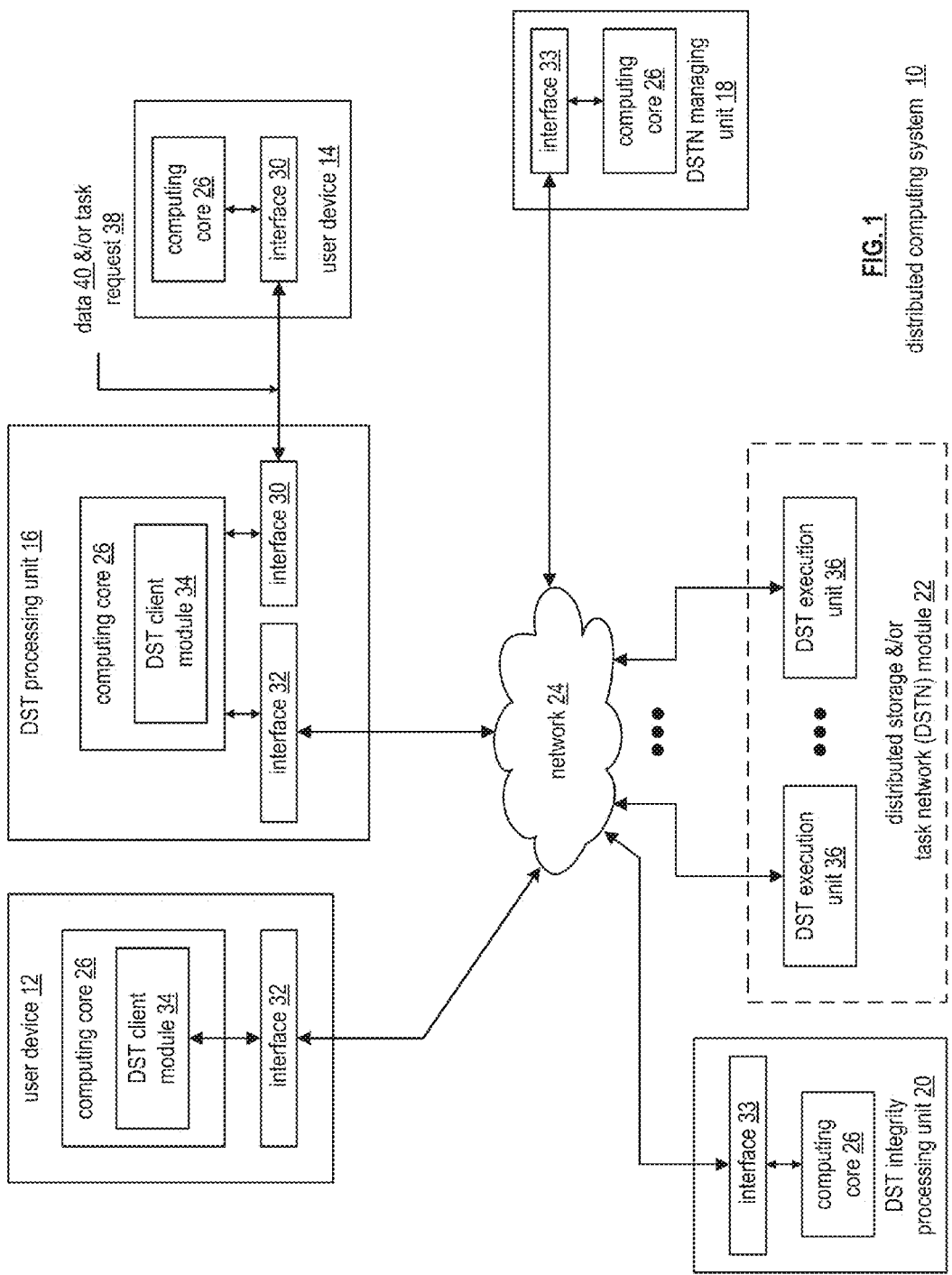
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
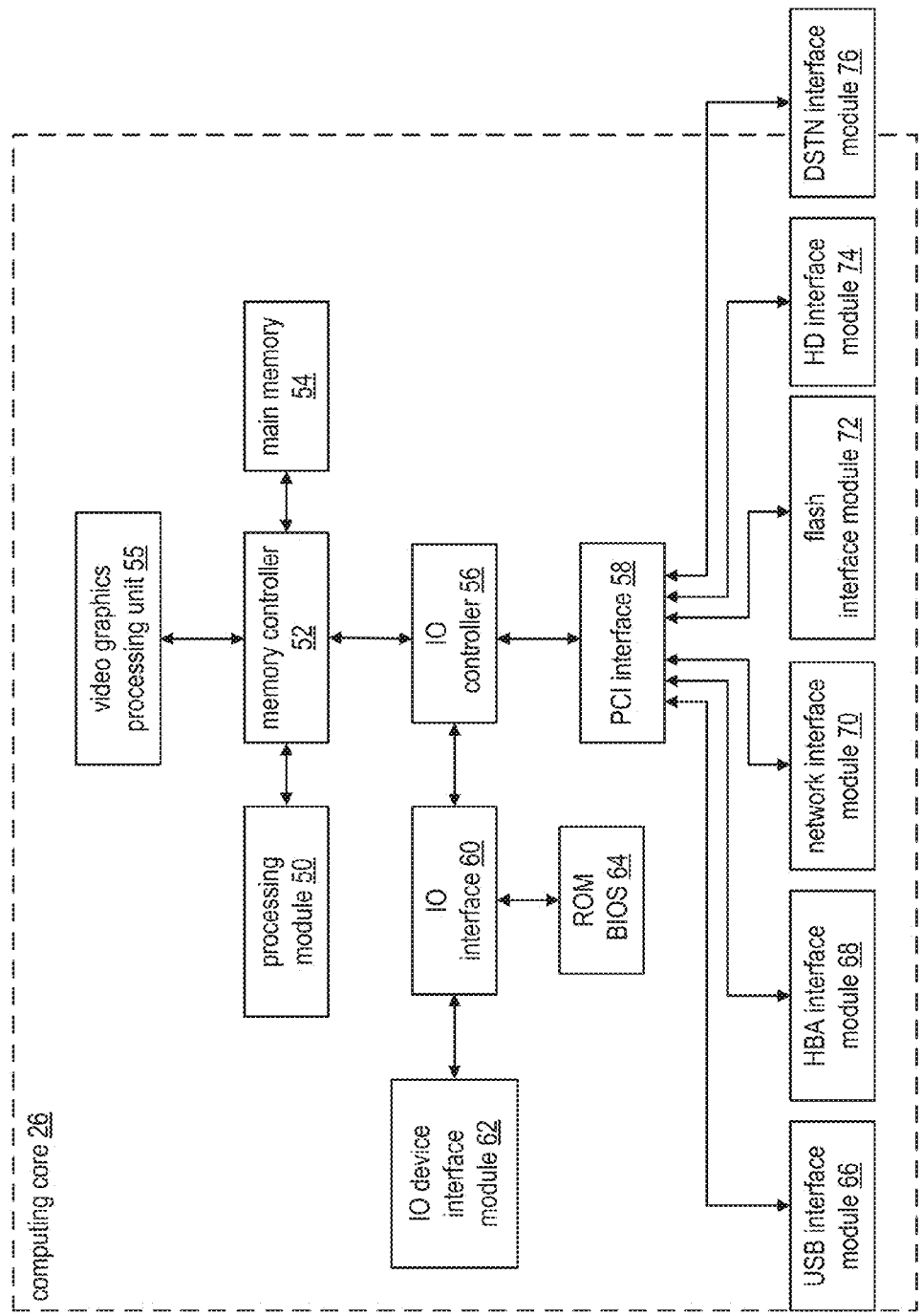
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
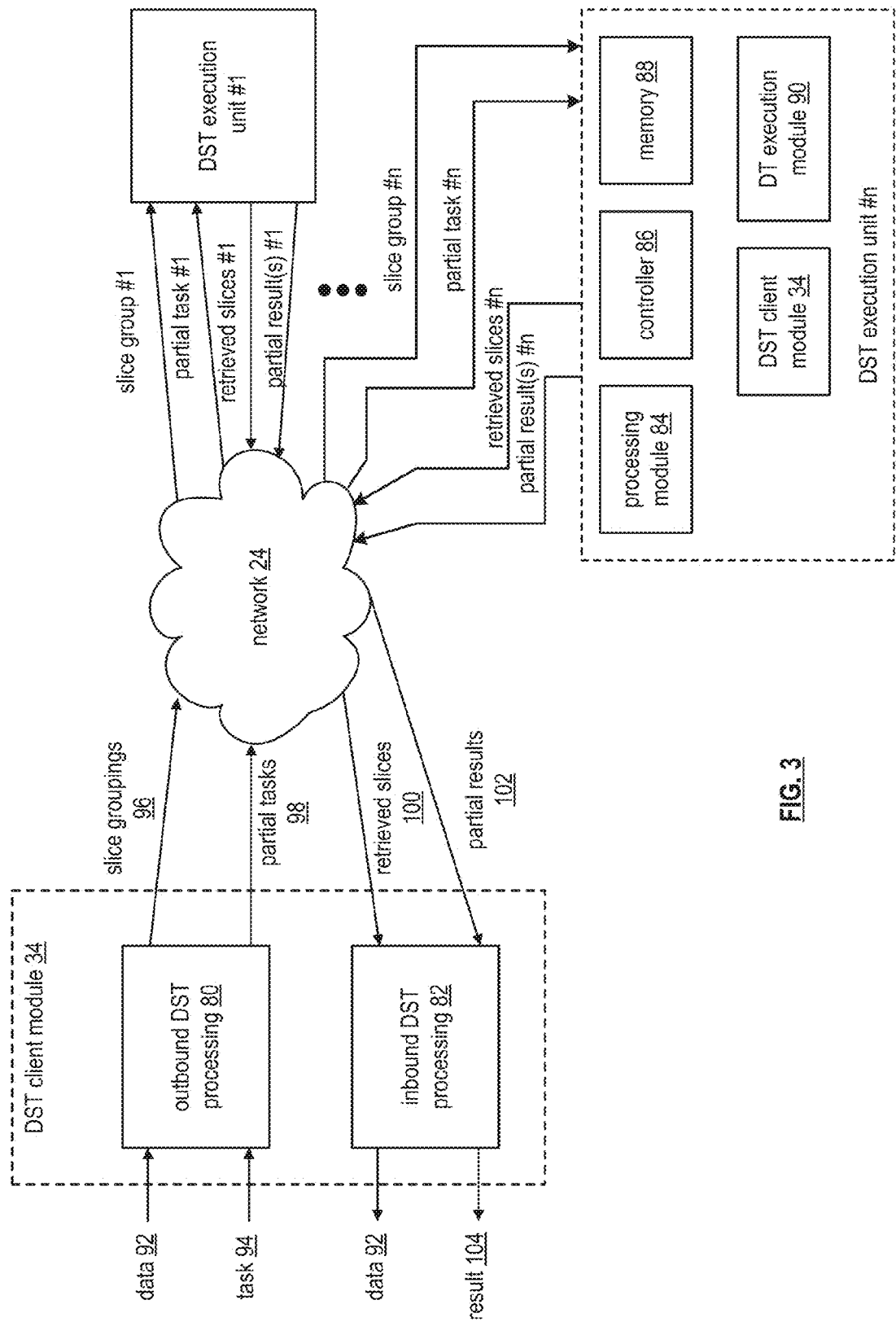
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-*n*.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
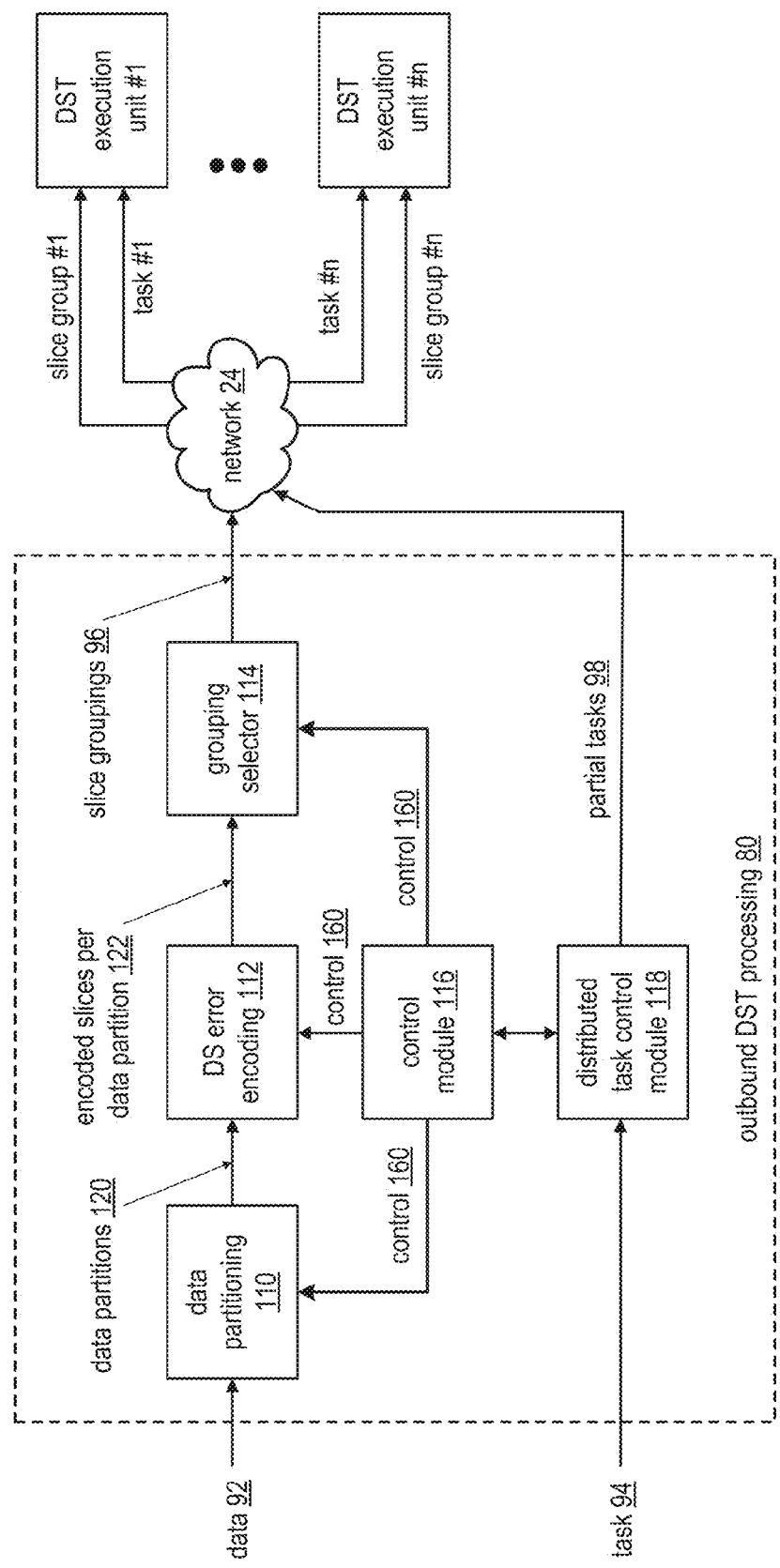
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the group selecting module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
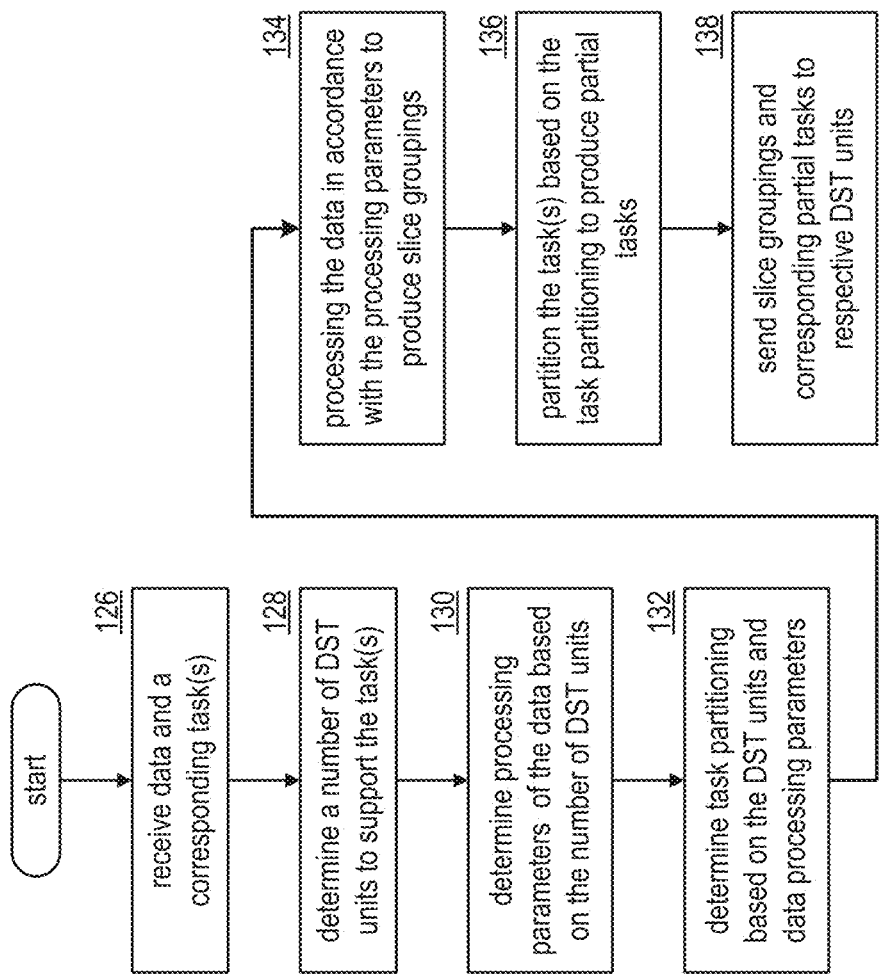
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
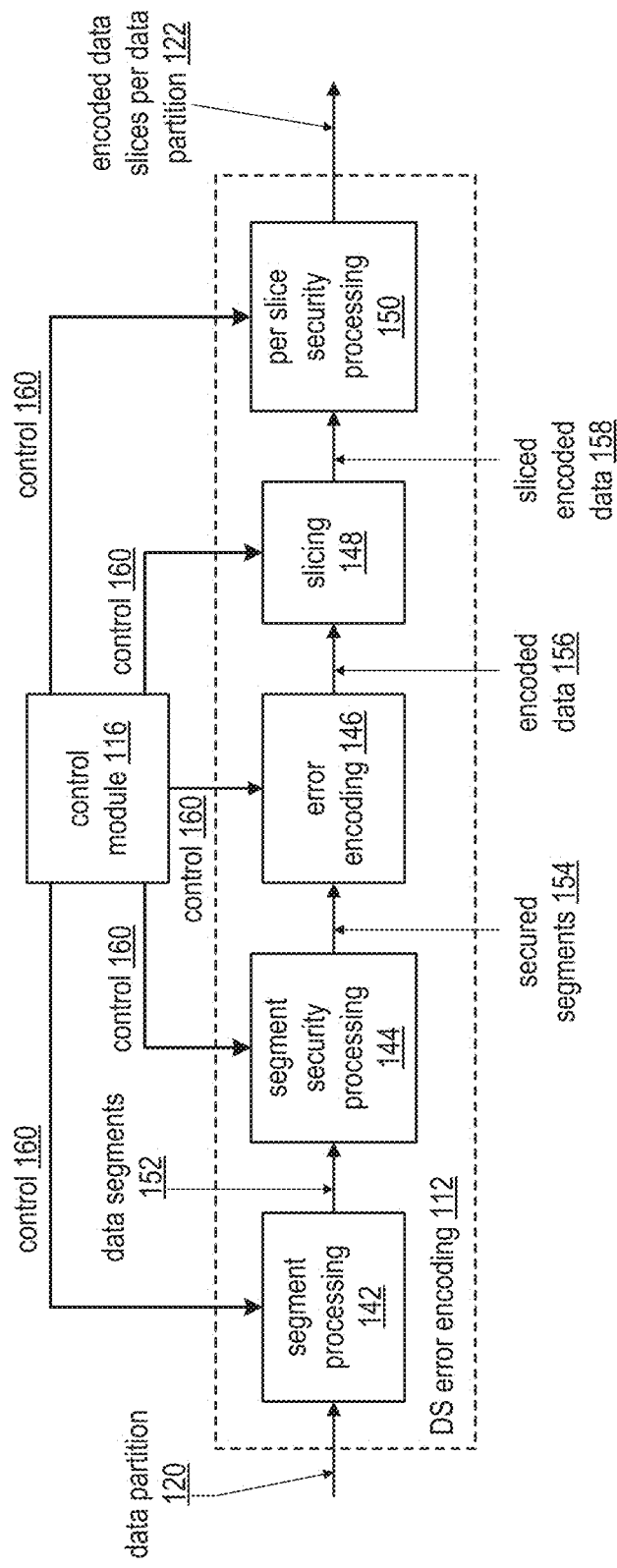
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
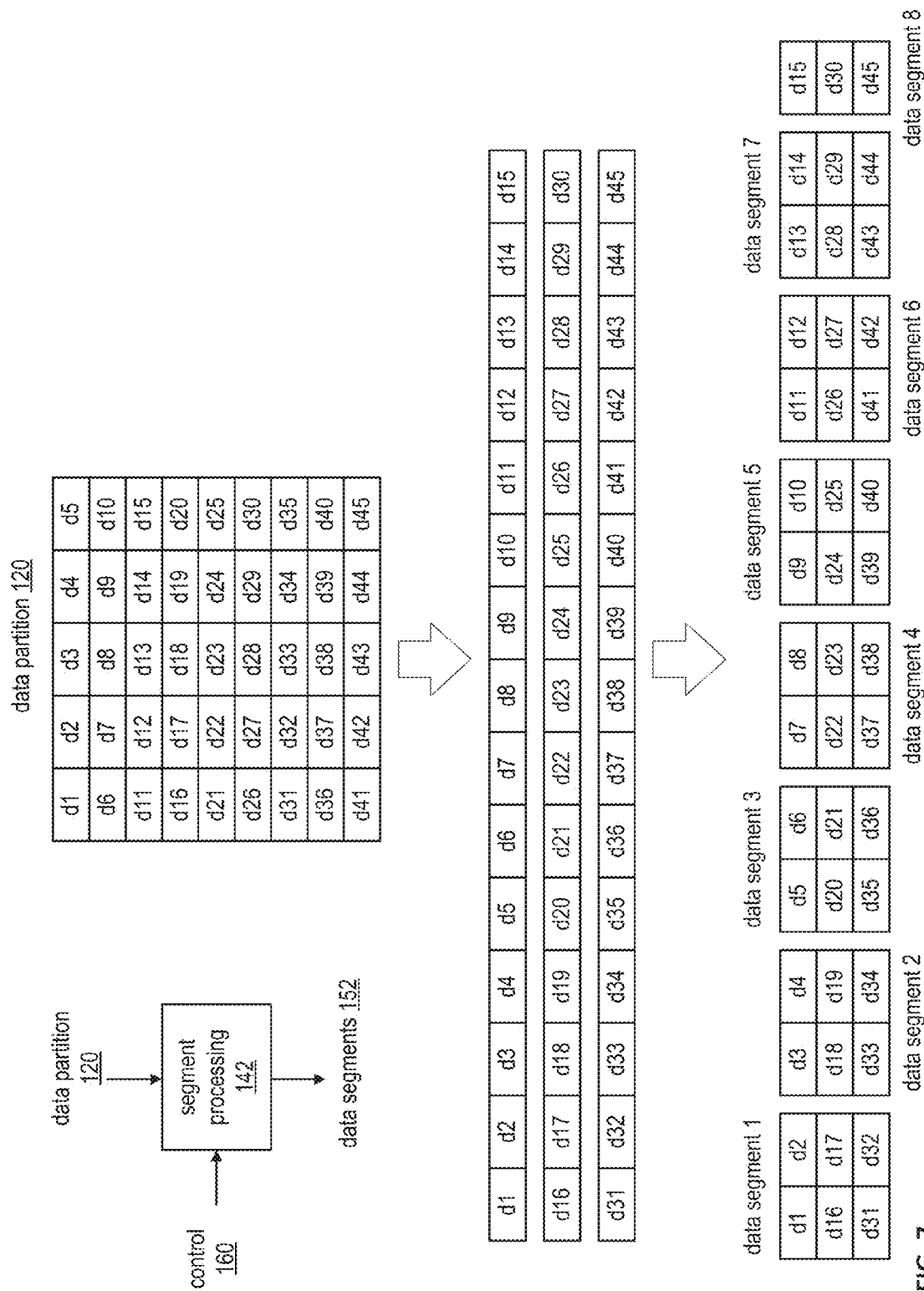
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
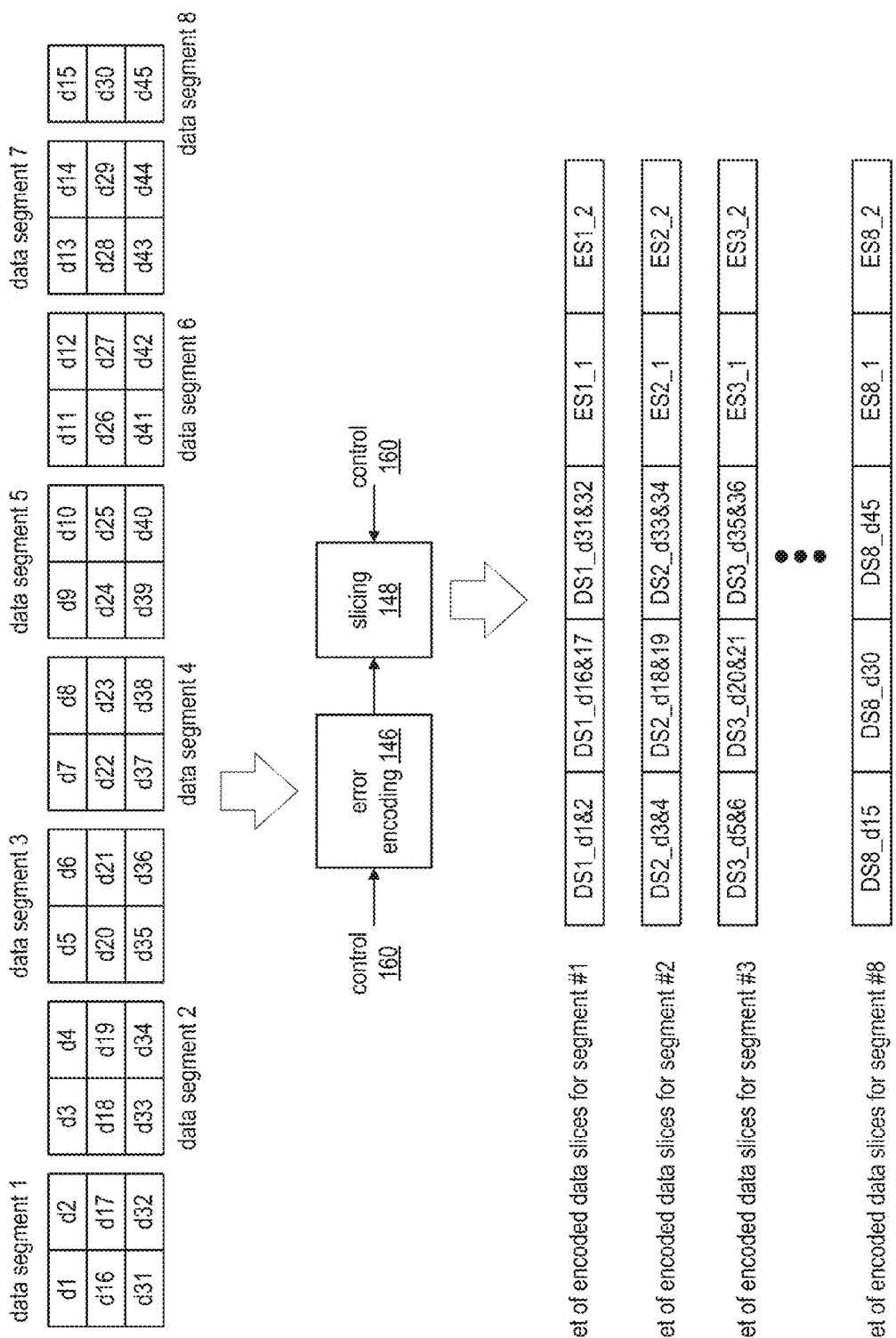
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1 & 2) of the first set of encoded data slices (e.g., corresponding to data segment 1) is substantially similar to content of the first word (e.g., d1 & d2); the content of the second encoded data slice (DS1_d16 & 17) of the first set of encoded data slices is substantially similar to content of the second word (e.g., d16 & d17); and the content of the third encoded data slice (DS1_d31 & 32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3 & 4) of the second set of encoded data slices (e.g., corresponding to data segment 2) is substantially similar to content of the first word (e.g., d3 & d4); the content of the second encoded data slice (DS2_d18 & 19) of the second set of encoded data slices is substantially similar to content of the second word (e.g., d18 & d19); and the content of the third encoded data slice (DS2_d33 & 34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
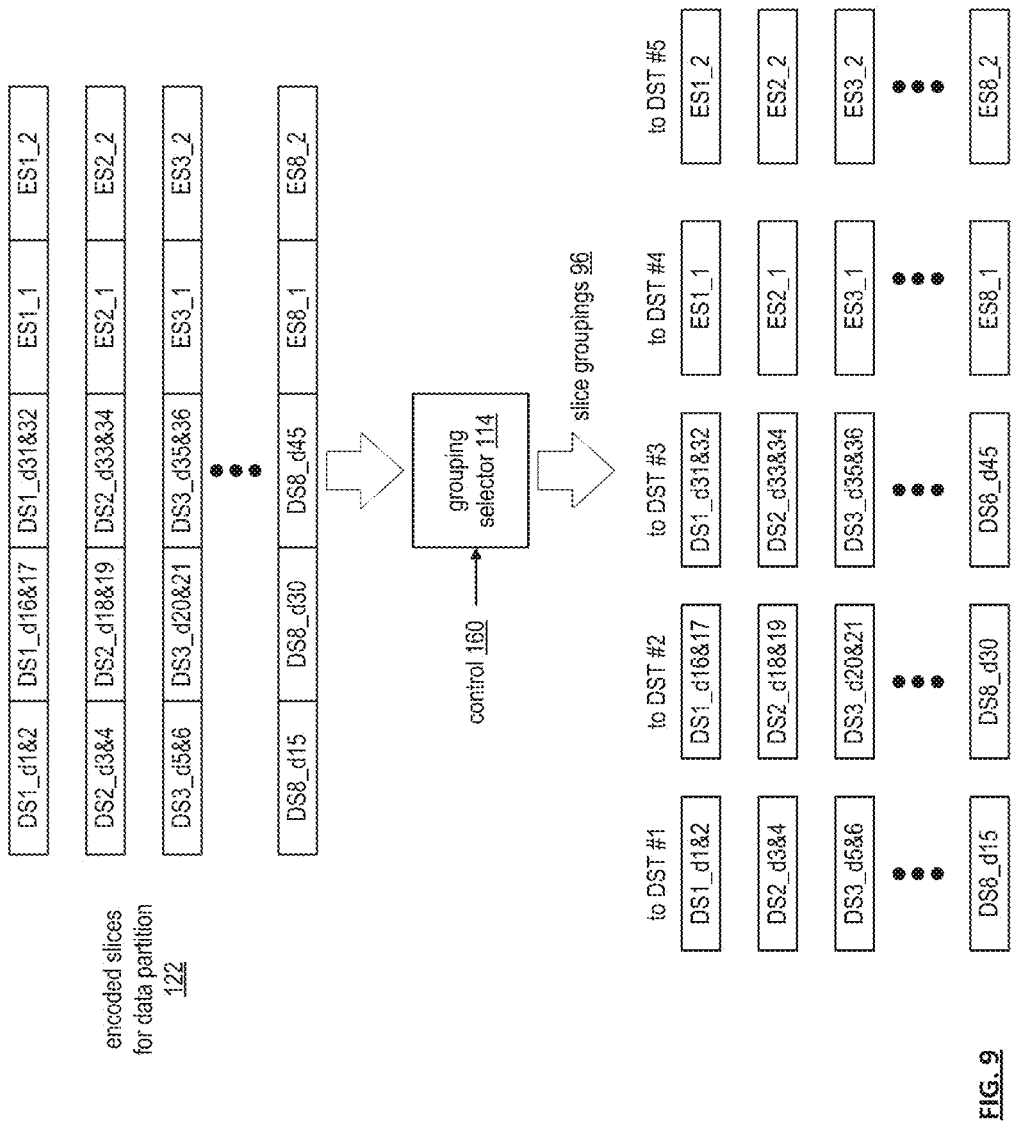
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
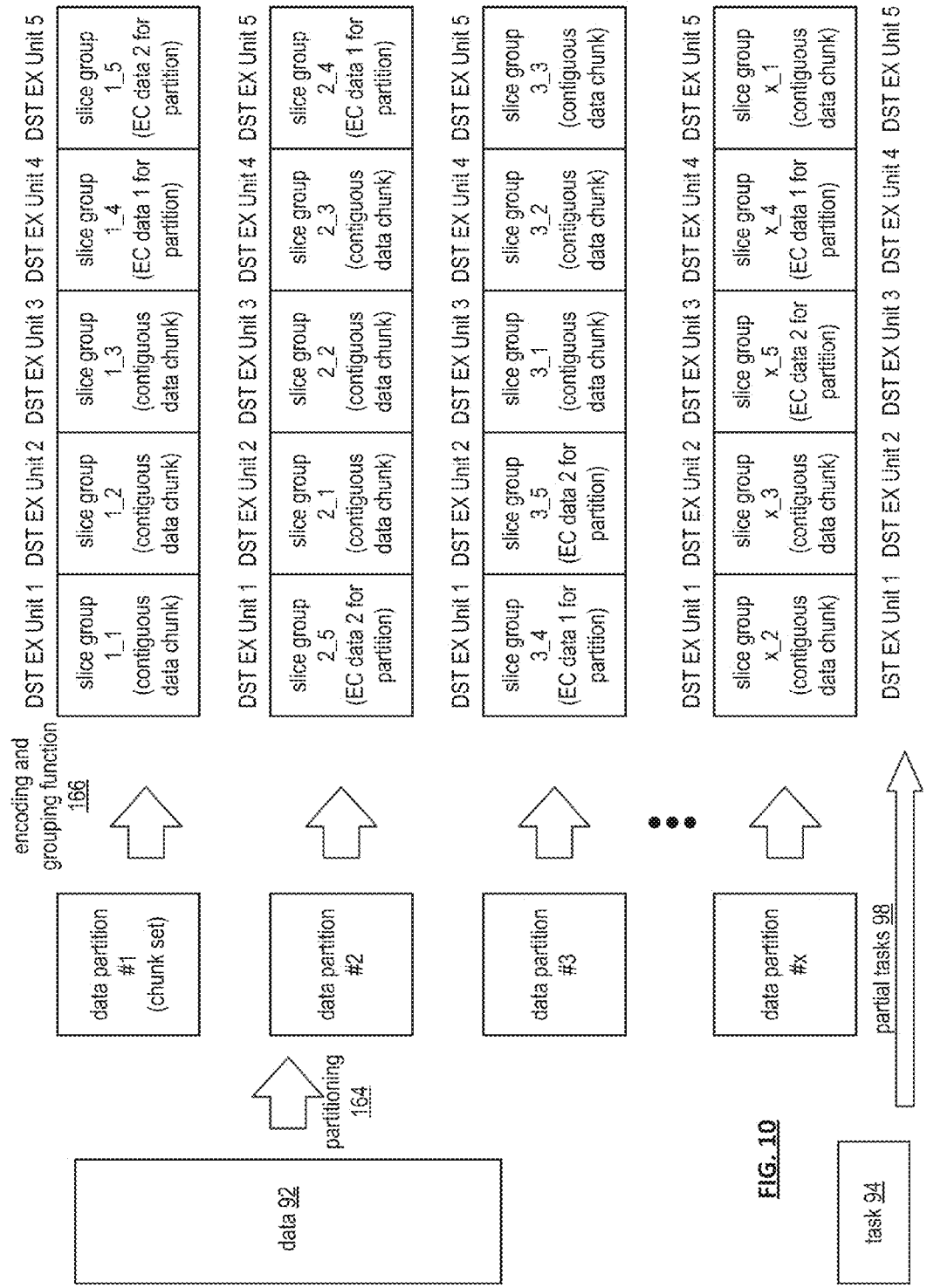
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-*x*, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
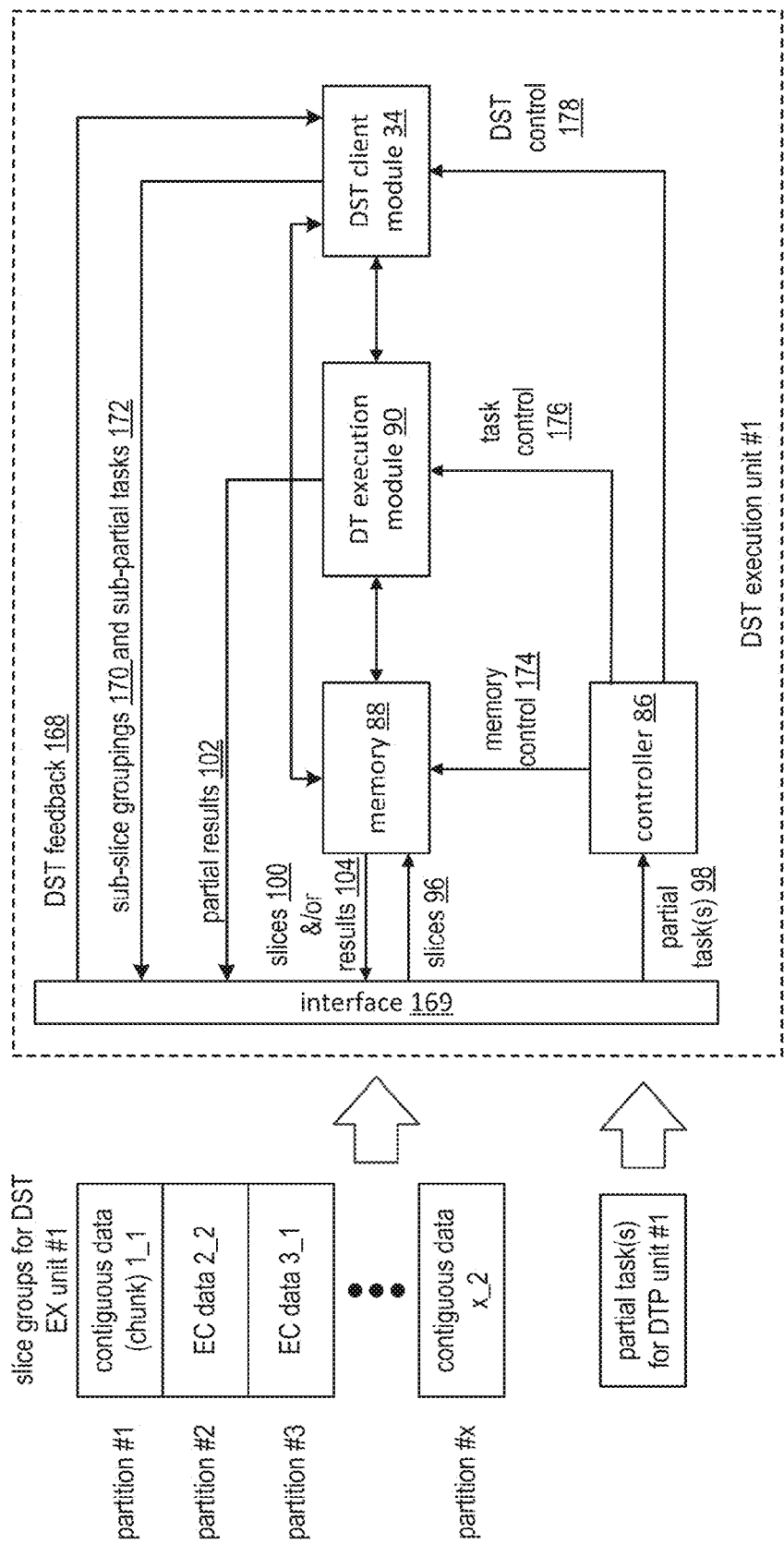
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
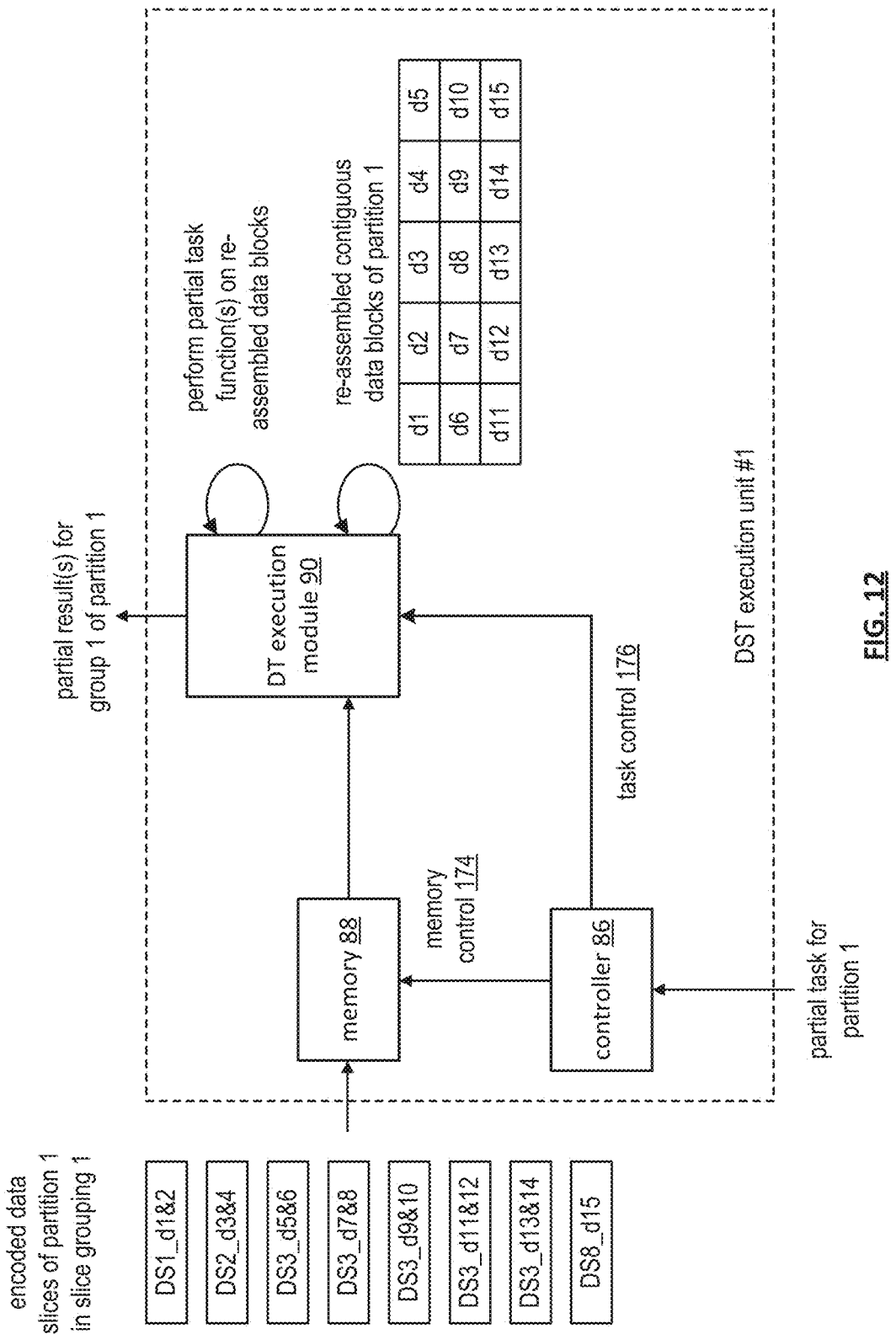
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
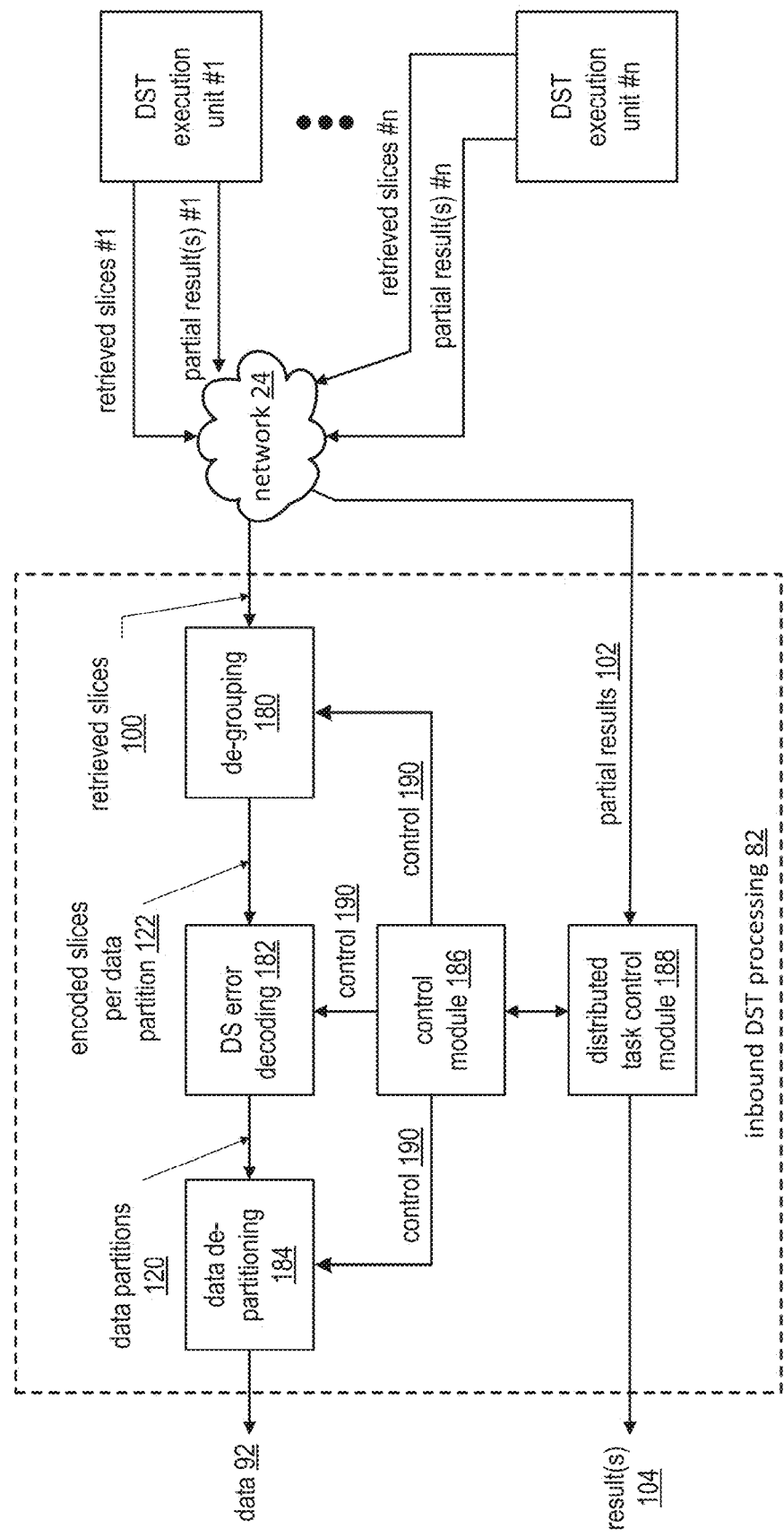
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
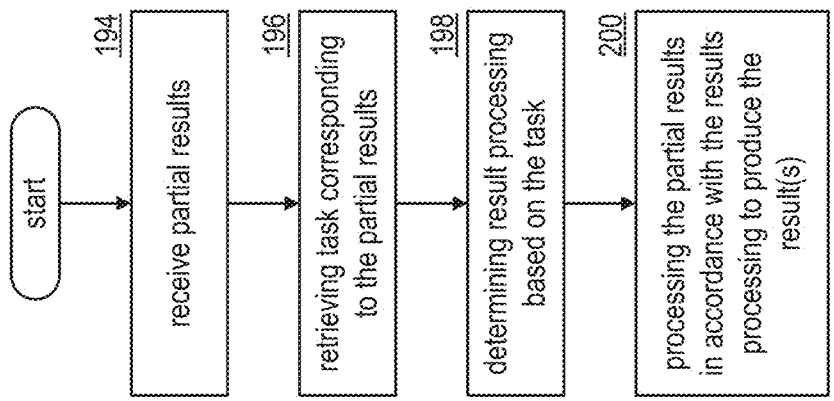
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
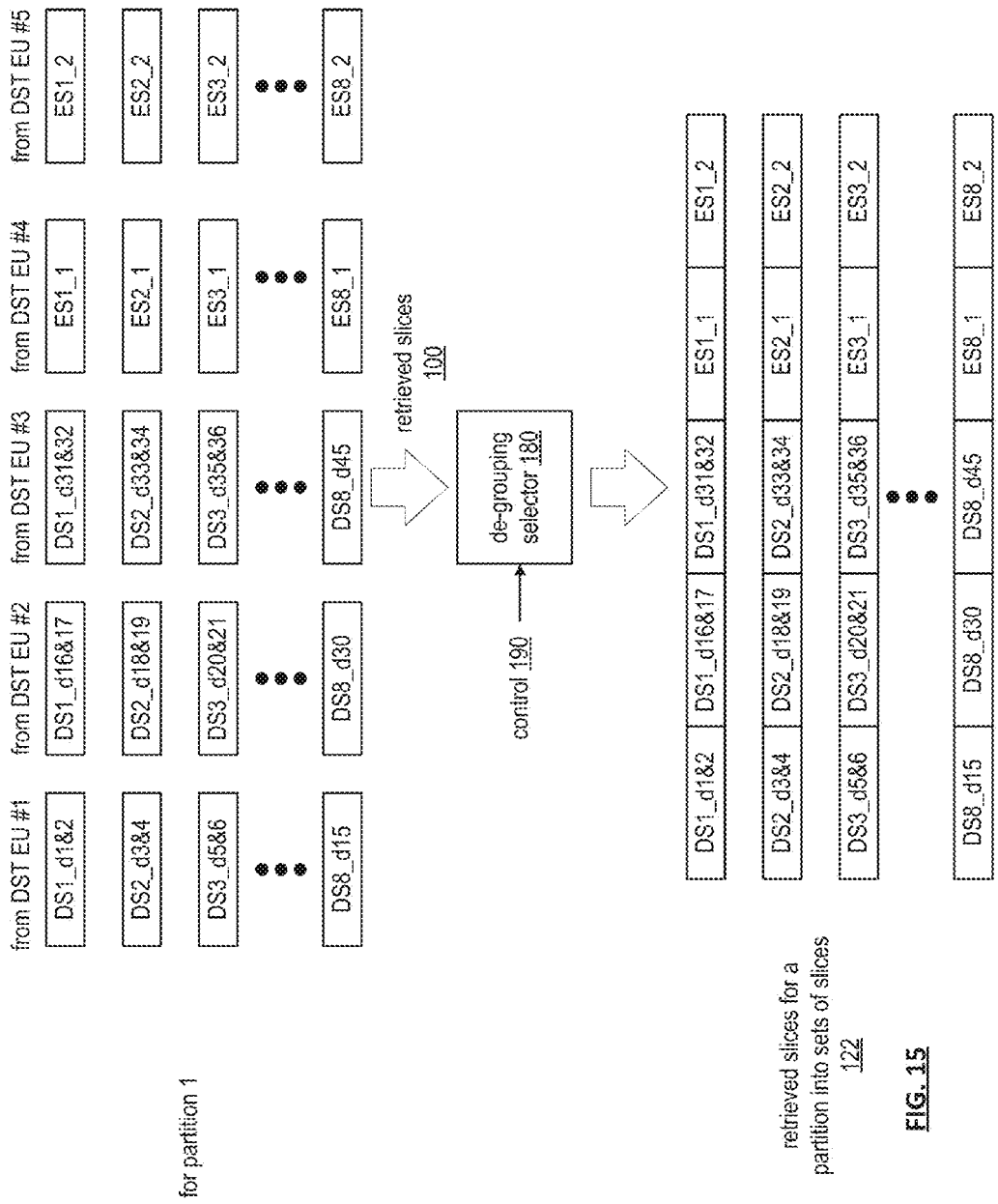
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
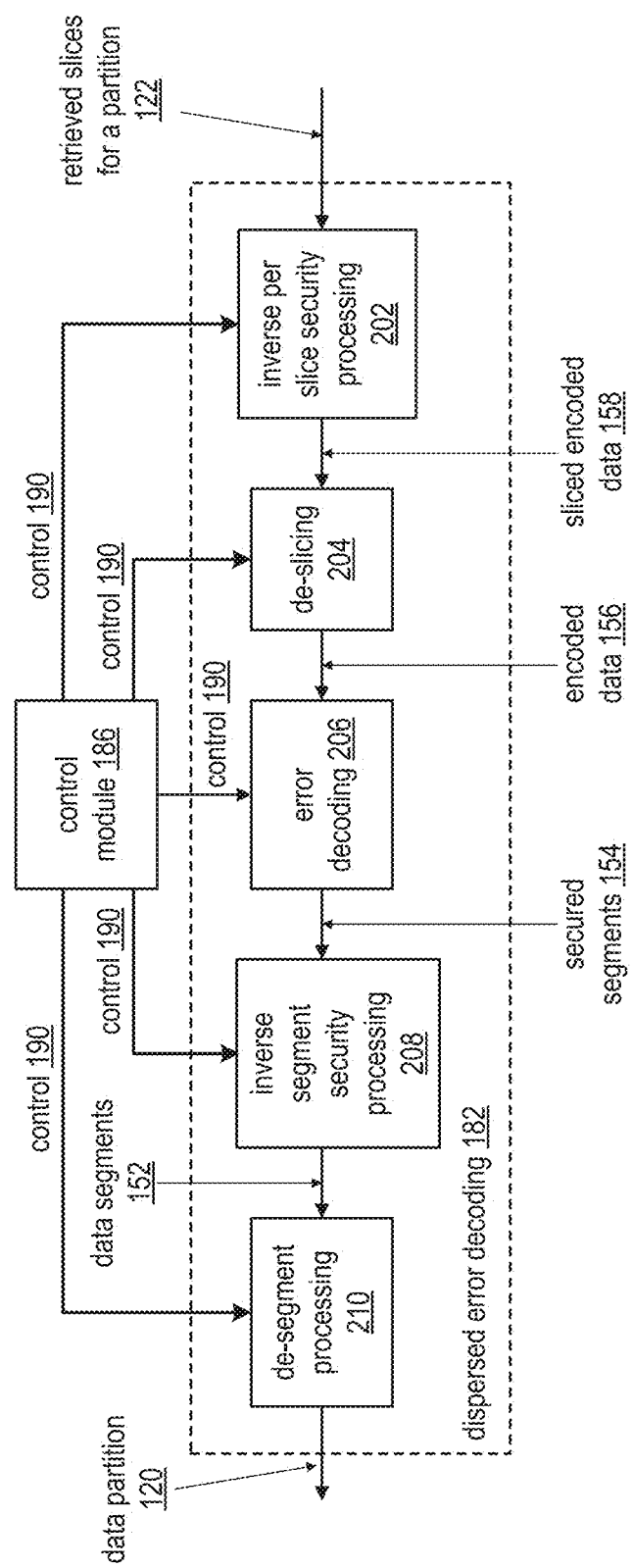
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
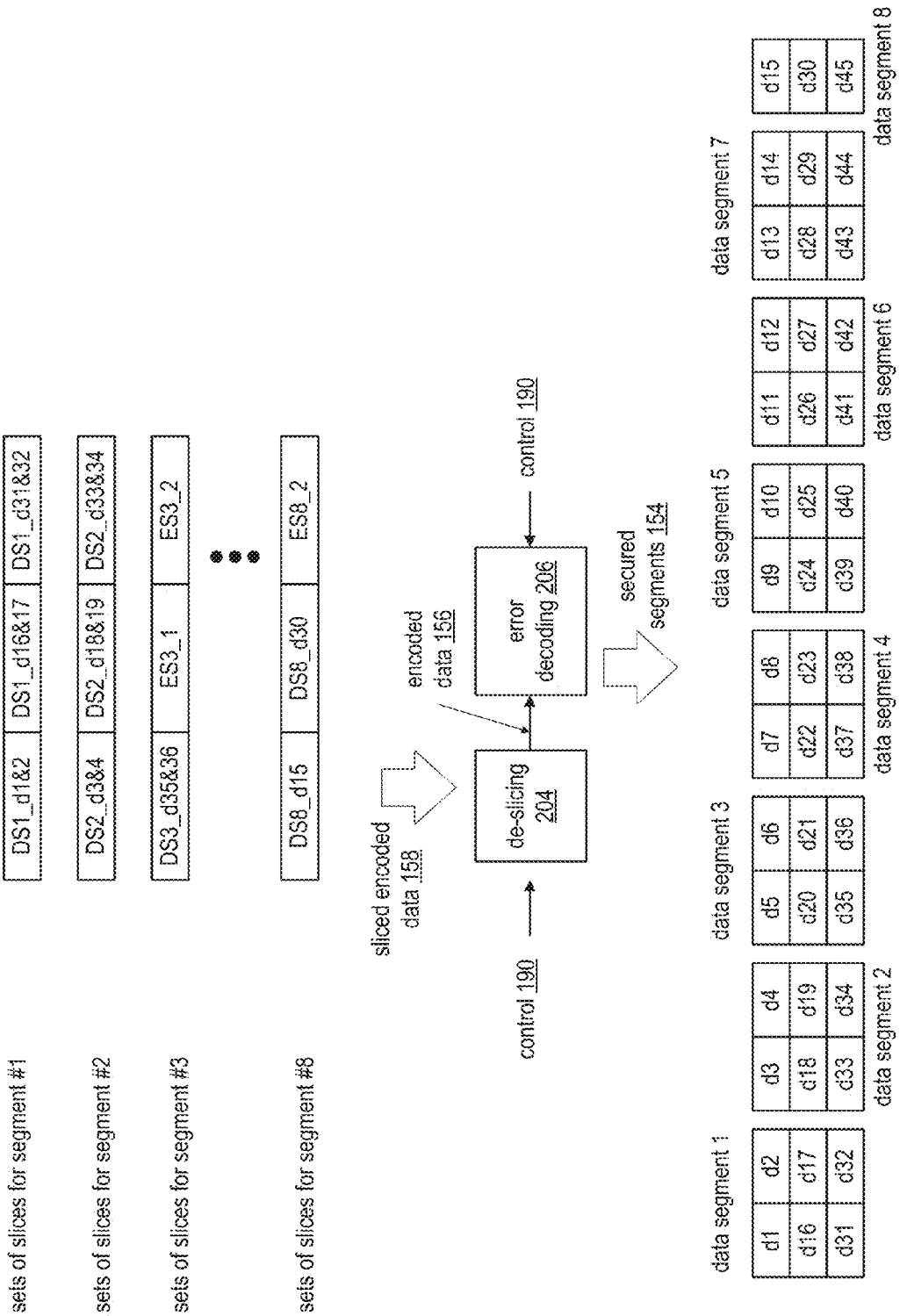
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1 & d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
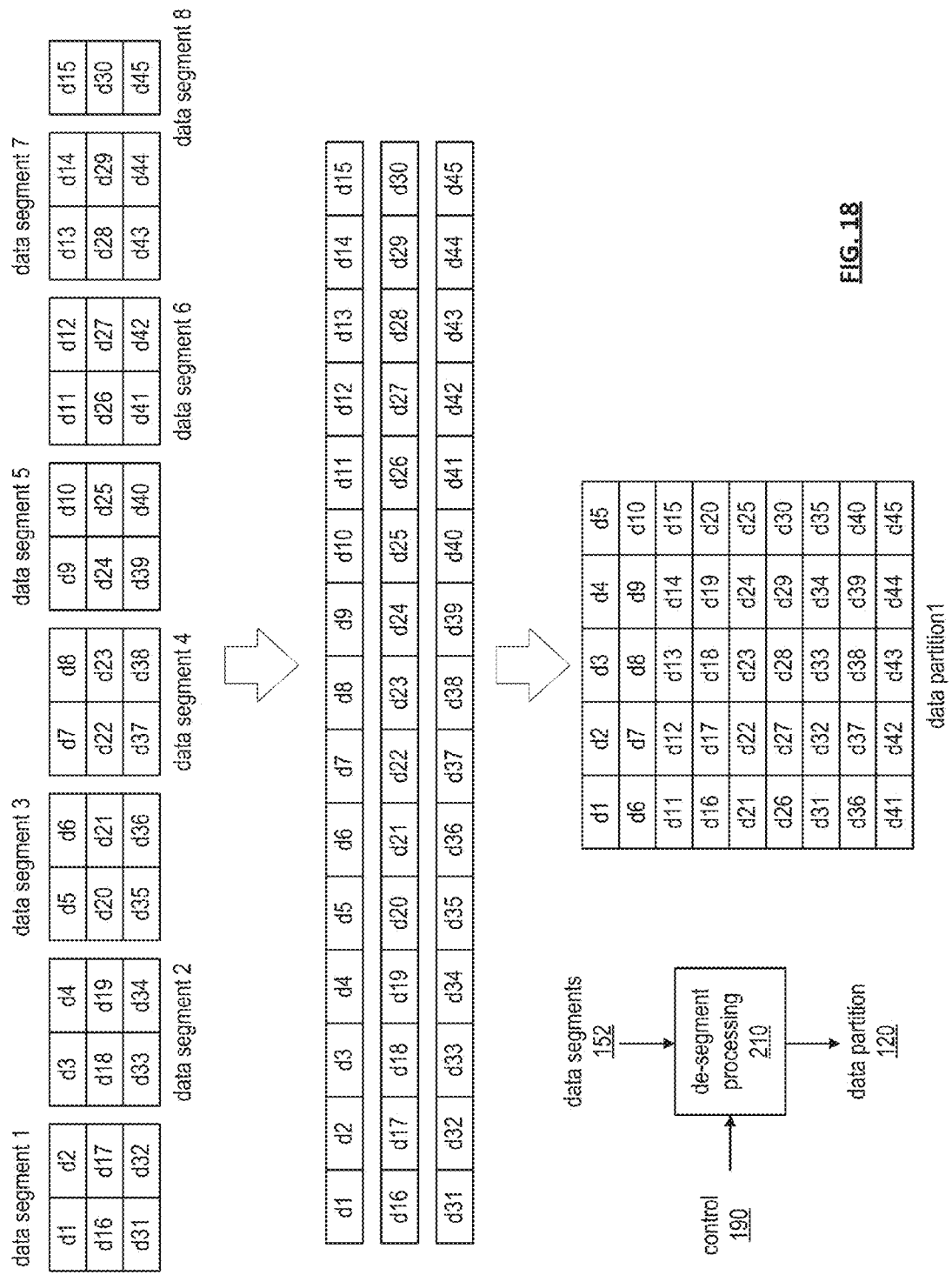
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
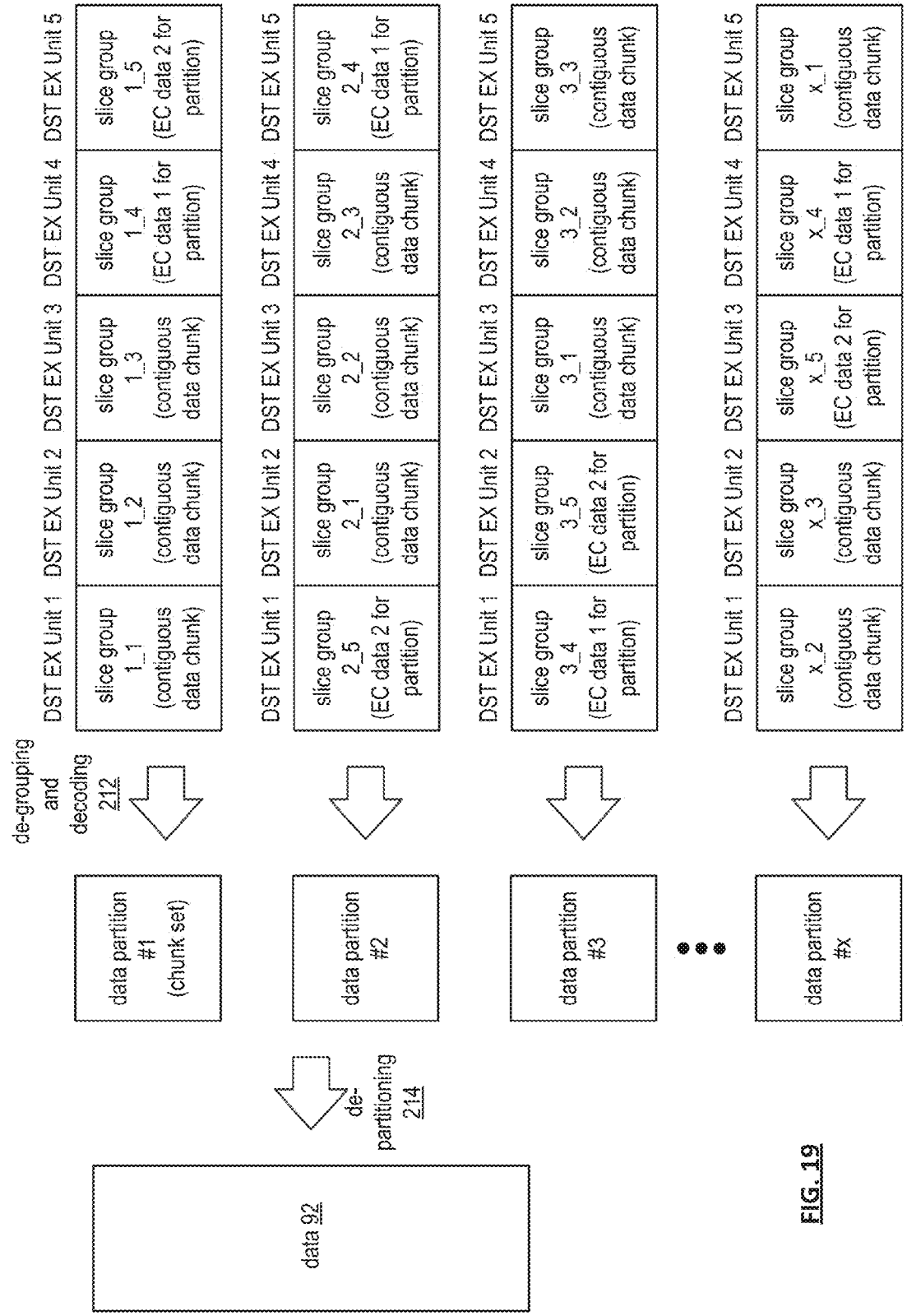
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-*x*, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
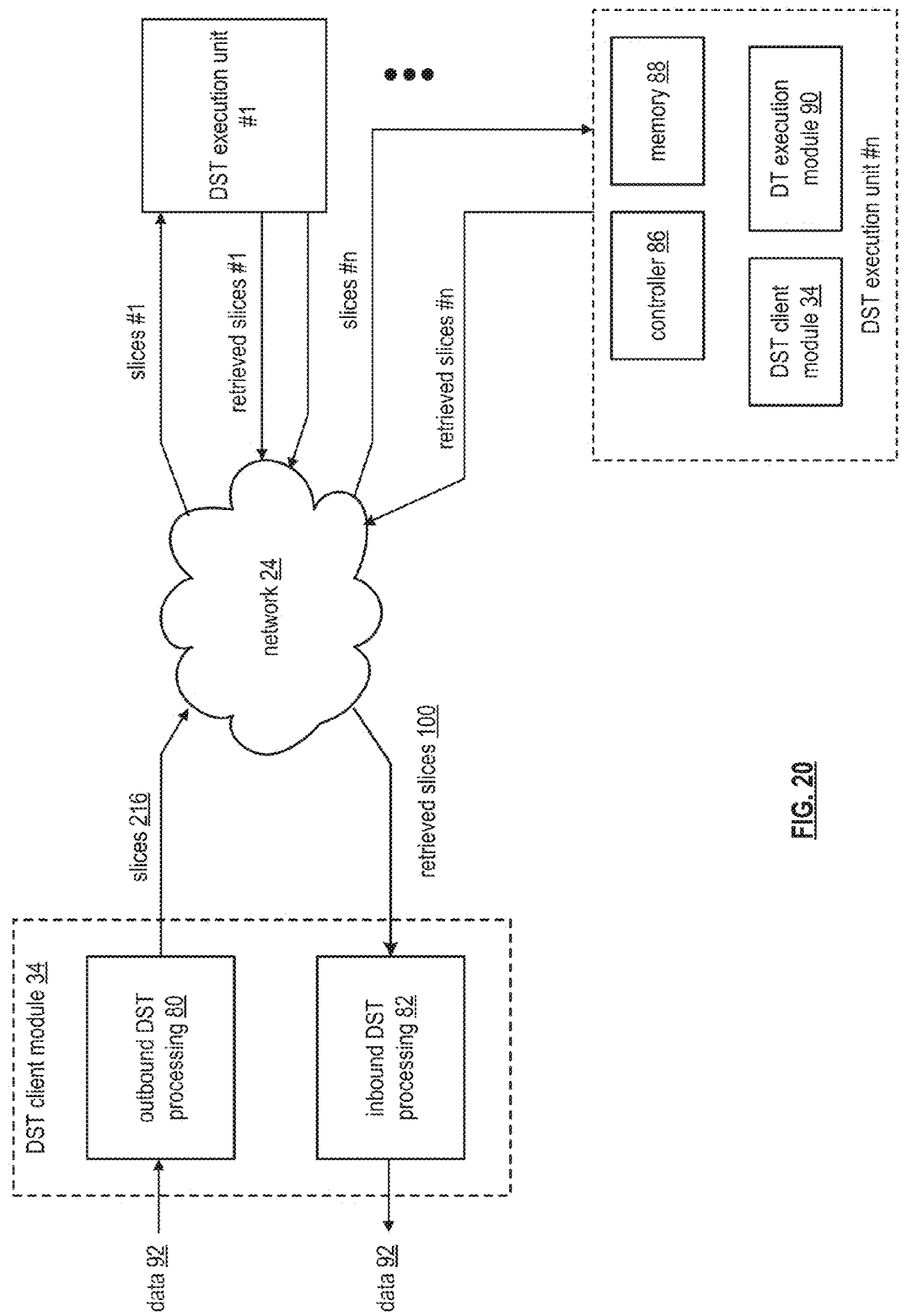
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
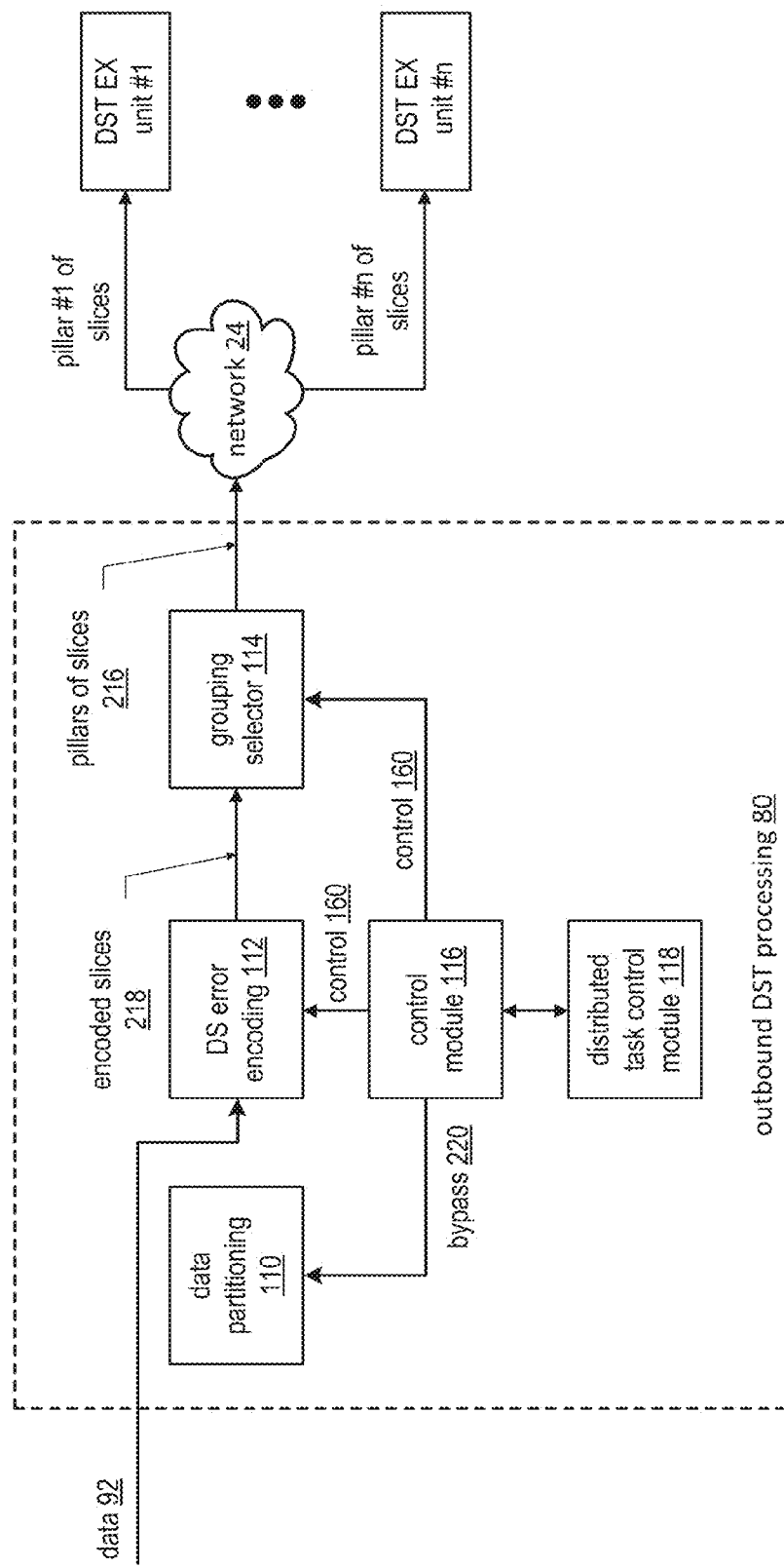
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
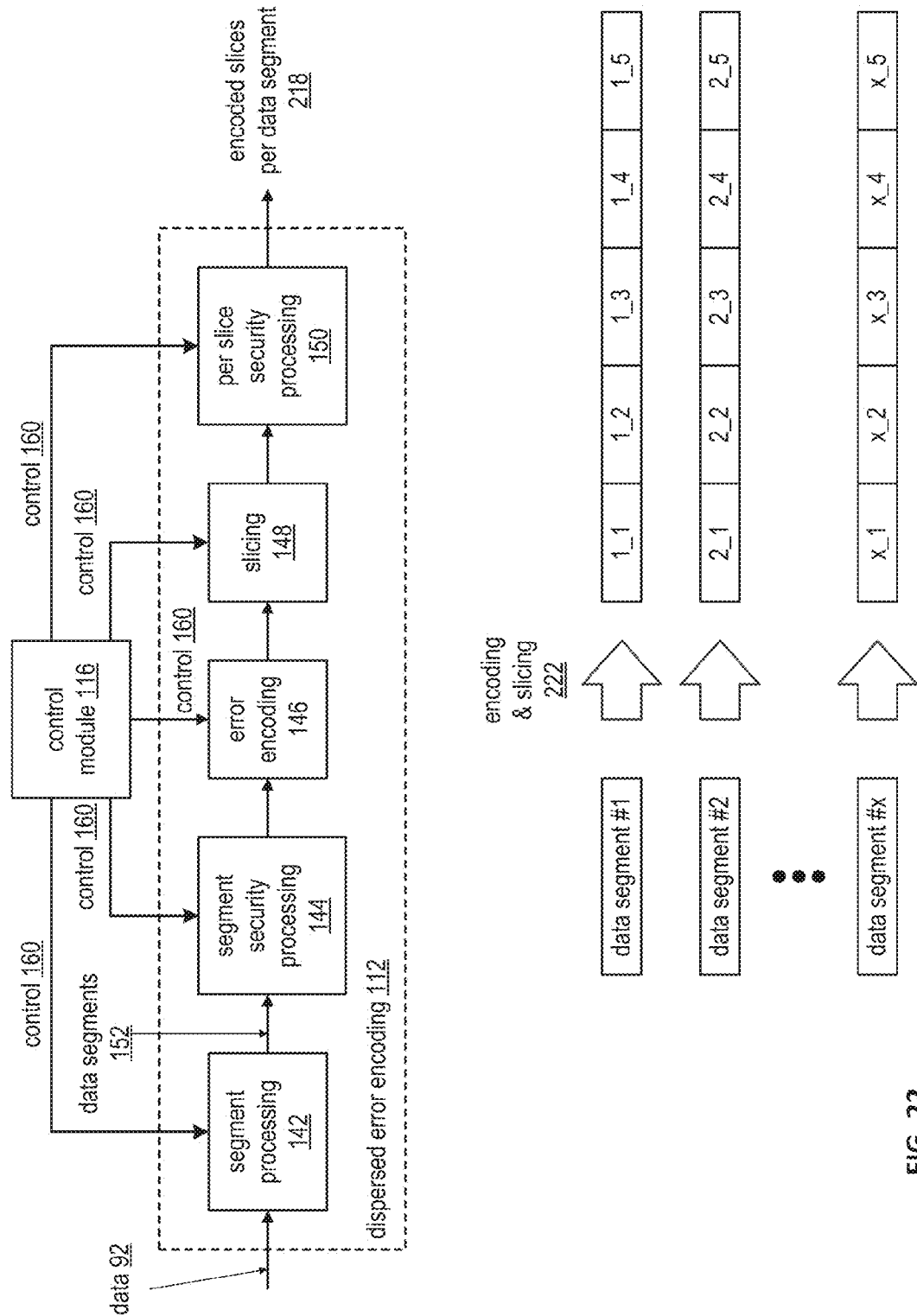
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
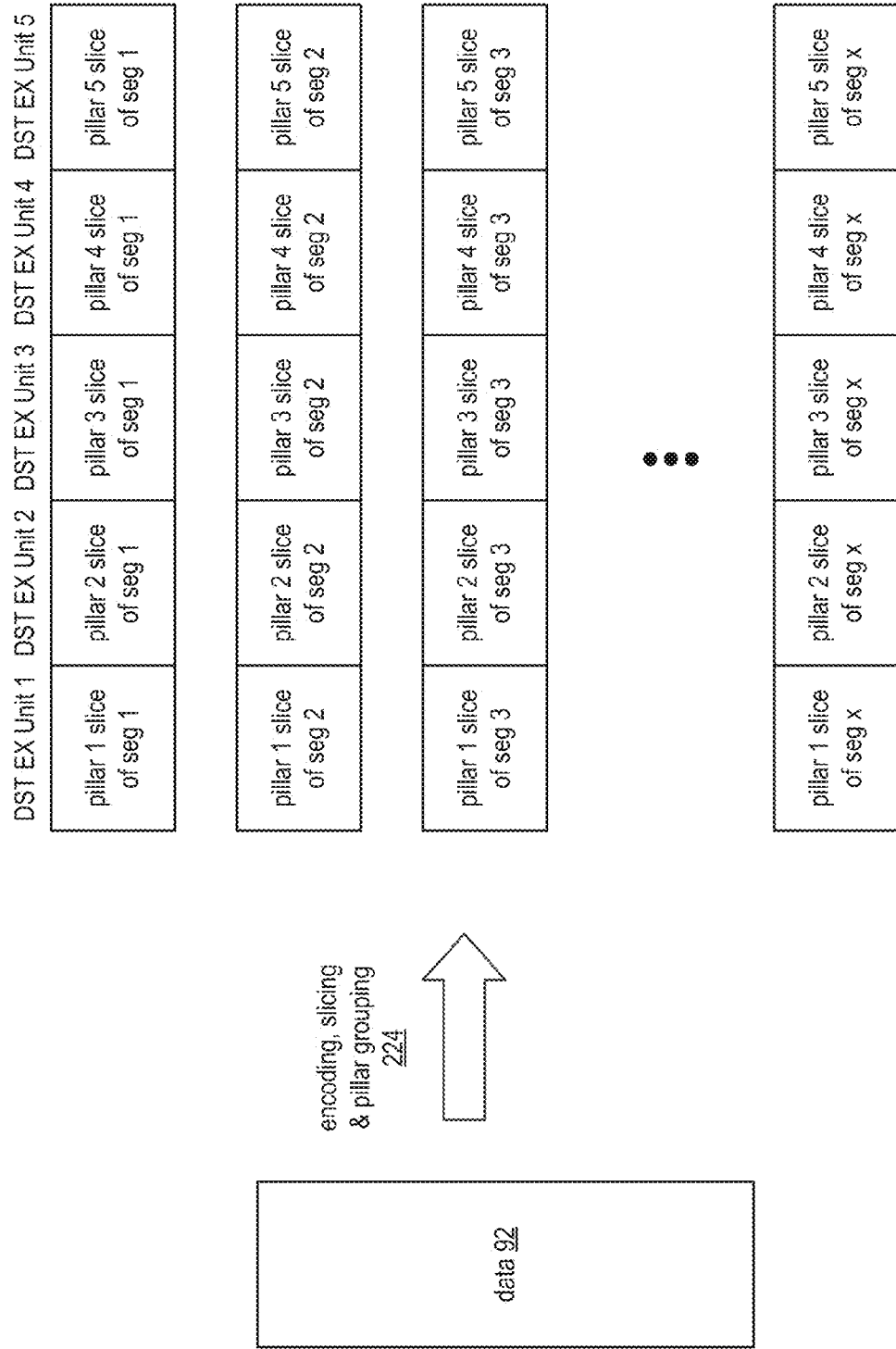
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selection module organizes the sets of encoded data slices into pillars of data slices. In this example, the DS error encoding parameters include a pillar width of 5 and a decode threshold of 3. As such, for each data segment, 5 encoded data slices are created.

The grouping selection module takes the first encoded data slice of each of the sets and forms a first pillar, which may be sent to the first DST execution unit. Similarly, the grouping selection module creates the second pillar from the second slices of the sets; the third pillar from the third slices of the sets; the fourth pillar from the fourth slices of the sets; and the fifth pillar from the fifth slices of the set.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
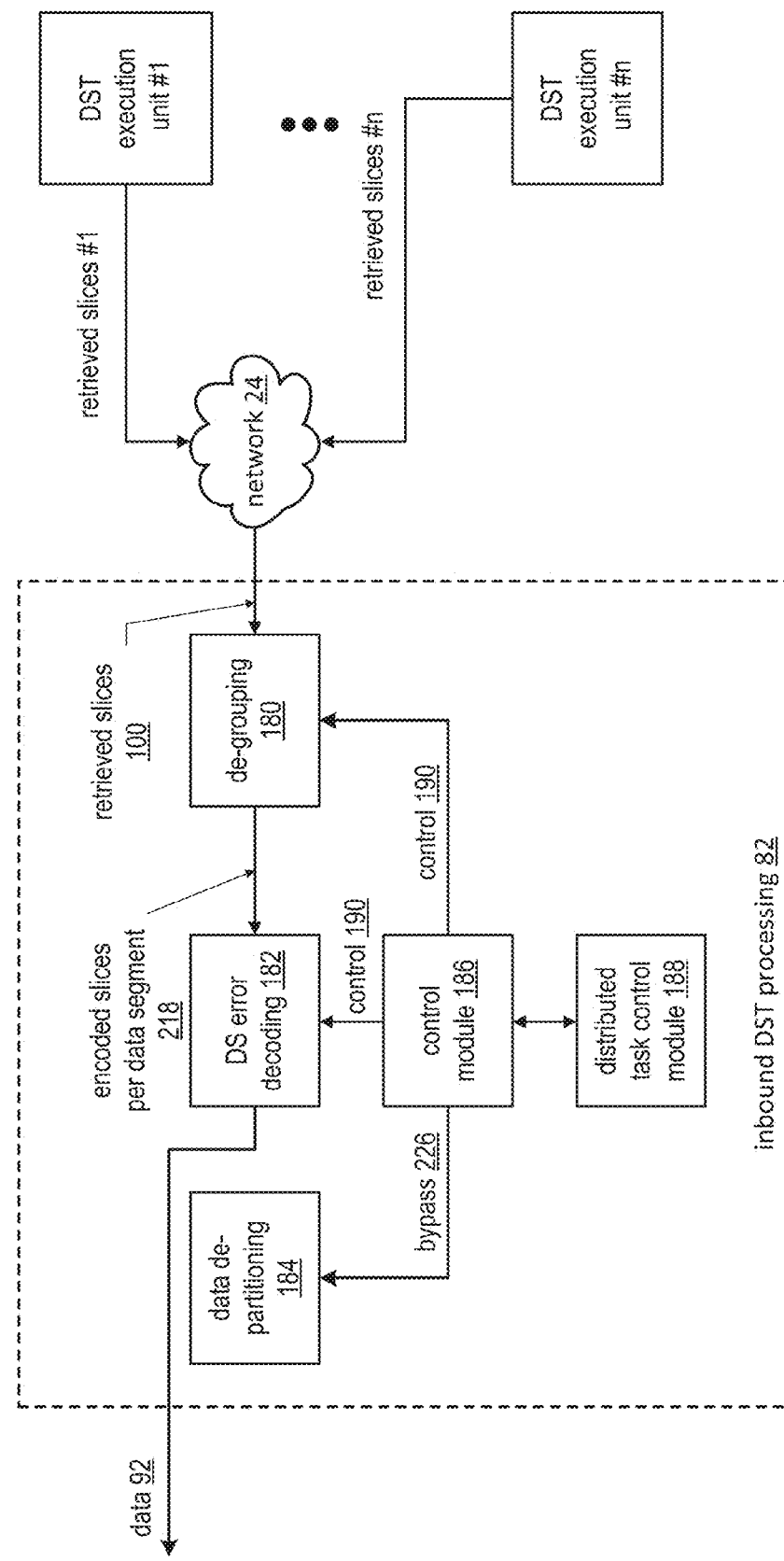
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
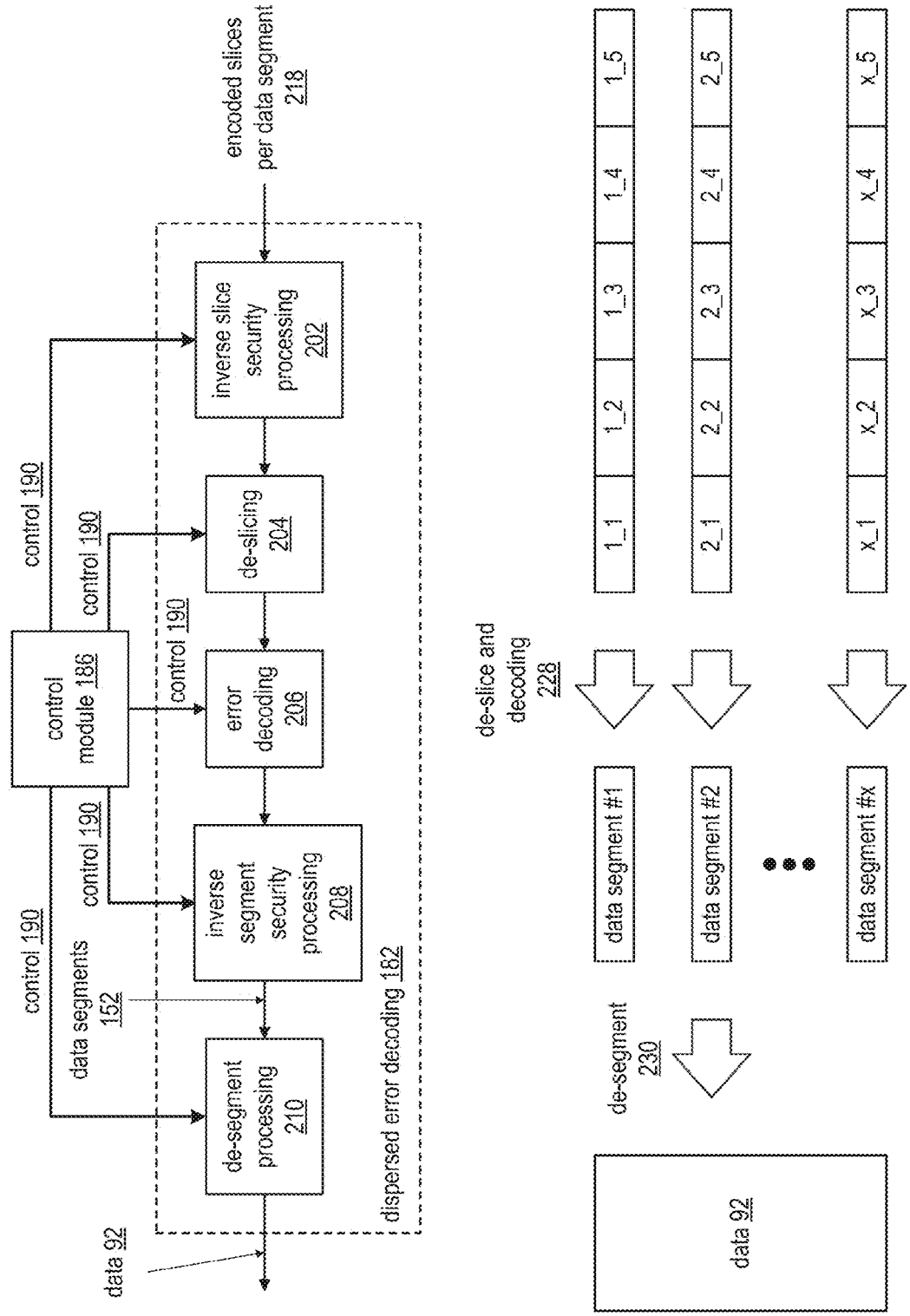
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
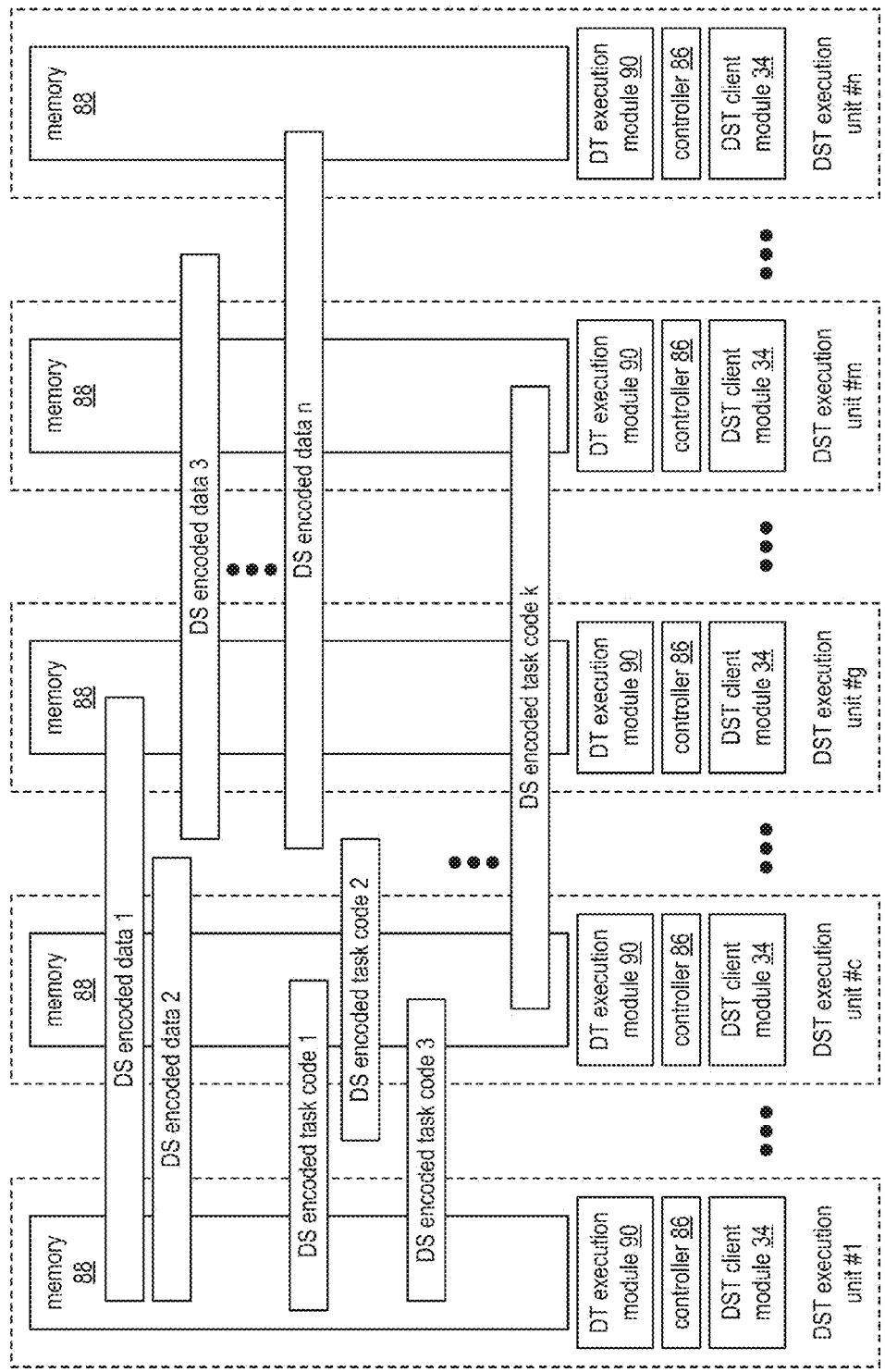
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content.

For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
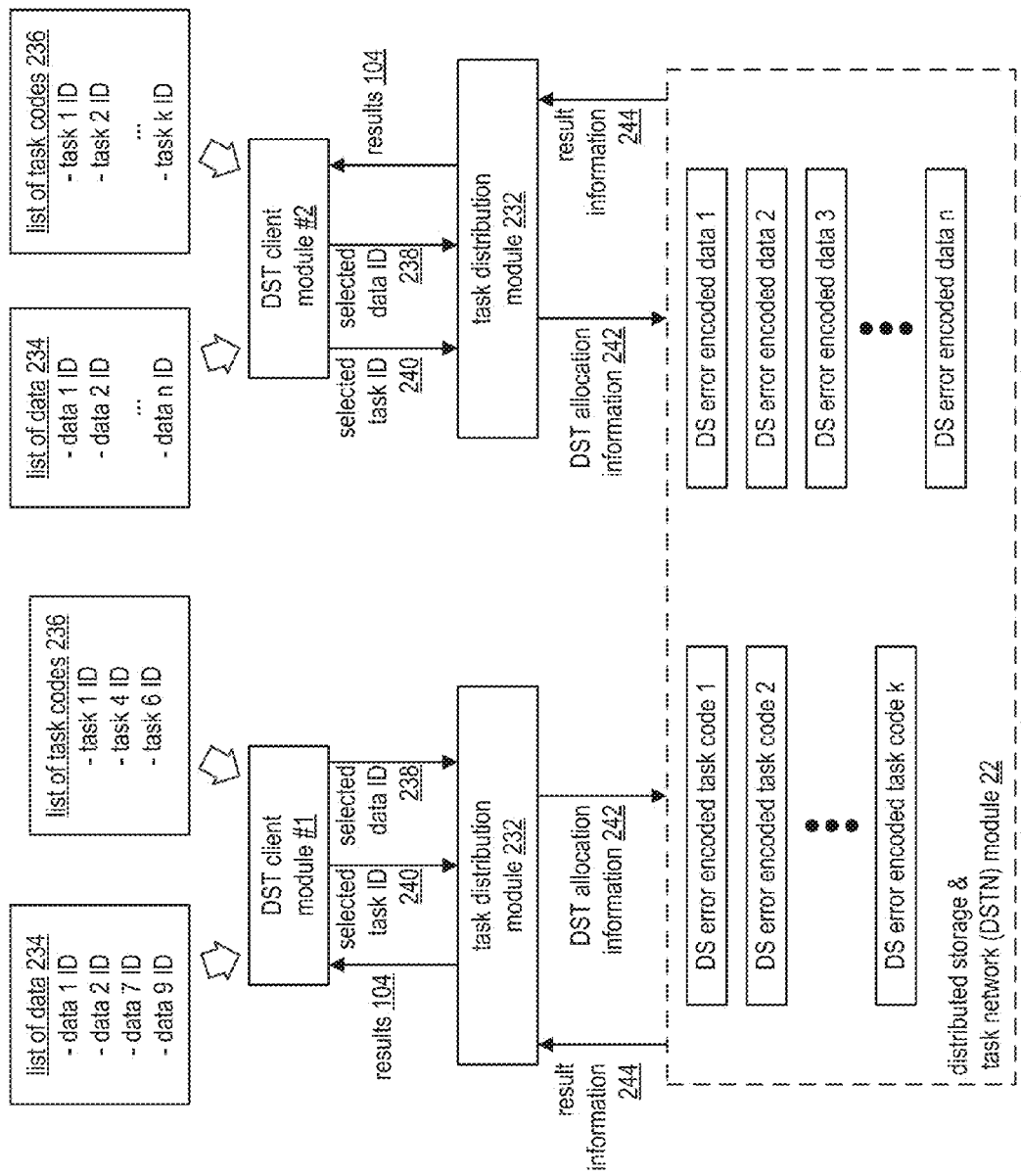
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
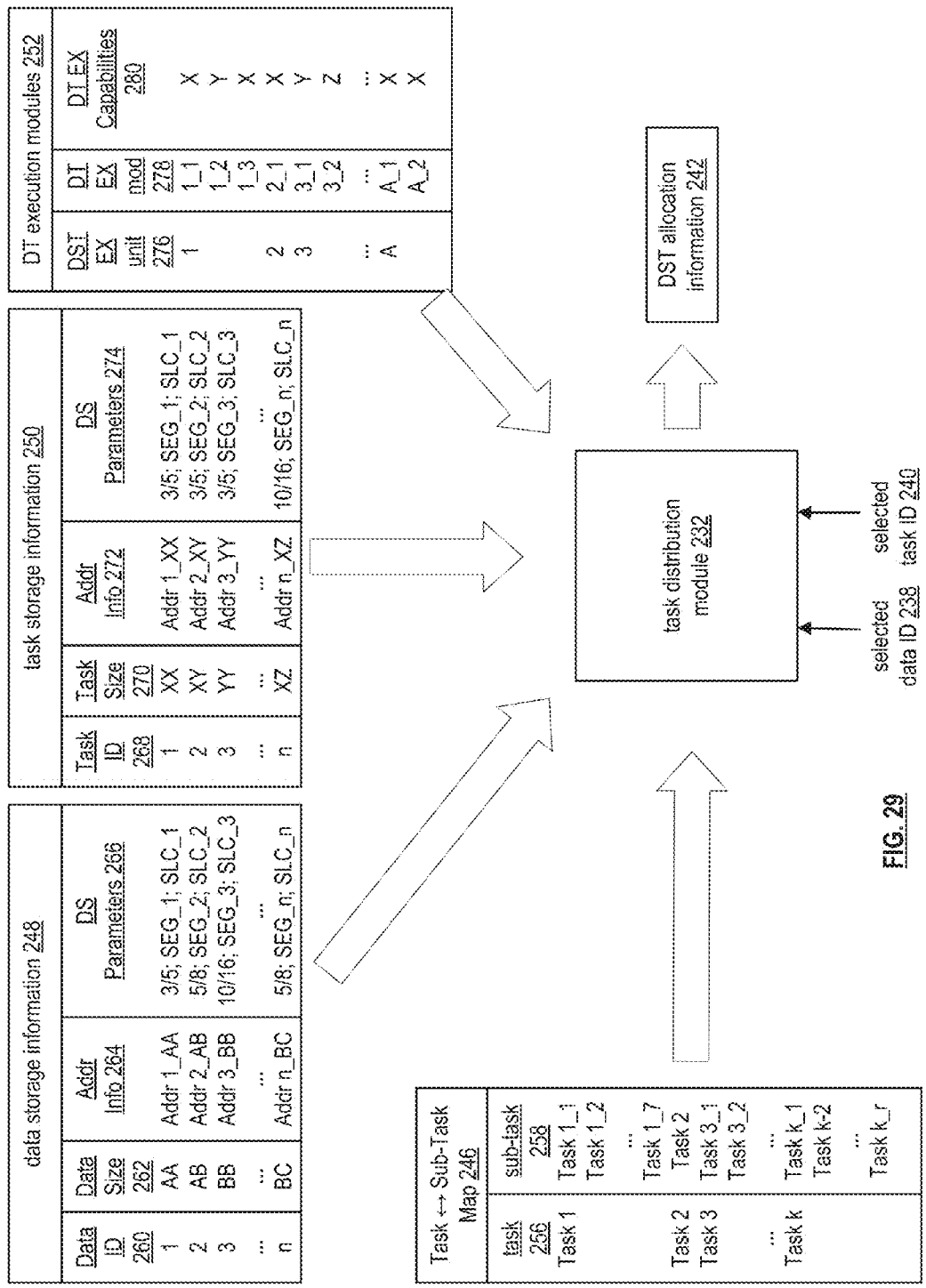
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
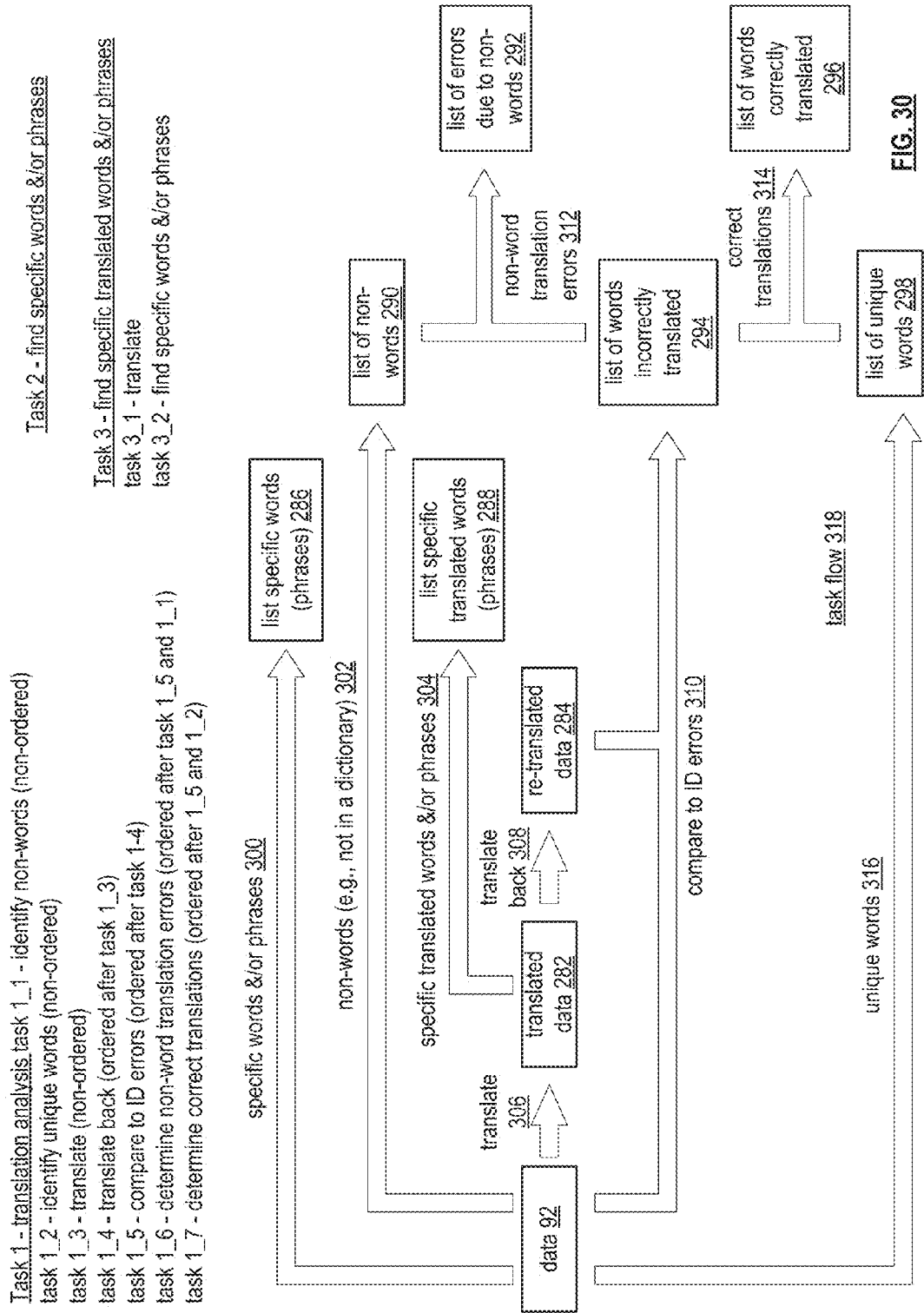
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
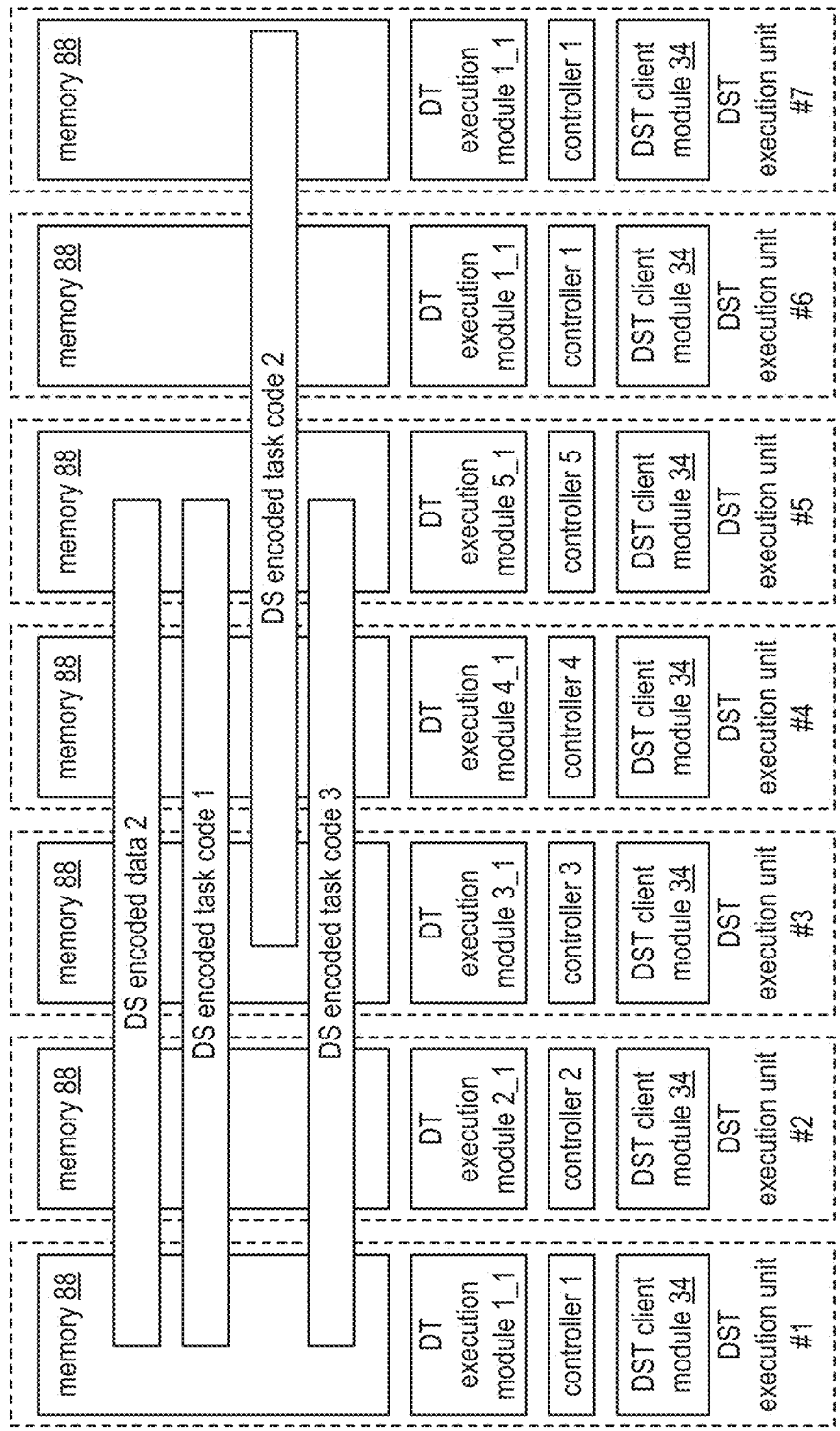
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1_4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., 1$^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
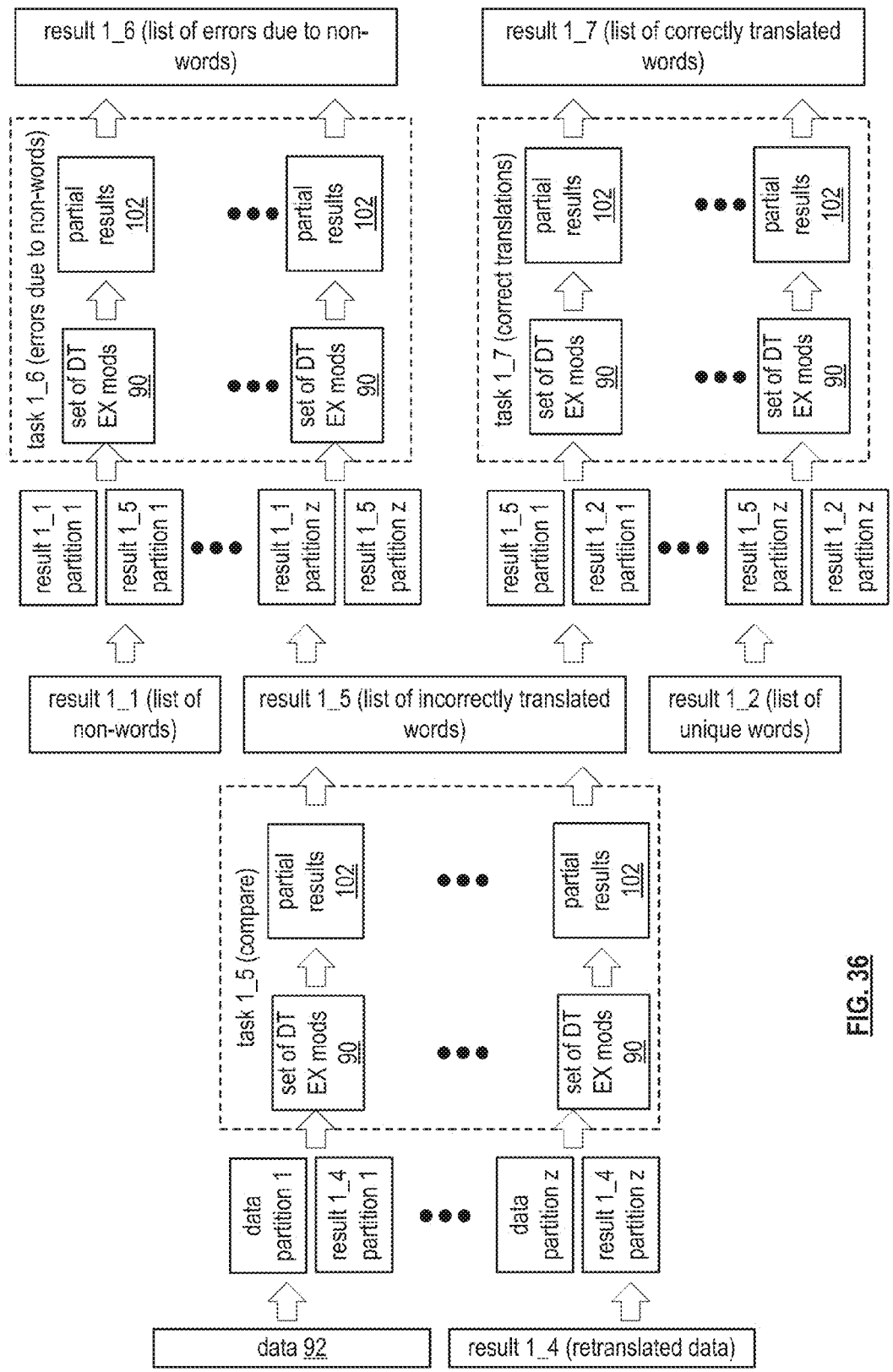

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., 1$^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., 1$^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2).

To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
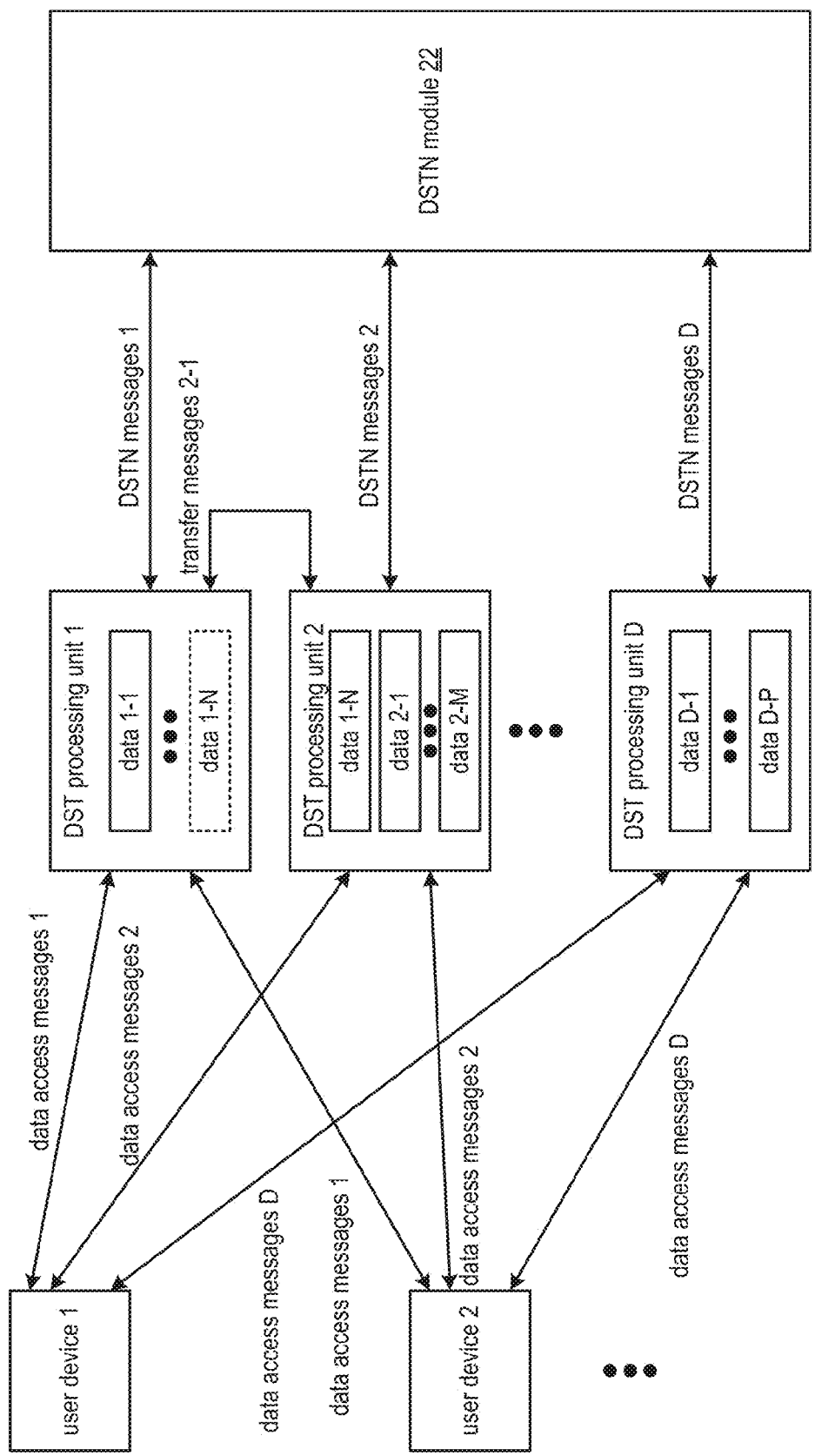
FIG. 40A is a schematic block diagram of an embodiment of a dispersed storage network (DSN) in accordance with the present invention.

FIG. 40A is a schematic block diagram of an embodiment of a dispersed storage network (DSN) that includes at least two user devices 1-2, a plurality of distributed storage and task (DST) processing units 1-D, and the distributed storage and task network (DSTN) module 22 of FIG. 1. The DSN may further include the network 24 of FIG. 1. The user devices 1-2 may be implemented utilizing the user device 12 of FIG. 1. The DST processing units 1-D may be implemented utilizing the DST processing unit 16 of FIG. 1.

The DSN functions to store data as stored data and to retrieve the stored data to reproduce the data. In an example of operation of storing the data, the user device 1 selects a DST processing unit of the DST processing units 1-D based on an identifier of a data object for storage. The selecting may be based on one or more of an address space mapping and performing a deterministic function on the identifier of the data object. For example, the user device 1 selects the DST processing unit 2 when the identifier of the data object indicates data object 2-1 and the address mapping indicates that the data object 2-1 is affiliated with DST processing unit 2. As another example, the user device 1 selects the DST processing unit 2 when a result of applying the deterministic function to an identifier of another data object 1-1 produces an indicator that includes an identifier of the DST processing unit 1.

Having selected the DST processing unit 2, the user device 1 issues a data access message 2 to the DST processing unit 2, where the data access message 2 includes a store data request. The store data request includes the data object 2-1. Having received the data object 2-1, the DST processing unit 2 caches the data object 2-1 in a local memory of the DST processing unit 2 in accordance with the address space mapping and an available capacity level. For example, the DST processing unit 2 caches the data object 2-1 when the available capacity level compares favorably (e.g., greater than) to a minimum available capacity threshold level and the address space mapping indicates that the data object 2-1 is affiliated with the DST processing unit 2.

The DST processing unit 2 dispersed storage error encodes the data object 2-1 to produce a plurality of sets of encoded data slices. Having produced the plurality of sets of encoded data slices, the DST processing unit 2 issues a DSTN message to the DSTN module 22 to facilitate storage of the plurality of sets of encoded data slices in the DSTN module 22. For example, the DST processing unit 2 generates a set of write slice requests that includes the plurality of sets of encoded data slices and sends the set of write slice requests to the DSTN module 22 as the DSTN message 2.

When the available capacity level of the DST processing unit 2 does not compare favorably to the minimum available capacity threshold level, the DST processing unit 2 selects at least one locally stored data object for transfer. For example, the DST processing unit 2 selects a data object 1-N associated with an address at an end of an address range associated with the DST processing unit 2. Having selected the store data object for transfer, the DST processing unit 2 issues a transfer message 2-1 to the DST processing unit 1 that includes the data object 1-N. One or more of the DST processing unit 1 and DST processing unit 2 facilitates updating of the address space mapping to indicate that the data object 1-N is affiliated with DST processing unit 1 and is no longer affiliated with DST processing unit 2. Having updated the address space mapping, the one or more of the DST processing units 1-2 sends the address space mapping that has been updated to one or more entities of the DSN (e.g., to the DSTN managing unit 18 of FIG. 1 for further distribution, to other DST processing units, to the user devices 1-2).

In an example of operation to retrieve the stored data to reproduce the data, the user device 2 identifies the DST processing unit 2 as affiliated with the data object 2-1 for retrieval based on accessing the address space mapping. Having identified the DST processing unit 2, the user device 2 issues a data access message 2 to the identified DST processing unit 2. For example, the user device 2 issues a retrieve data request to the DST processing unit 2, where the retrieve data request includes the identifier of the data object 2-1.

Having received the retrieve data request from the user device 2, the DST processing unit 2 obtains the data object 2-1. The obtaining includes at least one of retrieving the data object 2-1 from the local memory of DST processing unit 2 and recovering the data object 2-1 from the DSTN module 22. When the data object 2-1 is available from the local memory of the DST processing unit 2, the DST processing unit 2 issues a data access message 2 to the user device 2, where the data access message includes the data object 2-1. For example, the DST processing unit 2 sends a retrieve data response to the user device 2, where the retrieve data response includes the data object 2-1.

When the data object 2-1 is not available from the local memory of the DST processing unit 2, the DST processing unit 2 issues a DSTN message 2 to the DSTN module 22. For example, the DST processing unit 2 issues a read threshold number of read slice requests to the DSTN module 22 with regards to the data object 2-1, receives read slice responses, and decodes encoded data slices of the received read slice responses to reproduce the data object 2-1.

FIG. 40B is a flowchart illustrating an example of accessing data. The accessing includes one or more of storing the data, transferring the data, and retrieving the data. The method begins or continues, when storing a data object, at step 360 where a requesting entity (e.g., a user device) identifies an access module (e.g., a distributed storage and task (DST) processing unit) for a dispersed storage network (DSN) based on an identifier of the data object for storage. For example, the requesting entity accesses an address based mapping utilizing an identifier of the data object to retrieve an identifier of the access module that is associated with the identifier the data object.

The method continues at step 362 where the requesting entity sends the data object to the access module for storage in the DSN. The method continues at step 364 where the access module stores the data object in the DSN. For example, the access module dispersed storage error encodes the data to produce a plurality of sets of encoded data slices and sends the plurality of sets of encoded data slices to a set of storage units for storage. The method continues at step 366 where the access module facilitates storage of the data object in a cache memory in accordance with the address based mapping. For example, the access module stores the received data object in a memory of the identified access module. As another example, the access module sends the data object to another access module for storage, where the other access module is affiliated with the identifier of the data object.

When transferring the data object, the method continues at step 368 where the access module determines whether to transfer one or more data objects from the cache memory. The determining may be based on one or more of an available cache memory storage level, a frequency of access level for the one or more data objects, the available input/output resources, and an elapsed time of storage of the one or more data objects. For example, the access module determines to transfer a first data object from the cache memory when the first data object is associated with a frequency of access level that compares unfavorably (e.g., greater than) to a maximum frequency of access threshold level.

When transferring the data object, the method continues at step 370 where the access module identifies a cached data object for transfer and another access module. For example, the access module selects a cached data object associated with an identifier at an end of an address range associated with the access module where the identifier at the end meets a beginning identifier of another address range associated with another access module. Having selected the cached data object, the access module initiates a capacity query to the other access module and receives a favorable query response (e.g., to approve transfer of the identified cached data object).

The method continues at step 372 where the access module facilitates transfer of the cached data object to the other access module. For example, the access module issues a transfer message to the other access module, where the transfer message includes the identified cached data object and an identifier of the cached data object. Having received the transfer message, the other access module stores the data object in a local cache memory associated with the other access module. Having stored the data object in the local cache memory, the other access module may verify that the data object is available for retrieval from the DSN. Having stored the data object in the local cache memory associated with the other access module, the other access module sends a transfer confirmation message to the access module indicating that the data object has been successfully transferred. Having received the transfer confirmation message, the method continues at step 374 where the access module facilitates updating the address based mapping to disassociate the data object with the access module and associate the data object with the other access module.

When retrieving the data object from the DSN, the method continues at 376 where the requesting entity identifies the other access module based on the identifier of the data object for retrieval. For example, the other access module recovers an identifier of the other access module from the address space mapping using the identifier of the data object. The method continues at step 378 where the requesting entity issues a data object retrieval request to the other access module. The issuing includes generating the data object retrieval request to include the identifier of the data object and sending the data object retrieval request to the other access module.

The method continues at step 380 where the other access module retrieves the data object from the local cache memory of the other access module when the data object is available from the cache memory of the other access module. Alternatively, the other access module retrieves the data object from the DSN when the data object is unavailable from the local cache memory of the other access module. The method continues at step 382 where the other access module sends the data object to the requesting entity.

Figure 41A:
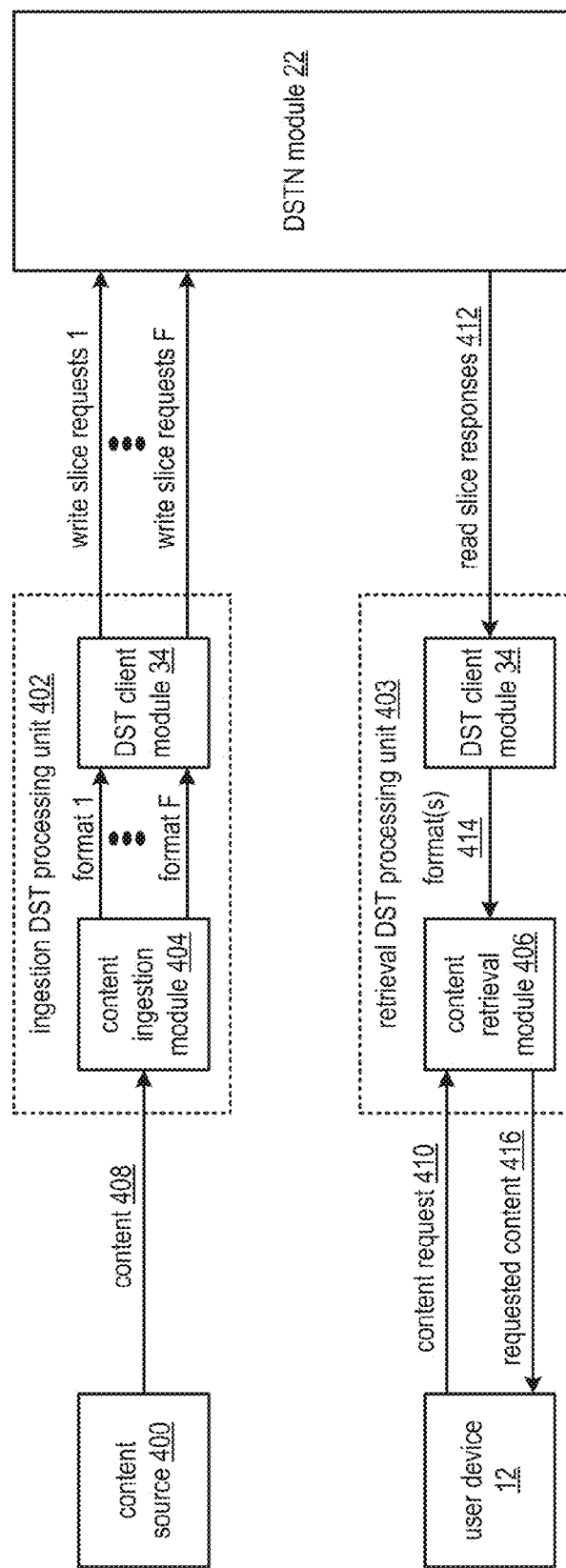
FIG. 41A is a schematic block diagram of another embodiment of a dispersed storage network (DSN) in accordance with the present invention.

FIG. 41A is a schematic block diagram of another embodiment of a dispersed storage network (DSN) that includes a content source 400, an ingestion distributed storage and task (DST) processing unit 402, the DSTN module 22 of FIG. 1, a retrieval DST processing unit 403, and the user device 12 of FIG. 1. Alternatively, the DSN further includes the network 24 of FIG. 1. The ingestion DST processing unit 402 and the retrieval DST processing unit 403 may be implemented utilizing the DST processing unit 16 of FIG. 1. The ingestion DST processing unit 402 includes a content ingestion module 404 and the DST client module 34 of FIG. 1. The retrieval DST processing unit 403 includes a content retrieval module 406 and the DST client module 34 of FIG. 1. The content source 400, the content ingestion module 404, and the content retrieval module 406 may be implemented utilizing one or more of the processing module 88 of FIG. 3, the DST processing unit 16 of FIG. 1, the user device 12, a server, a computing device, and the DST client module 34.

The system functions to ingest content for storage as stored content in the DSTN module 22 and to retrieve the stored content. The content includes one or more of files and streams. The files and streams include one or more content types. The content types include one or more of multimedia, audio, text, messages, movies, movie trailers, web videos, music recordings, etc. In an example of operation of the ingesting of the content for storage, the content ingestion module 404 receives the content 408 from the content source 400. The content 408 may include one or more formats of common source material. Formats include one or more of encoding algorithms and encoding parameters associated with representing the source material in a digital form.

Having received the content 408, the content ingestion module 404 transforms the content 408 into one or more formats 1-F in accordance with a formatting scheme. The formatting scheme includes one or more of a number of formats, a type of format for each of the formats, and parameters associated with each format. For example, a first format includes a 2 Mbps standard definition video stream and a second format includes a 50 Mbps high-definition video stream.

For each of the formats 1-F, the DST client module 34 of the ingestion DST processing unit 402 dispersed storage error encodes the format to produce a plurality of sets of encoded data slices. Having generated the plurality of sets of encoded data slices, the DST client module 34 generates a plurality of sets of slice names for the plurality of sets of encoded data slices based on one or more of a content type indicator and a content identifier. Having generated the plurality of sets of slice names, the DST client module 34 facilitates storage of the plurality of sets of encoded data slices. For example, the DST client module 34 generates a set of write slice requests and sends the set of write slice requests to the DSTN module 22, where the set of write slice requests includes the plurality of sets of encoded data slices and the plurality of sets of slice names. For instance, the DST client module 34 issues write slice requests 3 for a third format from the content ingestion module 400 for, where the write slice requests 3 includes a set of write slice requests.

Having facilitated the storage of the plurality of sets of encoded data slices for each format, the DST client module 34 of the ingestion DST processing unit 402 facilitates updating one or more of a dispersed hierarchical index and a DSN directory to associate identifiers of each of the formats and logical DSN addresses of the storage of each of the plurality of sets of encoded data slices. For example, the DST client module 34 updates the dispersed hierarchical index to include a format 3 identifier with a source name associated with the plurality of sets of slice names corresponding to the plurality of sets of encoded data slices from encoding of the format 3.

In an example of operation of retrieving stored content, the user device 12 issues a content request 410 to the retrieval DST processing unit 403, where the content request 410 includes one or more of a content identifier, a time indicator, and a type indicator of one or more desired formats associated with content of the content identifier. Having received the content request 410, the content retrieval module 406 accesses one or more of the dispersed hierarchical index and the DSN directory using one or more of a content ID, the time indicator, and the type indicators of the one or more desired formats to identify a logical DSN address for each desired format.

Having identified the DSN addresses for each of the desired formats, the DST client module 34 of the retrieval DST processing unit 403 recovers at least some of the plurality of sets of encoded data slices using the DSN addresses. For example, the DST client module 34 issues a set of read slice requests to the DSTN module 22 and receives read slice responses 412. The set of read slice requests includes a plurality of sets of slice names associated with each of the plurality sets of encoded data slices of each of the desired formats.

Having received the read slice responses 412, the DST client module 34 of the retrieval DST processing unit 403 dispersed storage error decodes a decode threshold number of encoded data slices for each set of the plurality of sets of encoded data slices of each plurality of sets of encoded data slices to reproduce the one or more formats 414. Having recovered the one or more formats 414, the content retrieval module 406 sends requested content 416 to the user device 12, where the requested content 416 includes the reproduced one or more formats 414.

Figure 41B:
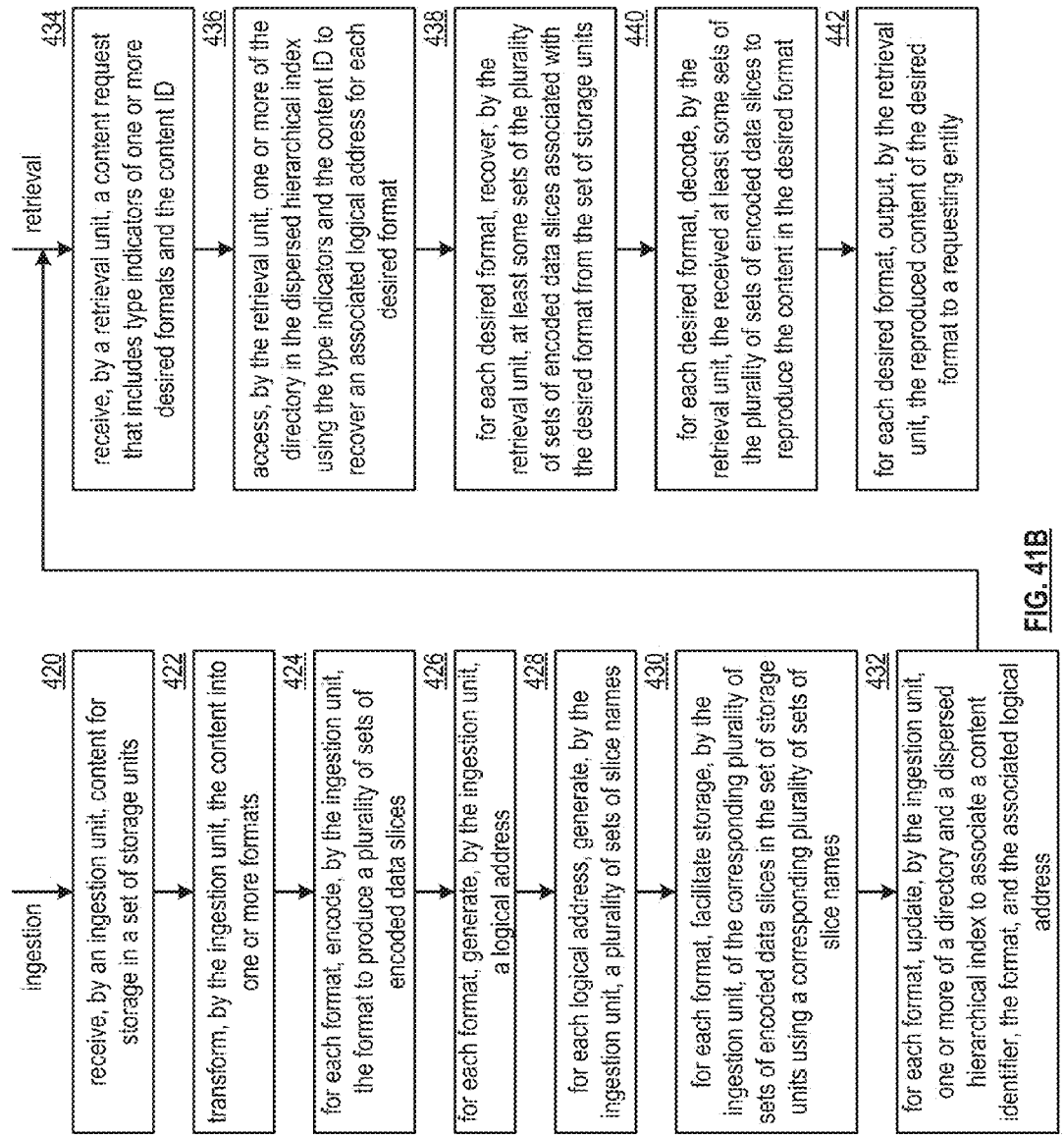
FIG. 41B is a flowchart illustrating another example of accessing data in accordance with the present invention.

FIG. 41B is a flowchart illustrating another example of accessing data. The method begins or continues, when ingesting data, at step 420 where an ingestion unit (e.g., a distributed storage and task (DST) processing unit utilized for ingestion) receives content for storage in a set of storage units. The ingestion unit may further receive one or more of an identifier of the content, a content size indicator, a content format indicator, and a content type indicator. The method continues at step 422 where the ingestion unit transforms the content into one or more formats. For example, the ingestion unit re-encodes the content into a plurality of other formats in accordance with a formatting scheme.

For each format, the method continues at step 424 where the ingestion unit dispersed storage error encodes the format to produce a plurality of sets of encoded data slices. For each format, the method continues at step 426 where the ingestion unit generates a logical address. For example, the ingestion unit produces a unique source name for each format based on one or more of the content identifier, a content type, and a format identifier.

For each logical address, the method continues at step 428 where the ingestion unit generates a plurality of sets of slice names. For example, the ingestion unit generates each slice name to include an associated unique source name. For each format, the method continues at step 430 where the ingestion unit facilitates storage of the corresponding plurality of sets of encoded data slices in the set of storage units using a corresponding plurality of sets of slice names. For example, the ingestion unit generates a set of write slice requests and sends the set of write slice requests to the set of storage units, where the set of write slice requests includes the corresponding plurality of sets of encoded data slices and the corresponding plurality of sets of slice names.

For each format, the method continues at step 432 where the ingestion unit updates one or more of a directory and a dispersed hierarchical index to associate one or more of a content identifier, the format, and the associated logical address. For example, the ingestion unit adds index keys to entries of the dispersed hierarchical index, where the index keys are associated with identifiers of the formats and the entries includes the logical address of the formats.

The method continues or begins, when retrieving the data, at step 434 where a retrieval unit receives a content request, where the content request includes one or more of type indicators of one or more desired formats, the content ID, and a time identifier. The method continues at step 436 where the retrieval unit accesses one or more of the directory and the dispersed hierarchical index using the type indicators and the content ID to recover an associated logical address for each desired format. For example, the retrieval unit utilizes a type indicator as an index key to access the dispersed hierarchical index to recover a corresponding logical address for the desired format.

For each desired format, the method continues at step 438 where the retrieval unit recovers at least some sets of the plurality of sets of encoded data slices associated with the desired format from the set of storage units. For example, the retrieval unit converts the associated logical address into sets of slice names, issues a set of read slice requests that includes the sets of slice names, and receives at least a decode threshold number of encoded data slices for each set of encoded data slices.

For each desired format, the method continues at step 440 where the retrieval unit decodes the received at least some sets of the plurality of sets of encoded data slices to reproduce the content in the desired format. Alternatively, or in addition to, the retrieval unit restricts decoding of slices to encoded data slices associated with a desired time frame within a video stream in accordance with the time identifier. For each desired format, the method continues at step 442 where the retrieval unit outputs the reproduced content of the desired format to a requesting entity.

Figure 42A:
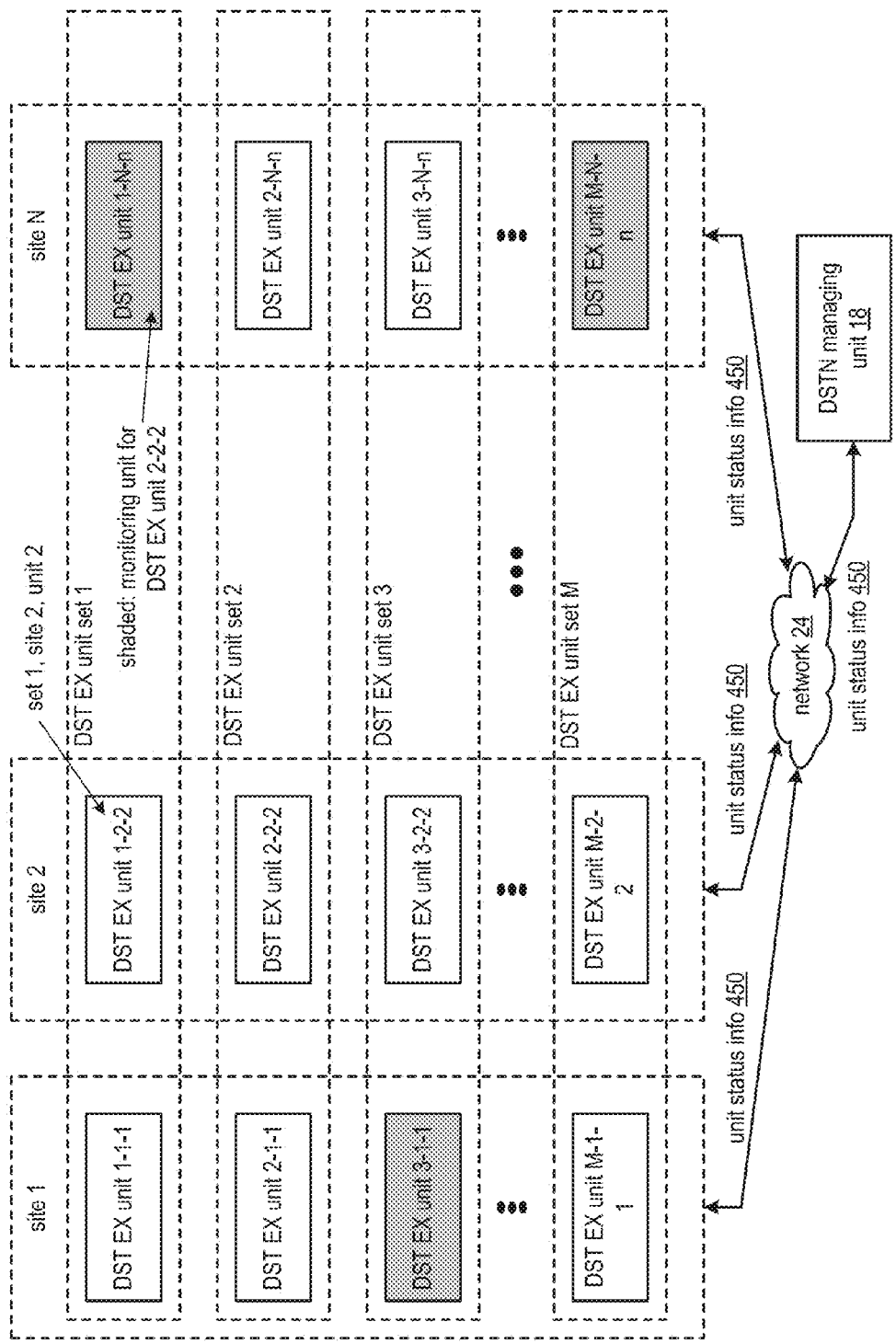
FIG. 42A is a schematic block diagram of another embodiment of a dispersed storage network (DSN) in accordance with the present invention.

FIG. 42A is a schematic block diagram of another embodiment of a dispersed storage network (DSN) that includes M distributed storage and task (DST) execution unit sets 1-M implemented at a plurality of N sites 1-N, the network 24 of FIG. 1, and the distributed storage and task network (DSTN) managing unit 18 of FIG. 1. Each DST execution unit set includes a set of n DST execution units. Each DST execution unit may be implemented utilizing the DST execution unit 36 of FIG. 1. As a specific example of the implementation of the M DST execution unit sets 1-M at the N sites 1-N, site 1 includes a first DST execution unit from each DST execution unit set, site 2 includes a second DST execution unit from each DST execution unit set, etc. For instance, the site 1 includes DST execution units 1-1-1, 2-1-1, 3-1-1, through M-1-1 (set, site, unit).

The DSN functions to establish monitoring resources for monitoring of one or more of the DST execution units and to perform the monitoring of the one or more DST execution units in accordance with the establishing of the monitoring resources. In an example of operation to establish the monitoring resources, the DSTN managing unit 18 obtains DSN configuration information. Alternatively, any other module, unit, or DSN entity of the DSN may perform such steps described for the DSTN managing unit 18. The obtaining includes at least one of performing a lookup, accessing at least a portion of registry information, receiving the configuration information, initiating a query, and receiving a query response. The DSN configuration information includes one or more of site location information, power source information, configuration information of the network 24, a number of sites indicator, a number of DST execution unit sets indicator, a mapping of DST execution units to each DST execution unit set, a mapping of each DST execution unit to a site, a rebuilding capability level of a DST execution unit, a foster encoded data slice storage capability level of a DST execution unit, a DST execution unit storage capacity level, and a DST execution unit storage utilization level.

Having obtained the DSN configuration information, the DSTN managing unit 18 selects a target DST execution unit to be monitored. The selecting may be based on one or more of identifying a next DST execution unit from a list of DST execution units to be monitored, detecting a new DST execution unit, determining that the DST execution unit is not being monitored, determining that a timeframe has elapsed since a last monitoring of the DST execution unit, interpreting an error message associated with the DST execution unit, and receiving a request.

Having selected the target DST execution unit, the DSTN managing unit 18 determines a number of monitoring DST execution units to associate with the target DST execution unit. The determining may be based on one or more of a DSN activity level, an expected failure rate level, a monitoring table, and a predetermination. For example, the DSTN managing unit selects the number of the monitoring DST execution units to be 1 when the DSN activity level is greater than a high threshold level. As another example, the DSTN managing unit selects the number of the monitoring DST execution units to be 3 when the DSN activity level is within an expected threshold level of an average DSN activity level and the monitoring table entry indicates to utilize three monitoring units when the DSN activity level is within the expected threshold level of the average DSN activity level.

Having determined the number of monitoring DST execution units, the DSTN managing unit 18 determines an estimated level of failure correlation between the target DST execution unit and at least some of the other DST execution units of the plurality of DST execution units based on the DSN configuration information. For example, the DSTN managing unit 18 indicates a higher than average estimated level of failure correlation between the target DST execution unit and another DST execution unit when the DSN configuration information indicates that the target DST execution unit and the other DST execution unit are implemented at a common site. As another example, the DSTN managing unit 18 indicates a lower than average estimated level of failure correlation between the target DST execution unit and the other DST execution unit when the DSN configuration information indicates that the target DST execution unit and the other DST execution unit are implemented at different sites and are part of different DST execution unit sets.

Having determined the number of monitoring DST execution units, the DSTN managing unit 18 selects at least some of the other DST execution units based on the estimated level of failure correlation and the number of monitoring DST execution units. For example, the DSTN managing unit 18 rank orders other DST execution units by corresponding estimated levels of failure correlation and selects the number that is associated with a least amount of failure correlation. For instance, the DSTN managing unit 18 selects three DST execution units 1-N-n, 3-1-1, and M-N-n when the target DST execution unit is DST execution unit 2-2-2 and the three DST execution units are associated with the least amount of failure correlation with regards to DST execution unit 2-2-2.

Having selected the monitoring DST execution units, the DSTN managing unit 18 assigns the selected monitoring DST execution units for the target DST execution unit. For example, the DSTN managing unit 18 issues unit status information to the three selected monitoring DST execution units, where the unit status information includes a monitoring assignment request to monitor DST execution unit 2-2-2. The monitoring assignment request may include one or more of an identifier of the target DST execution unit, identifiers of the monitoring DST execution units, a frequency of reporting schedule, a threshold for reporting, and a type of monitoring indicator. The type of monitoring indicator indicates one or more types of monitoring including one or more of sending a periodic ping, receiving a ping response, sending data, receiving a response to the sending of the data, exchanging security information, obtaining performance information, initiating a test, and analyzing test results.

In an example of operation to perform the monitoring, at least some of the assigned monitoring DST execution units perform a monitoring function in accordance with the type of monitoring indicator to monitor the target DST execution unit and to produce unit status information 450 that includes monitoring results. Having produced unit status information 450, the assigned monitoring DST execution unit sends the unit status information 450 to the DSTN managing unit 18 in accordance with one or more of a frequency of reporting schedule and the threshold for reporting. For example, the DST execution unit 3-1-1 continually monitors DST execution unit 2-2-2 and produces the unit status information 450. The DST execution unit 3-1-1 interprets the unit status information 450 and determines to send the unit status information 450 to the DSTN managing unit 18 when a portion of the unit status information compares unfavorably to a desired threshold level. As another example, the DST execution unit 3-1-1 determines to send the unit status information 450 to the DSTN managing unit 18 when interpreting of the frequency of reporting schedule indicates to send the unit status information 450. The DST execution unit 3-1-1 sends the unit status information 450 to the DSTN managing unit 18 when the DST execution unit 3-1-1 determines to send the unit status information 450.

Figure 42B:
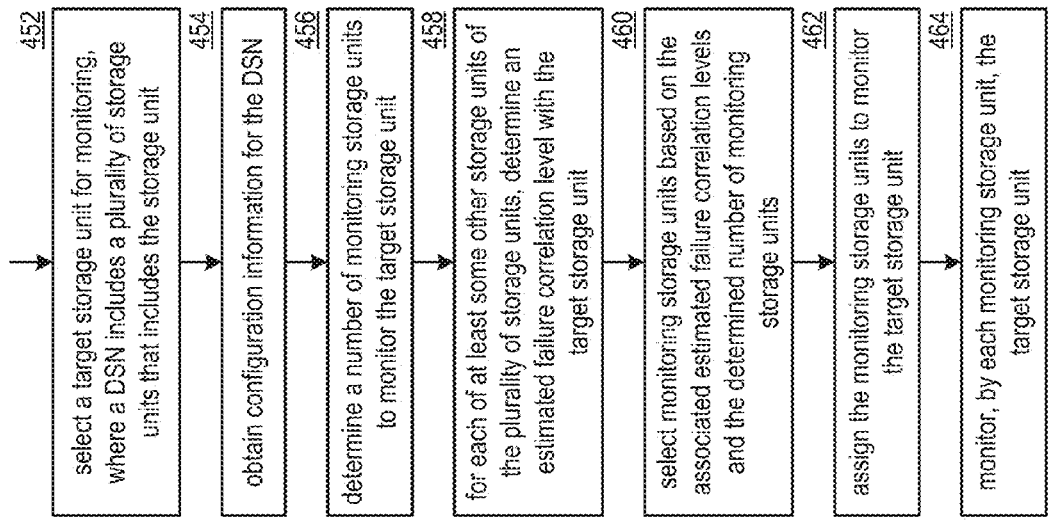
FIG. 42B is a flowchart illustrating an example of monitoring storage units in accordance with the present invention.

FIG. 42B is a flowchart illustrating an example of monitoring storage units. The method begins or continues at step 452 where a processing module (e.g., of a distributed storage and task network (DSTN) managing unit) selects a target storage unit for monitoring, where a dispersed storage network (DSN) includes a plurality of storage units that includes the storage unit. The selecting may be based on one or more of interpreting a selection list, detecting that no monitoring units are associated with the target storage unit, detecting activation of a new storage unit, and receiving a request.

The method continues at step 454 where the processing module obtains configuration information for the DSN. For example, the processing module accesses a portion of a system registry. The method continues at step 456 where the processing module determines a number of monitoring storage units to monitor the target storage unit. For example, the processing module selects a higher than average number of monitoring storage units when a DSN activity level is lower than an average DSN activity level. As another example, the processing module selects a lower than average number of monitoring storage units when an estimated storage unit failure rate is lower than an average storage unit failure rate.

For each of at least some of other storage units of the plurality of storage units, the method continues at step 458 where the processing module determines an estimated failure correlation level with the target storage unit based on the configuration information for the DSN. The method continues at step 460 where the processing module selects monitoring storage units based on the associated estimated failure correlation levels and the determined number of monitoring storage units. For example, the processing module selects monitoring storage units associated with minimal estimated failure correlation levels.

The method continues at step 462 where the processing module assigns the monitoring storage units to monitor the target storage unit. For example, the processing module issues a monitoring assignment message to each of the monitoring storage units and to the target storage unit, where the monitoring assignment message indicates a monitoring relationship between the assigned monitoring storage units and the target storage unit.

The method continues at step 464 where each monitoring storage unit monitors the target storage unit. For example, the monitoring storage unit, from time to time, initiates a status check message to the target storage unit, receives a status check response from the target storage unit, indicates a potential failure when not receiving a favorable status check response within a response timeframe, gathers statistics, and reports failures and the statistics to one or more of a managing unit, the target storage unit, and at least one of other monitoring storage units.

Figure 43A:
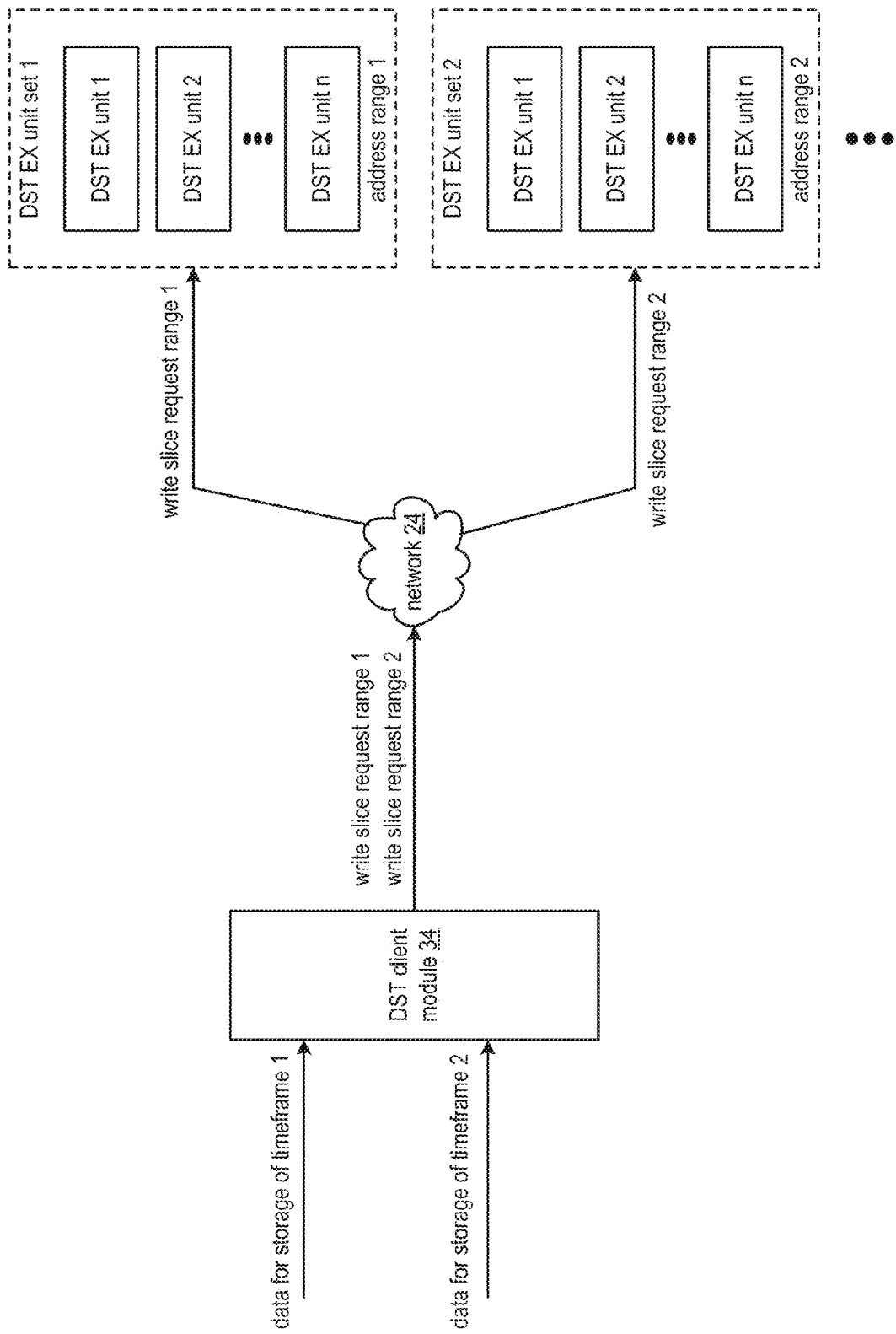
FIG. 43A is a schematic block diagram of another embodiment of a dispersed storage network (DSN) in accordance with the present invention.

FIG. 43A is a schematic block diagram of another embodiment of a dispersed storage network (DSN) that includes the distributed storage and task (DST) client module 34 of FIG. 1, the network 24 of FIG. 1, and at least two DST execution unit sets 1-2. Each DST execution unit set includes a set of DST execution units 1-n, where each set of DST execution units is associated with an address range of the DSN. For example, DST execution unit 1 is associated with an address range 1 and DST execution unit 2 is associated with an address range 2. The address range includes a starting address and an ending address, where the addresses includes one or more of a source name, a file name, and a slice name associated with an encoded data slice. Each DST execution unit may be implemented utilizing the DST execution unit 36 of FIG. 1.

The DSN functions to store data as sets of encoded data slices in accordance with a time frame based addressing scheme. In an example of operation of the storing of the data, the DST client module 34 receives data for storage associated with a first timeframe. Having received the data, the DST client module 34 identifies a current timeframe. The timeframe may include a repeating range. For example, the repeating range repeats every five minutes. Having identified the current timeframe, the DST client module 34 generates a source name based on the current timeframe such that source names for adjacent time frames are associated with different address space ranges assigned to DST execution unit sets. The generating includes performing a deterministic function on the current timeframe to produce the source name. Alternatively, the DST client module 34 generates a source name that maps to two or more address ranges of two or more DST execution unit sets and is always different than a next source name for a next time frame (e.g., the next time frame maps to different address ranges and DST execution unit sets).

Having generated the source name, the DST client module 34 generates a plurality of sets of slice names, where each slice name includes the source name and other slice name field entries in accordance with the system registry information and the data. Having generated the plurality of sets of slice names, the DST client module 34 dispersed storage error encodes the data to produce a plurality of sets of encoded data slices. Having generated the plurality of sets of encoded data slices, the DST client module 34 generates one or more sets of write slice requests that includes the plurality of sets of slice names and the plurality of sets of encoded data slices.

Having generated the one or more sets of write slice requests, the DST client module 34 identifies a DST execution unit set based on the source name and an assigned address range of the DST execution unit set, where the source name falls within the assigned address range of the DST execution unit set. Having identified the DST execution unit set, the DST client module 34 issues, via the network 24, write slice requests for range 1 to the identified DST execution unit set 1 to facilitate storage of the plurality of sets of encoded data slices in the set of DST execution units 1-n of the DST execution unit set 1.

Figure 43B:
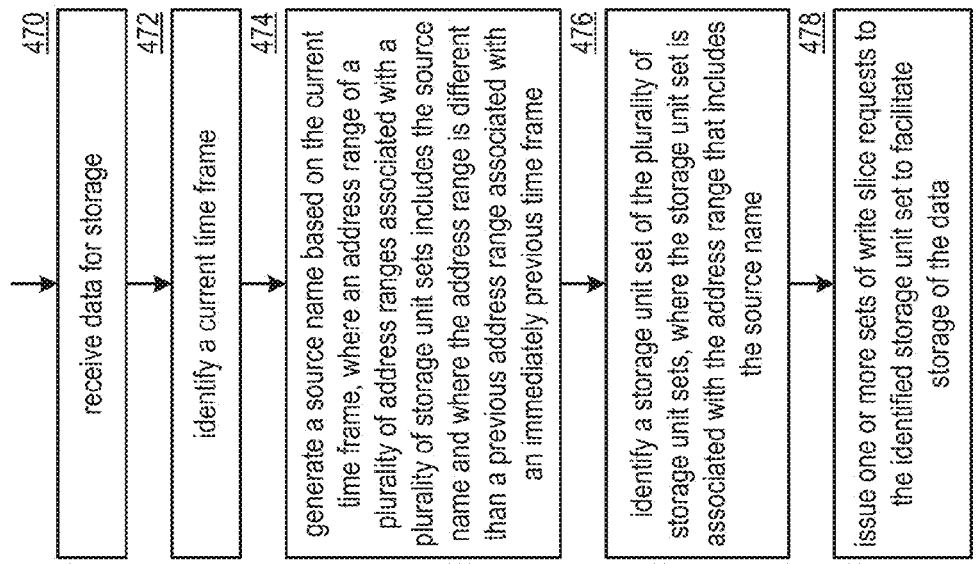
FIG. 43B is a flowchart illustrating an example of storing data in accordance with the present invention.

FIG. 43B is a flowchart illustrating an example of storing data. The method begins or continues at step 470 where a processing module (e.g., of a distributed storage and task (DST) client module) receives data for storage. The method continues at step 472 where the processing module identifies a current timeframe. For example, the processing module obtains a current timestamp from a clock function and identifies the current timeframe based on the current timestamp (e.g., determining whether the current timestamp is within a timeframe interval).

The method continues at step 474 where the processing module generates a source name based on the current timeframe, where an address range of a plurality of address ranges associated with a plurality of storage unit sets includes the source name and where the address range is different than a previous address range associated with an immediately previous timeframe. For example, the processing module selects (e.g., round robin, random, next) one constant of a set of constants and performs a deterministic function on the selected constant and the current timeframe to produce an intermediate result. The processing module utilizes the intermediate result as at least some most significant bits of the source name.

The method continues at step 476 where the processing module identifies a storage unit set of the plurality of storage unit sets, where the storage unit set is associated with the address range that includes the source name. For example, the processing module accesses an address to storage unit set identification list. As another example, the processing module initiates a query and receives a query response. The method continues at step 478 where the processing module issues one or more sets of write slice requests to the identified storage units set to facilitate storage of the data. For example, the processing module generates a plurality of sets of slice names utilizing the source name, dispersed storage error encodes the data to produce a plurality of sets of encoded data slices, generates the one or more sets of write slice requests to include the plurality of sets of encoded data slices and the plurality of sets of slice names, and sends the one or more sets of write slice requests to the identified storage unit set.

FIG. 44A is a schematic block diagram of another embodiment of a dispersed storage network (DSN) that includes a plurality of rebuilding modules 1-4 and a distributed storage and task (DST) execution (EX) unit set 490. Each rebuilding module may be implemented utilizing at least one of the DST processing unit 16 of FIG. 1, the DST execution unit 36 of FIG. 1, and the DST integrity processing unit 20 of FIG. 1. The DSN may further include the network 24 of FIG. 1 to operably couple the rebuilding modules 1-4 and the DST execution unit set 490. The DST execution unit set includes a set of DST execution units 1-*n*. Each DST execution unit includes a group of M memories. For example, DST execution unit 1 includes memories 1-1, 1-2, through 1-M, DST execution unit 2 includes memories 2-1, 2-2, through 2-M, etc. Each DST execution unit may be implemented utilizing the DST execution unit 36 of FIG. 1. Each memory may be implemented utilizing the memory 88 of FIG. 3. Each memory is associated with an address range of the DSN. For example, memory 1-1 is associated with address range 1-1, memory 1-2 associated with address range 1-2, through memory 1-M is associated with address range 1-M, and memory 2-1 is associated with address range 2-1, memory 2-2 associated with address range 2-2, through memory 2-M is associated with address range 2-M, etc.

The DSN functions to adjust a rate of rebuilding activities, where the rebuilding activities includes detecting storage errors and rebuilding encoded data slices associated with the detected storage errors. In an example of operation, rebuilding module 1 selects an address range for execution of rebuilding activities. The selecting includes at least one of interpreting a list, receiving an error message, receiving a rebuilding assignment, and a predetermination. For example, the rebuilding module 1 selects address range 2-1 when receiving an error message associated with memory 2-1 and identifying the address range 2-1 as associated with memory 2-1.

Having selected the address range for rebuilding activities, the rebuilding module 1 facilitates execution of the rebuilding activities for the selected address range 1. For example, the rebuilding module 1 identifies DST execution unit 2 to be associated with the selected address range, exchanges rebuilding messages range 2-1 with DST execution unit 2 to detect the storage errors (e.g., issue list slice requests, receives list slice responses, interprets the list slice responses to identify the storage errors), rebuilds one or more encoded data slices associated with the identified storage errors, and exchanges further rebuilding messages range 2-1 with the DST execution unit 2 to facilitate storage of one or more rebuilt encoded data slices in the memory 2-1. Substantially in parallel, the rebuilding modules 2 and 3 may also be exchanging rebuilding messages range 2-1 with the DST execution unit 2 to facilitate rebuilding activities within the address range 2-1.

Having facilitated execution of the rebuilding activities for the selected address range, the rebuilding module 1 determines whether continuing execution of the rebuilding activities for the selected address range is associated with favorably impacting overall rebuilding activities associated with the selected address range (e.g., since rebuilding modules 2 and 3 may also be performing rebuilding activities with regards to the selected address range 2-1). The determining whether the continuing execution of the rebuilding activities for the selected address range is associated with favorably impacting the overall rebuilding activities includes a series of steps.

The series of steps begins with the rebuilding module 1 issuing a rebuilding rate request to the identified DST execution unit 2 with regards to a previous timeframe. The rebuilding rate includes a rate of rebuilding activities per unit of time (e.g., number of scans for detecting storage errors, number of writing rebuilt encoded data slices). The rebuilding module 1 receives a rebuilding rate response from the identified DST execution unit 2, where the response indicates a rate of rebuilding activities associated with the selected address range over the previous timeframe.

Having received the rebuilding rate associated with the previous timeframe, the rebuilding module 1 temporarily suspends execution of the rebuilding activities for a suspension timeframe. For example, the rebuilding module 1 discontinues issuing further list slice requests for further sub-address ranges and discontinues issuing further write rebuilt slice requests. Having temporarily suspended the execution of the rebuilding activities, the rebuilding module 1 issues another rebuilding rate request to the identified DST execution unit 2 when the suspension timeframe has expired. The rebuilding module 1 receives another rebuilding rate response from the identified DST execution unit 2, where the other response indicates another rate of rebuilding activities associated with the selected address range over the suspension timeframe (e.g., when the rebuilding module 1 was not participating in the rebuilding activities).

Having received the other rebuilding rate of rebuilding activities over the suspension timeframe, the rebuilding module 1 determines whether the other rebuilding rate compares favorably to the rebuilding rate. For example, the rebuilding module 1 indicates that the comparison is unfavorable when a difference between the other rebuilding rate and the rebuilding rate is less than a low rebuilding rate threshold level. As such, the rebuilding module 1 is not contributing in a meaningful way to the rebuilding activities associated with the selected address range 2-1.

In another scenario, where rebuilding module 4 determines whether continuing execution of rebuilding activities for address range 1-1 is associated with favorably impacting the overall rebuilding activities, the rebuilding module 4 indicates that the comparison is favorable when a difference between the other rebuilding rate and the rebuilding rate is greater than a high rebuilding rate threshold level. As such, the indication indicates that the rebuilding module 4 is contributing in a significant way to the rebuilding activities associated with the address range 1-1.

When the comparison is favorable, the rebuilding module 4 facilitates resuming the execution of rebuilding activities for address range 1-1. When the comparison is unfavorable, the rebuilding module 1 selects another address range and facilitates execution of other rebuilding activities for the other selected address range.

Figure 44B:
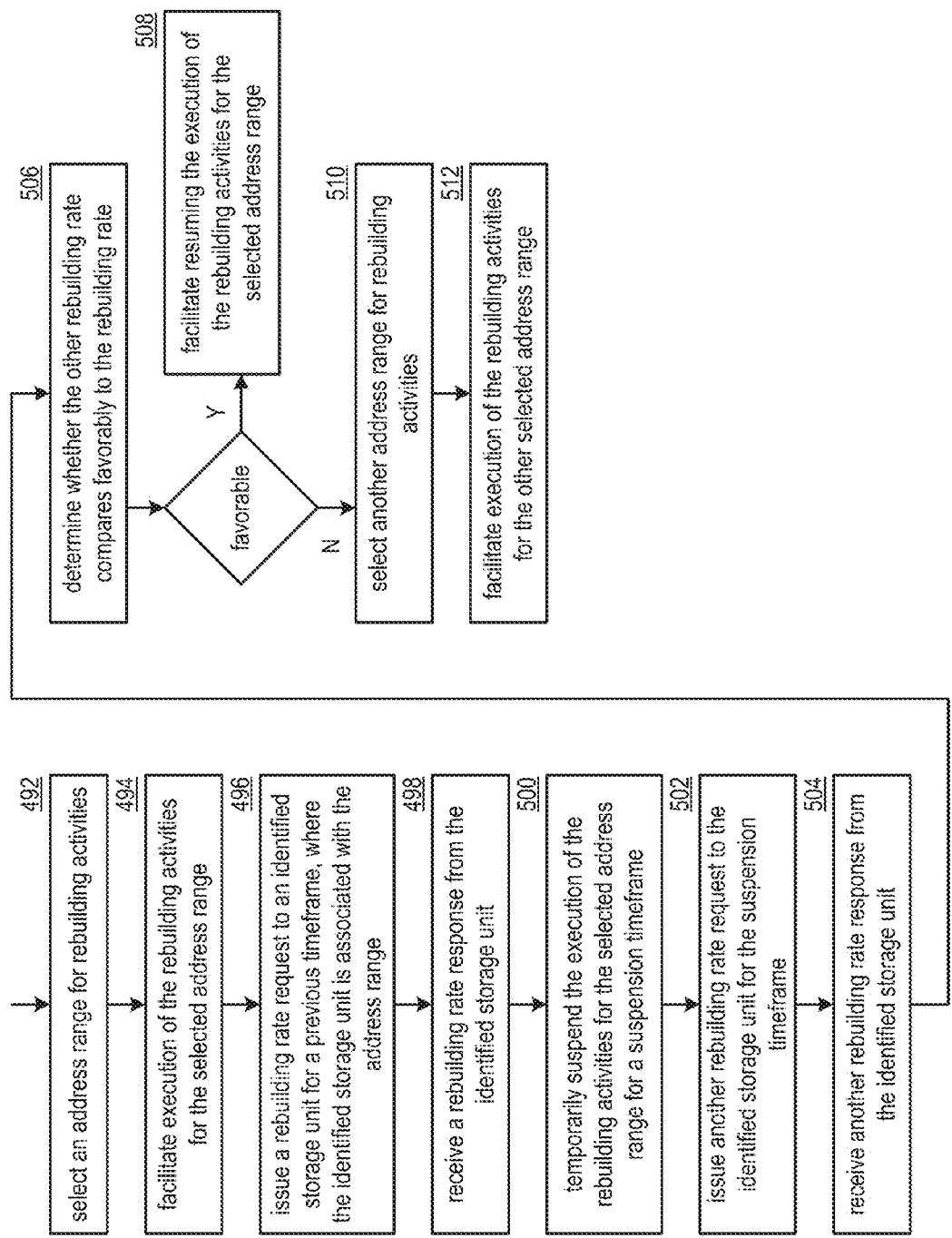
FIG. 44B is a flowchart illustrating an example of rebuilding data in accordance with the present invention.

FIG. 44B is a flowchart illustrating an example of rebuilding data. The method begins or continues at step 492 where a processing module (e.g., of a rebuilding module) selects an address range for rebuilding activities. The selecting includes at least one of identifying a next address range, interpreting an error message to identify the address range, receiving a request, and predicting that additional rebuilding resources can meaningfully impact execution of rebuilding activities associated with the address range.

The method continues at step 494 where the processing module facilitates execution of the rebuilding activities for the selected address range (e.g., scanning for storage errors, rebuilding encoded data slices associated with the storage errors, storing rebuilt encoded data slices). The method continues at step 496 where the processing module issues a rebuilding rate request to an identified storage unit for a previous timeframe, where the identified storage unit is associated with the selected address range. For example, the processing module identifies a memory device associated with the selected address range and identifies a storage unit of a plurality of storage units, where the storage unit is associated with the memory device to produce the identified storage unit.

The method continues at step 498 where the processing module receives a rebuilding rate response from the identified storage unit. The receiving includes the processing module extracting a rebuilding rate for the previous timeframe from the rebuilding rate response. The method continues at step 500 where the processing module temporarily suspends execution of rebuilding activities for the selected address range (e.g., halts the scanning for storage errors, halts the rebuilding of the encoded data slices, and halts the storing of the rebuilt encoded data slices).

The method continues at step 502 where the processing module issues another rebuilding rate request to the identified storage unit for the suspension timeframe. The method continues at step 504 where the processing module receives another rebuilding rate response from the identified storage unit. The receiving includes extracting another rebuilding rate for the previous timeframe.

The method continues at step 506 where the processing module determines whether the other rebuilding rate compares favorably to the rebuilding rate. For example, the processing module indicates that the comparison is favorable when a difference between the other rebuilding rate and the rebuilding rate is greater than a high rebuilding rate threshold level. As another example, the processing module indicates the comparison is unfavorable when the difference between the other rebuilding rate and the rebuilding rate is less than a low rebuilding rate threshold level. The method branches to step 510 when the comparison is not favorable. The method continues to step 508 when the comparison is favorable. The method continues at step 508 where the processing module facilitates resuming the execution of the rebuilding activities for the selected address range (e.g., continue scanning, rebuilding, storing rebuilt encoded data slices).

The method continues at step 510 where the processing module selects another address range for rebuilding activities when the comparison is unfavorable. The selecting includes one or more of selecting a next address range, receiving an error message, identifying an address range associated with a storage error, receiving a request, selecting another memory device, and identifying the address range associated with the selected other memory device. The method continues at step 512 where the processing module facilitates execution of the rebuilding activities for the other selected address range.

Figure 45A:
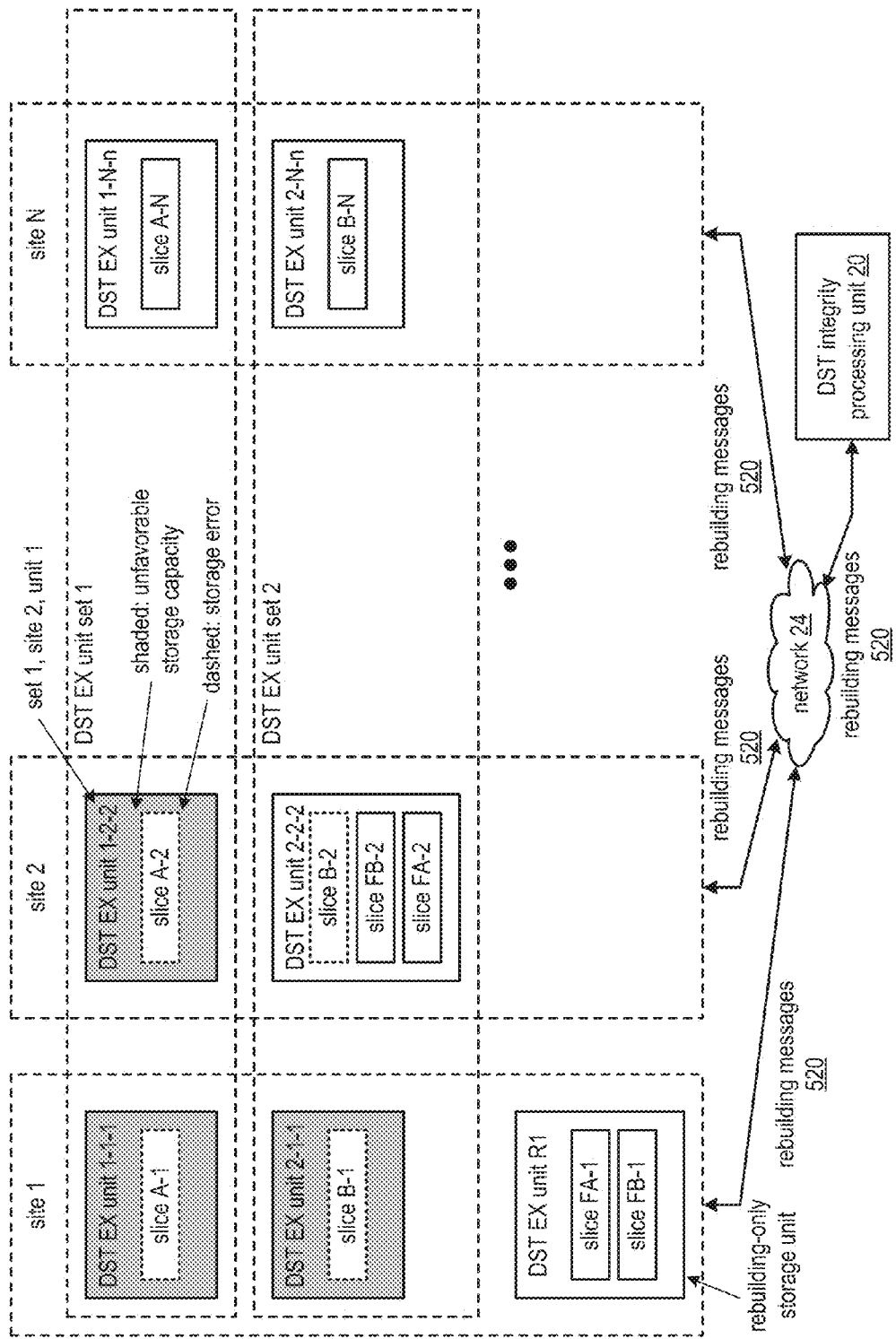
FIG. 45A is a schematic block diagram of another embodiment of a dispersed storage network (DSN) in accordance with the present invention.

FIG. 45A is a schematic block diagram of another embodiment of a dispersed storage network (DSN) that includes at least two distributed storage and task (DST) execution unit sets 1-2 implemented at a plurality of N sites 1-N, a rebuilding-only storage unit DST execution unit R1, the network 24 of FIG. 1, and the DST integrity processing unit 20 of FIG. 1. Each DST execution unit set includes a set of n DST execution units. Each DST execution unit may be implemented utilizing the DST execution unit 36 of FIG. 1. As a specific example of the implementation of the DST execution unit sets 1-2 at the N sites 1-N, site 1 includes a first DST execution unit from each DST execution unit set, site 2 includes a second DST execution unit from each DST execution unit set, etc. For instance, the site 1 includes DST execution units 1-1-1 and 2-1-1, while the site 2 includes DST execution units 1-2-2 and 2-2-2, etc. (e.g., set, site, unit).

The DSN functions to rebuild data stored in the sets of DST execution units. In particular, one or more of the DST integrity processing unit 20 and any DST execution unit may include a rebuilding module capable of facilitating the rebuilding of the stored data. For example, DST execution unit R1 is capable of rebuilding the stored data. As another example, DST execution unit 2-2-2 is capable of rebuilding the stored data.

In an example of operation of the rebuilding of the stored data, the rebuilding module identifies a storage error of an encoded data slice associated with an unavailable memory device. For example, the DST integrity processing unit 20 issues, via the network 24, rebuilding messages 520 to one or more of the DST execution units, receives rebuilding messages 520 that includes list slice responses, and compares the list slice responses to identify storage errors. The rebuilding messages 520 includes one or more of a list slice request, a list slice response, a rebuild an encoded data slice request, an available storage capacity level, DSN topology information, a write foster encoded data slice request, and a migrate foster encoded data slice back to a home storage location request. For instance, the DST integrity processing unit 20 identifies a storage error associated with slice A-1 at DST execution unit 1-1-1, a storage error associated with slice A-2 at DST execution unit 1-2-2, a storage error associated with slice B-1 at DST execution unit 2-1-1, and a storage error associated with slice B-2 at DST execution unit 2-2-2.

Having identified the storage error, the rebuilding module obtains DSN configuration information associated with the encoded data slice of the storage error. Having obtained the DSN configuration, the rebuilding module rebuilds the encoded data slice to produce a foster encoded data slice. For example, the rebuilding module produces a foster slice FA-1 for slice A-1, a foster slice FB-1 for slice B-1, a foster slice FA-2 for slice A-2, and foster slice FB-2 for slice B-2. Having produced the foster encoded data slice, the rebuilding module identifies a plurality of candidate storage locations for the foster encoded data slice based on the DSN configuration information. For example, the rebuilding module identifies the DST execution units 1-1-1, 2-1-1, 1-2-2, 2-2-2 and the DST execution unit R1 as the candidate storage locations when the DSN configuration information indicates that each DST execution unit is capable of storing foster encoded data slices.

Having identified the candidate storage locations for the foster encoded data slice, the rebuilding module obtains storage status of the candidate storage locations. The storage status indicates an available capacity level of storing a foster encoded data slice. The obtaining includes at least one of interpreting an error message, accessing a storage status list, initiating a query to a DST execution unit, and receiving a query response that includes the storage status. For example, the rebuilding module obtains storage status from DST execution units 1-1-1, 2-1-1, and 1-2-2 indicating no available capacity (e.g., since unavailable) to store the foster encoded data slice and obtains storage status from the DST execution units 2-2-2 and R1 indicating sufficient capacity to store the foster encoded data slice.

Having obtained the storage status of the candidate storage locations, the rebuilding module selects at least one storage location of the candidate storage locations for storing the foster encoded data slice based on one or more of the storage status and the DSN configuration information. For example, the rebuilding module selects DST execution unit R1 to store foster slices FA-1 and FB-1 in accordance with the DSN configuration information indicating that DST execution unit R1 is implemented at a common site 1 with DST execution units 1-1-1 and 2-1-1 (e.g., to facilitate migration of foster encoded data slices back to home DST execution units 1-1-1 and 2-1-1 when the DST execution units are available). As another example, the rebuilding module selects DST execution unit 2-2-2 to store foster slice FB-2 when the configuration information indicates that DST execution unit 2-2-2 is a home DST execution unit associated with slice B-2 and the storage status of DST execution unit 2-2-2 indicates that the DST execution unit 2-2-2 has sufficient capacity to store foster encoded data slices. As yet another example, the rebuilding module selects DST execution unit 2-2-2 to store foster slice FA-2 when the DSN configuration information indicates that DST execution unit 2-2-2 is implemented at a common site with home DST execution unit 1-2-2 for slice A-2.

Having selected the at least one storage location, the rebuilding module facilitates temporary storage of the foster encoded data slice in the selected storage location. For example, the rebuilding module facilitates storage of foster slices FA-1 and FB-1 in DST execution unit R1 and facilitates storage of foster slices FA-2 and FB-2 in DST execution unit 2-2-2. When any of the home DST execution units become available, the rebuilding module may facilitate migration of foster slice from the temporary storage in the selected storage location to the home DST execution unit. Having facilitated the temporary storage of the foster encoded data slice, the rebuilding module may update a storage location list to associate the foster encoded data slice with the at least one candidate storage location.

Figure 45B:
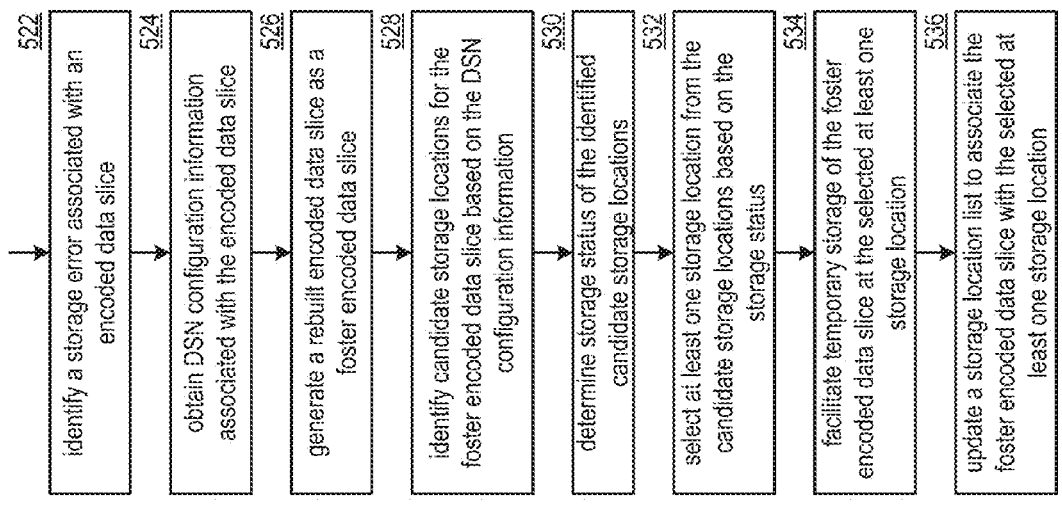
FIG. 45B is a flowchart illustrating another example of rebuilding data in accordance with the present invention.

FIG. 45B is a flowchart illustrating another example of rebuilding data. The method begins or continues at step 522 where a processing module (e.g., of a rebuilding module) identifies a storage error associated with an encoded data slice. For example, the processing module identifies an unavailable memory device and identifies an encoded data slice associated with the unavailable memory device as the encoded data slice. The method continues at step 524 where the processing module obtains dispersed storage network (DSN) configuration information associated with the encoded data slice.

The method continues at step 526 where the processing module generates a rebuilt encoded data slice as a foster encoded data slice, where the rebuilt encoded data slice corresponds to the encoded data slice associated with the storage error. For example, the processing module recovers a decode threshold number of encoded data slices of a set of encoded data slices associated with the encoded data slice, dispersed storage error decodes the decode threshold number of encoded data slices to reproduce a data segment, and dispersed storage error encodes the reproduced data segment to produce the rebuilt encoded data slice.

The method continues at step 528 where the processing module identifies candidate storage locations for the foster encoded data slice based on the DSN configuration information. For example, the processing module identifies a storage unit at a site associated with the identified unavailable memory device. As another example, the processing module identifies another storage unit at an adjacent site to the site associated with the identified unavailable memory device.

The method continues at step 530 where the processing module determines storage status of the identified candidates storage locations. For example, the processing module initiates a storage status request and receives a storage status response indicating the storage status of the identified candidate storage locations.

The method continues at step 532 where the processing module selects at least one storage location from the candidate storage locations based on the storage status and the DSN configuration information. For example, the processing module selects a storage unit at the site associated with the identified unavailable memory device when the storage unit is available to store the foster encoded data slice and has sufficient memory capacity in accordance with the storage status of the storage unit.

The method continues at step 534 where the processing module facilitates temporary storage of the foster encoded data slice at the selected at least one storage location. For example, the processing module stores the foster encoded data slice in a local memory when the storage location is another memory of a common storage unit associated with the processing module. As another example, the processing module issues a write slice request to the storage unit of the selected storage location, where the write slice request includes the foster encoded data slice.

The method continues at step 536 where the processing module updates a storage location list to associate the foster encoded data slice with the selected at least one storage location. The updating includes, for each of the selected at least one storage locations, updating one or more of a dispersed hierarchical index and a DSN directory to associate a slice name of the foster encoded data slice with one or more identifiers associated with the selected storage location.

Figure 46A:
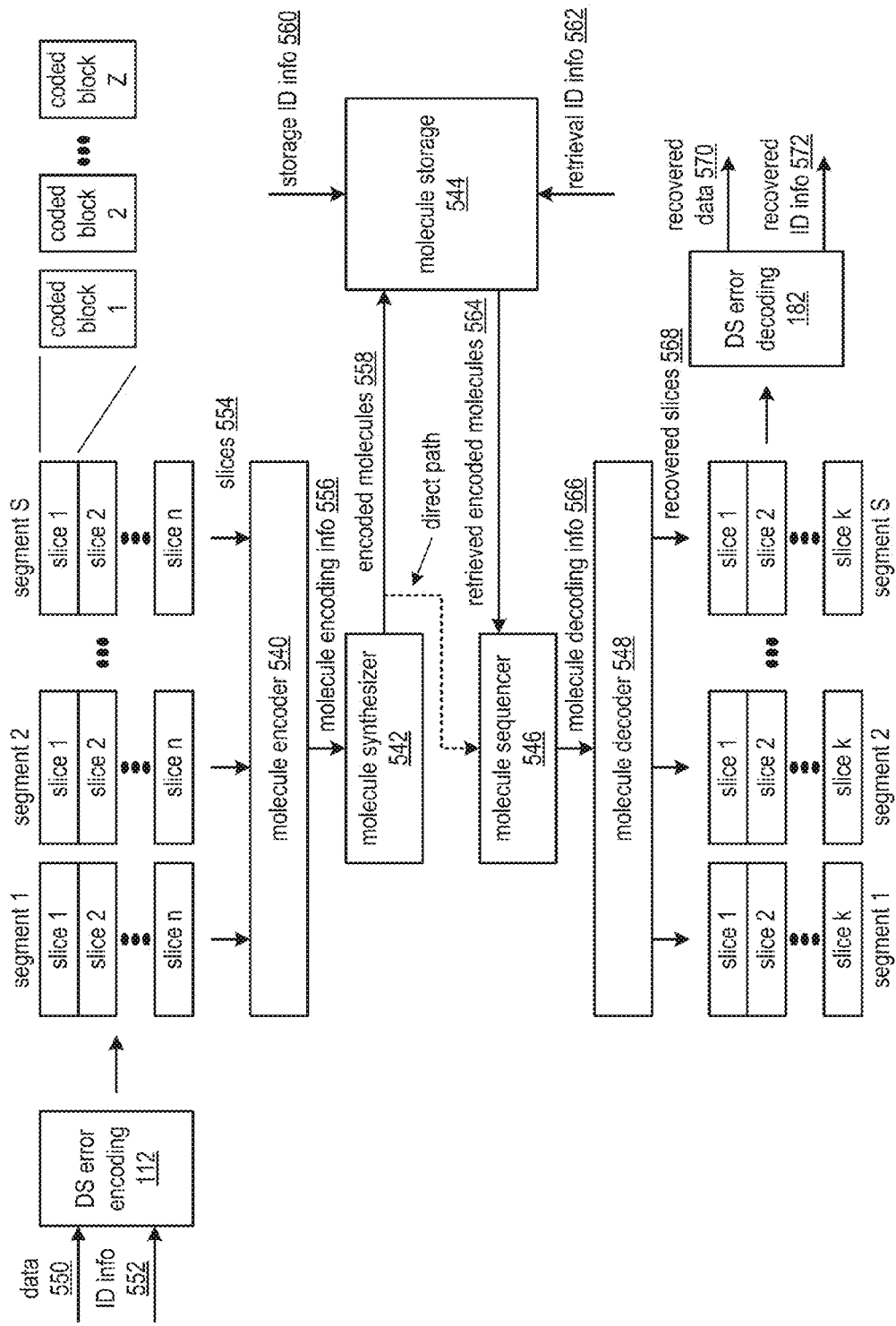
FIG. 46A is a schematic block diagram of another embodiment of a dispersed storage network (DSN) in accordance with the present invention.

FIG. 46A is a schematic block diagram of another embodiment of a dispersed storage network (DSN) that includes a dispersed storage (DS) error encoding 112 of FIG. 4, a molecule encoder 540, a molecule synthesizer 542, a molecule storage 544, a molecule sequencer 546, a molecule decoder 548, and a DS error decoding 182 of FIG. 13. The molecule encoder 540 and the molecule decoder 548 may be implemented utilizing one or more of the processing module 84 of FIG. 3, the distributed storage and task (DST) client module 34 of FIG. 1, the grouping selector 114 of FIG. 4, and the outbound DST processing 80 of FIG. 3. The molecule synthesizer 542 may be implemented utilizing an oligonucleotide synthesizer. The molecule sequencer 546 may be implemented utilizing a Deoxyribonucleic acid (DNA) sequencer. The molecule storage 544 includes an environment to sustain encoded molecules 558, where degradation is minimized due to one or more of age, radiation, and environmental conditions. Hereafter, the encoded molecules 558 may be interchangeably referred to as molecule storage structures. The molecule storage 544 may include one or more molecule storage units, where a set of molecule storage units substantially partitions one or more sets of molecules.

The DSN functions to store data 550 as the encoded modules 558 in the molecule storage 544 and to produce recovered data 570 from retrieved encoded molecules 564. In an example of operation of the storing of the data 550, the DS error encoding 112 receives the data 550 and identifier (ID) information 552 associated with the data 550. The identifier information 552 includes one or more of a data object ID, a DSN address, a source name, a virtual DSN address, a slice name, storage ID information 560, and retrieval ID information 562.

The storage ID information 560 and the retrieval ID information 562 includes one or more identifiers associated with the encoded molecules 558 to facilitate storage and retrieval of the encoded molecules. For example, a first storage ID includes an identifier associated with a first molecule that is to be stored in a first molecule storage unit of the set of molecule storage units of the molecule storage 544, a second storage ID includes an identifier associated with a second molecule that is to be stored in a second molecule storage unit of the set of molecule storage units of the molecule storage 544, etc. The storage ID information 560 and the retrieval ID information 562 may be encoded in accordance with one or more industry and/or proprietary standards. For instance, the first storage ID is implemented utilizing a unique first Internet protocol (IP) address and the second storage ID is implemented utilizing a unique second IP address, etc. The storage ID information 560 and the retrieval ID information 562 may be maintained in one or more of a database system, a DSN directory, a dispersed hierarchical index, and as encoded molecules 558 in the molecule storage 544.

Having received the data 550 and the ID information 552, the DS error encoding 112 partitions the data 550 into a plurality of data segments 1-S. Having partitioned the data 550, the DS error encoding 112 dispersed storage error encodes each data segment into a set of encoded data slices 1-n, where a decode threshold number of encoded data slices of the set of encoded data slices is needed to recover the data segment and where each slice includes one or more coded blocks. Each coded block includes one or more bytes that is produced as a result of matrix multiplying an encoding matrix of a dispersed storage error coding function by a row of a data matrix that includes the data 550.

Having produced a plurality of sets of encoded data slices 554, the DS error encoding 112 appends a portion of the ID information to one or more of the plurality of encoded data slices 554. For example, the DS error encoding 112 appends a corresponding slice name to each encoded data slice. As another example, the DS error encoding 112 dispersed storage error encodes the ID information 552 to produce a set of encoded identifier slices (e.g., for subsequent storage, for inclusion in a node of the dispersed hierarchical index, for inclusion in the DSN directory that associates the ID information 552 with the data 550).

The molecule encoder 540 translates one or more of the plurality of sets of encoded data slices 554, the appended portions of the ID information, the ID information 552, and the set of encoded identifier slices into molecule encoding information 556 in accordance with a translation approach. The molecule encoding information 556 includes encoding patterns for a plurality of molecules (e.g., for DNA molecules, for other molecules). The encoding may include obtaining the translation approach. The obtaining of the translation approach may be based on one or more of the ID information 552, a size of each slice, a size of the data, available storage facilities, a predetermination, and interpreting a query response.

The translation approach includes at least three approaches. A first approach includes each permutation of a plurality of bits of the encoded data slice field is mapped to a corresponding variant of a molecule structure. For example, mapping to molecules of one or more genes of DNA, or a DNA portion, or junk DNA. A second approach includes each permutation of the plurality of bits of the slice field map to a corresponding variant of two or more molecule structures. For example, in a q-ary encoding approach, where q is greater than or equal to two. A third approach includes a permutation of a plurality of bits of a portion of a coded block of the encoded data slice field is mapped to a corresponding variant of the one or more molecule structures.

In an example of operation of the translating of the one or more of the plurality of sets of encoded data slices 554 to produce the molecule encoding information 556, the molecule encoder 540 generates a number based on a selected encoded data slice for translation and identifies a gene based on the number to produce an identified gene. For instance, the molecule encoder 540 converts data (e.g., a slice portion such as one or more coded blocks) of the encoded data slice of the set of encoded data slices into the number (e.g., equates or performs a number lookup) and uses the number as a gene identifier to identify the gene (e.g., equates or performs a gene lookup). As another instance, the molecule encoder 540 performs a mathematical function (e.g., a deterministic function such as at least one of a hashing function, a hash based message authentication code, a mask generating function, and a sponge function) on the data of the encoded data slice of the set of encoded data slices to produce the number and uses the number as a gene identifier to identify the gene. As yet another instance, the molecule encoder 540 converts data of the encoded data slice of the set of encoded data slices into a plurality of numbers (e.g., a number for one or more coded blocks), where the plurality of numbers includes the number, generates a plurality of gene identifiers from the plurality of numbers, and uses the plurality of gene identifiers to identify a plurality of genes, where the plurality of genes includes the gene. As a still further instance, the molecule encoder 540 generates a preliminary number based on the encoded data slice, determines whether the preliminary number substantially matches a known gene identifier (e.g., attempts a lookup), sets the number to the preliminary number when the preliminary number substantially matches the known gene identifier, or performs a function (e.g., another deterministic function) on the preliminary number to produce the number when the preliminary number does not substantially match the known gene identifier.

Having identified the gene, the molecule encoder 540 creates a linking identifier (e.g., the ID information 552 and/or a slice name that corresponds to the encoded data slice) that links the encoded data slice to the identified gene, where, for the set of encoded data slices, a set of identified genes and a set of linking identifiers are created. As a specific example, when using the plurality of gene identifiers to identify a plurality of genes, the molecule encoder 540 creates the linking identifier that links the encoded data slice to the plurality of identified genes. As another specific example, when performing a function on the preliminary number to produce the number, the molecule encoder 540 creates the linking identifier that links the encoded data slice to the identified gene and identifies the function performed on the preliminary number.

Having created the linking identifier, the molecule encoder 540 generates molecular encoding information 556 from the set of identified genes and the set of linking identifiers, and outputs, the molecular encoding information 556 via an interface of the molecule encoder 540, to the molecule synthesizer 542, where the molecular encoding information 556 is used by the molecule synthesizer 542 to create a molecular storage structure for each identified gene of the set of identified genes yielding a set of molecular storage structures. The method of operation of the molecule encoder 540 is discussed in greater detail with reference to FIGS. 47A-C.

Having produced the molecule encoding information 556, the molecule synthesizer 542 processes the molecule encoding information 556 to fabricate a collection of encoded molecules 558 for storage in the molecule storage 544 in accordance with the storage ID information 560. For example, for a third encoded data slice of a second set of encoded data slices, the molecule encoder 540 translates the third encoded data slice into a third molecule encoding of the molecule encoding information, and the molecule synthesizer 542 fabricates the third molecule encoding into a third encoded molecule for storage in a third storage unit of the molecule storage 544, where the third storage unit is associated with a third storage ID of the storage ID information. Alternatively, the molecule synthesizer 542 sends, via a direct path, the encoded molecules 558 to the molecule sequencer 546. For example, the molecule synthesizer 542 receives a test request and sends the encoded molecules 558 to the molecule sequencer 546.

With the encoded molecules 558 stored in the molecule storage 544, the DSN may verify storage of the set of identified genes in the set of molecular structures (e.g., to verify storage of the data 550 as the encoded molecules 558 in the molecule storage 544). In an example of operation of the verifying, the molecule sequencer 546 accesses at least a test decode threshold number of molecular storage structures (e.g., retrieved encoded molecules 564) of the set of molecular storage structures to retrieve at least a decode threshold number of identified genes (e.g., molecule decoding information 566) of the set of identified genes. The molecule decoder 548 recovers at least a test decode threshold number of test encoded data slices (e.g., recovered slices 568) from the at least the test decode threshold number of identified genes. The DS error decoding 182 reconstructs a data segment from the at least a test decode threshold number of test encoded data slices to produce a reconstructed data segment (e.g., a portion of recovered data 570). At least one of the DS error encoding 112, the molecule encoder 540, the molecule decoder 548, and the DS error decoding 182 indicates a level of verifiable storage when the reconstructed data segment substantially matches the data segment. The level includes at least one of an estimated level of data retrieval reliability, an estimated level of data storage availability, a number of molecular storage structures accessed, a number of identified genes, and a number of test encoded data slices.

In an example of operation of the recovering of the data 550 as the recovered data 570, the DS error decoding 182 facilitates retrieval of some of the encoded molecules associated with the data to produce the retrieved encoded molecules 564 in accordance with the retrieval ID information 562. For example, the DS error decoding 182 identifies the data for retrieval (e.g., by translating a name of the data 550 into the retrieval ID information 562 utilizing the DSN directory) and outputs the retrieval ID information 562 to the molecule storage 544 to facilitate extracting of the retrieved encoded molecules 564 from molecule storage 544. Having received the retrieval ID information 562, the molecule storage 544 provides the retrieved encoded molecules 564 to the molecule sequencer 546 in accordance with the retrieval ID information 562. For example, the molecule storage 544 provides at least a decode threshold number of molecules of the set of molecules to the molecule sequencer 546 as the retrieved encoded molecules 554 when the retrieval ID information 562 identifies a set of storage units associated with storage of the set of molecules.

Having received the retrieved encoded molecules 564, the molecule sequencer 546 analyzes the retrieved encoded molecules 564 in accordance with a sequencing scheme associated with the collection of encoded molecules to produce molecule decoding information 566 and sends the molecule decoding information 566 to the molecule decoder 548. For example, the molecule sequencer 546 analyzes the retrieved encoded molecules 564 in accordance with a DNA sequencing scheme to produce the molecule decoding information 566 and sends the molecule decoding information 566 to the molecule decoder 548, where the molecule decoding information 566 includes identified DNA structures (e.g., one or more genes) and components.

Having received the molecule decoding information 566, the molecule decoder 548 decodes the molecule decoding information 566 to produce the recovered slices 568 of the plurality of sets of encoded data slices 554 in accordance with the translation approach and sends the recovered slices 568 to the DS error decoding 182, where at least a decode threshold number of encoded data slices are recovered for each set of encoded data slices. The decoding may further include interpreting slice names (e.g., from the linking identifiers) associated with the recovered slices to facilitate grouping of recovered slices 1-k for each data segment 1-S.

Having received the recovered slices 568, the DS error decoding 182 dispersed storage error decodes a decode threshold number of recovered slices per set of encoded data slices to produce a plurality of recovered data segments 1-S. The DS error decoding 182 aggregates the plurality of recovered data segments 1-S to produce the recovered data 570. The DS error decoding 182 may further dispersed storage error decode another decode threshold number of recovered slices of the set of encoded identifier slices to reproduce the portion of the ID information as recovered ID information 572. Alternatively, or in addition to, the DS error decoding 182 may de-append the portion of the ID information from one or more of the recovered slices to produce the recovered ID information 572 (e.g., extracts the linking identifiers).

Figure 46B:
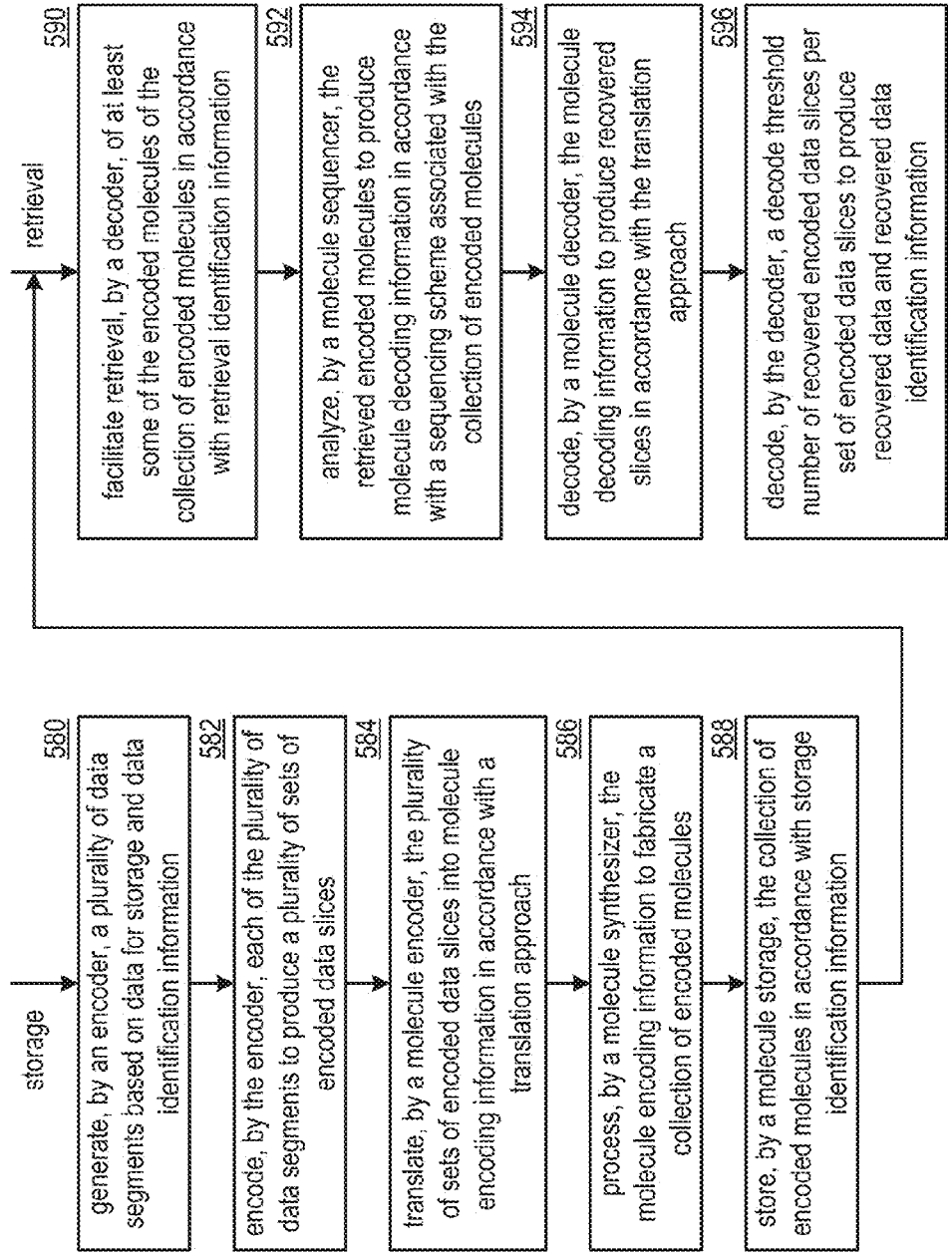
FIG. 46B is a flowchart illustrating an example of accessing data via molecule configuration in accordance with the present invention.

FIG. 46B is a flowchart illustrating an example of accessing data via molecule configuration. The method begins or continues, when storing the data, at step 580 where an encoder generates a plurality of data segments based on data for storage and data identification information. The generating includes one or more of partitioning the data in accordance with a partitioning scheme to produce the data segments and appending a portion of the data identification information to one or more of the data segments.

The method continues at step 582 where the encoder encodes each of the plurality of data segments to produce a plurality of sets of encoded data slices in accordance with a dispersed storage error coding function. The encoding may further include combining the data identification information with one or more of the encoded data slices. The combining includes at least one of appending and interleaving. Alternatively, or in addition to, the encoder encodes the data identification information using the dispersed storage error coding function to produce a set of encoded identifier slices.

The method continues at step 584 where a molecule encoder translates the plurality of sets of encoded data slices into molecule encoding information in accordance with a translation approach. For example, the molecule encoder obtains the translation approach and translates each encoded data slice of each set of encoded data slices into molecule encoding information for a molecule of a set of molecules.

The method continues at step 586 where a molecule synthesizer processes the molecule encoding information to fabricate a collection of encoded molecules. For example, the molecule synthesizer processes the molecule encoding information to fabricate a set of encoded molecules for each set of encoded data slices. As another example, the molecule synthesizer processes the molecule encoding information to fabricate a set of encoded molecules for two or more sets of encoded data slices. As yet another example, the molecule synthesizer processes the molecule encoding information to fabricate a single molecule for each set of encoded data slices, where a portion of the single molecule represents an encoded data slice of the set of encoded data slices.

The method continues at step 588 where a molecule storage stores the collection of encoded molecules in accordance with storage identification information. For example, the molecule storage interprets the data identification information to produce the storage identification information and utilizes the storage identification information to store the collection of encoded molecules in one or more storage facilities of the molecule storage.

The method continues, when retrieving the data, at step 590 where a decoder facilitates retrieval of at least some of the encoded molecules of the collection of molecules in accordance with retrieval identification information. For example, the decoder receives the retrieval identification information and sends the retrieval identification information to the molecule storage.

The method continues at step 592 where a molecule sequencer analyzes the retrieved encoded molecules to produce molecule decoding information in accordance with a sequencing scheme associated with the collection of encoded molecules. For example, the molecule sequencer obtains the sequencing scheme based on the collection of encoded molecules by performing a lookup based on the retrieval identification information.

The method continues at step 594 where a molecule decoder decodes the molecule decoding information to produce recovered slices in accordance with the translation approach. For example, the molecule decoder obtains a mapping of the translation approach, identifies patterns of the molecule decoding information based on a comparison to the mapping of the translation approach, and translates the identified patterns into blocks of encoded data slices as the recovered slices. The method continues at step 596 where the decoder decodes, utilizing a dispersed storage error coding function, a decode threshold number of recovered encoded data slices per set of encoded data slices to produce recovered data and recovered data identification information.

Figure 46C:
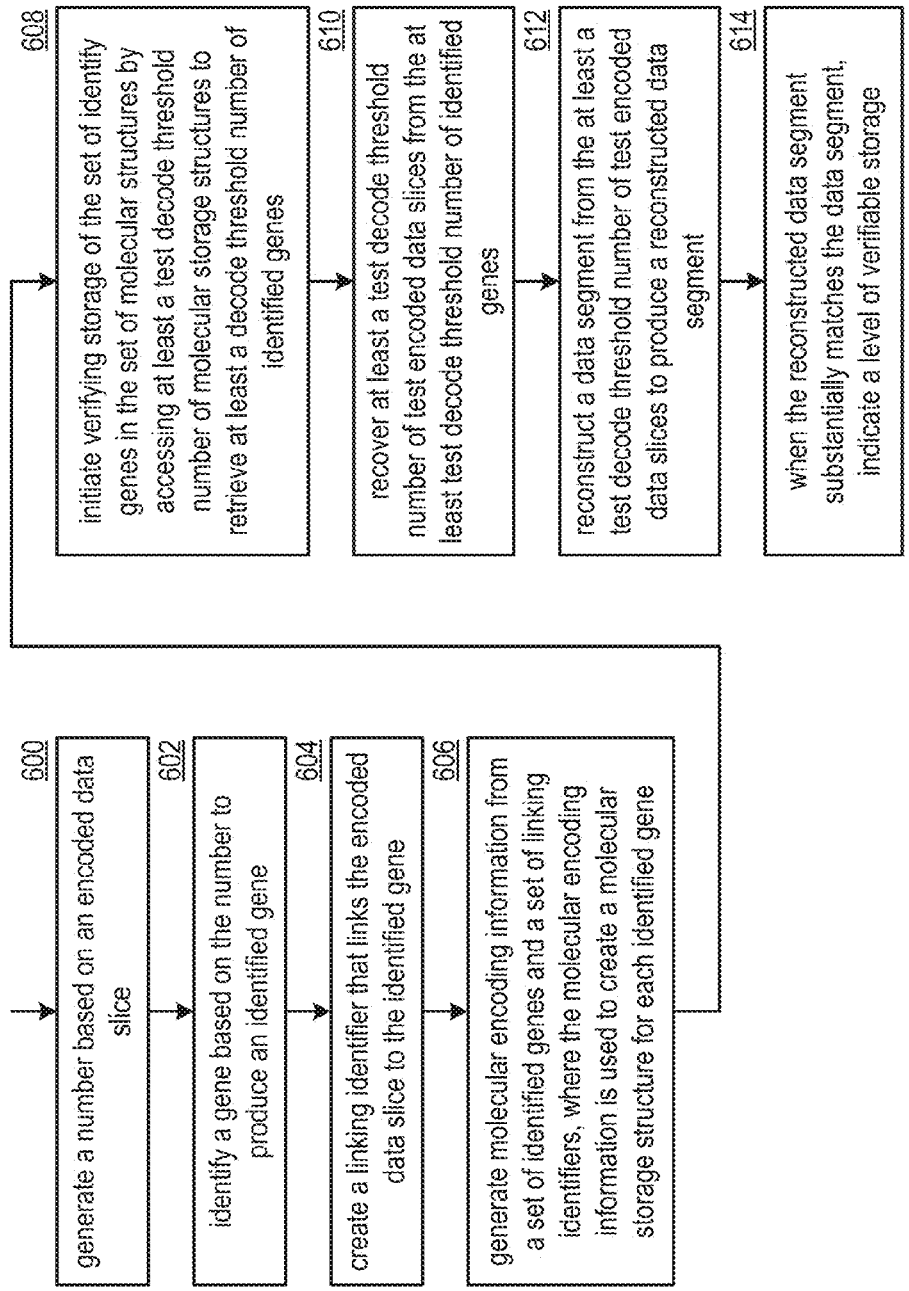
FIG. 46C is a flowchart illustrating an example of generating molecular encoding information for data storage in accordance with the present invention.

FIG. 46C is a flowchart illustrating an example of generating molecular encoding information for data storage. In particular, a method is presented for use in conjunction with one or more functions and features described in conjunction with FIGS. 1-39, 46A-B, and also FIG. 46C. The method begins at step 600 where a processing module of a computing device of one or more computing devices, for each encoded data slice of a set of encoded data slices, generates a number based on encoded data slice. A data segment is dispersed storage error encoded into the set of encode data slices. A decode threshold number of encoded data slices of the set of encoded data slices is needed to recover the data segment in accordance with a dispersed storage error coding function.

The method continues at step 602 where the processing module identifies a gene based on the number to produce an identified gene. As a specific example, the processing module converts data of the encoded data slice of the set of encoded data slices into the number and uses the number as a gene identifier to identify the gene. As another specific example, the processing module performs a mathematical function on data of the encoded data slice of the set of encoded data slices to produce the number and uses the number as a gene identifier to identify the gene. As yet another specific example, the processing module converts data of the encoded data slice of the set of encoded data slices into a plurality of numbers, where the plurality of numbers includes the number, generates a plurality of gene identifiers from the plurality of numbers, and uses the plurality of gene identifiers to identify a plurality of genes, where the plurality of genes includes the gene. As a further example, the processing module generates a preliminary number based on the encoded data slice, determines whether the preliminary number substantially matches a known gene identifier, sets the number to the preliminary number when the preliminary number substantially matches the known gene identifier, and performs a function on the preliminary number to produce the number when the preliminary number does not substantially match the known gene identifier.

The method continues at step 604 where the processing module creates a linking identifier that links the encoded data slice to the identified gene, where, for the set of encoded data slices, a set of identified genes and a set of linking identifiers are created. As a specific example, when using the plurality of gene identifiers to identify a plurality of genes, the processing module creates the linking identifier that links the encoded data slice to the plurality of identified genes. As another specific example, when performing a function on the preliminary number to produce the number, the processing module creates the linking identifier that links the encoded data slice to the identified gene and identifies the function performed on the preliminary number. The method continues at step 606 where the processing module generates molecular encoding information from the set of identified genes and the set of linking identifiers, where the molecular encoding information is used to create a molecular storage structure for each identified gene of the set of identified genes yielding a set of molecular storage structures.

The method continues at step 608, when verifying storage of the set of identified genes in the set of molecular structures, where the processing module accesses at least a test decode threshold number of molecular storage structures of the set of molecular storage structures to retrieve at least a decode threshold number of identified genes of the set of identified genes. The method continues at step 610 where the processing module recovers at least a test decode threshold number of test encoded data slices from the at least the test decode threshold number of identified genes. The method continues at step 612 where the processing module reconstructs a data segment from the at least a test decode threshold number of test encoded data slices to produce a reconstructed data segment. When the reconstructed data segment substantially matches the data segment, the method continues at step 614 where the processing module indicates a level of verifiable storage.

The method described above in conjunction with the processing module can alternatively be performed by other modules of the dispersed storage network or by other devices. In addition, at least one memory section of a computer readable storage medium that stores operational instructions can, when executed by one or more processing modules of one or more computing devices of a dispersed storage network (DSN), cause the one or more computing devices to perform any or all of the method steps described above.

Figures 47A, 47B:
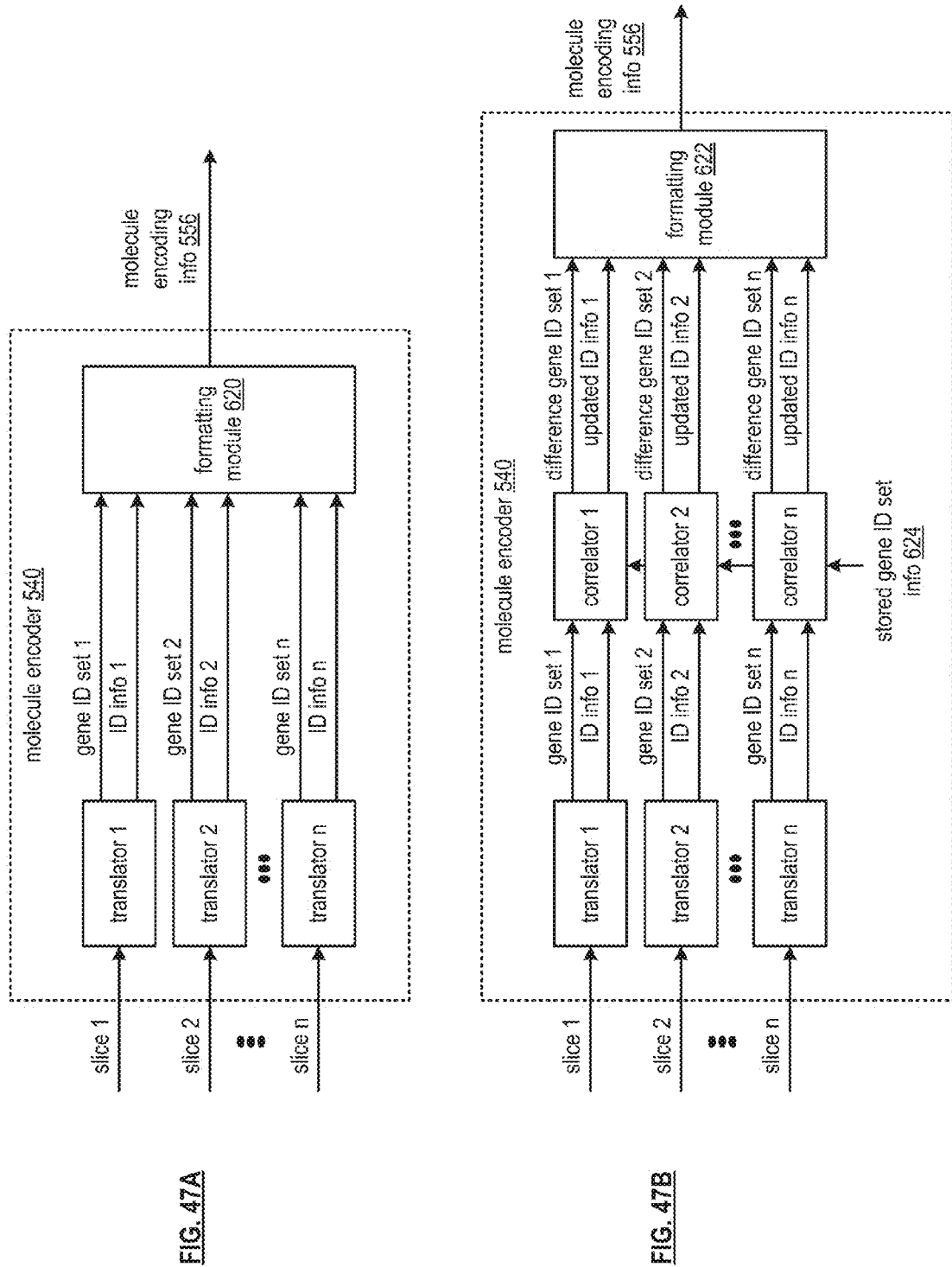
FIG. 47A is a schematic block diagram of an embodiment of a molecule encoder in accordance with the present invention.
FIG. 47B is a schematic block diagram of another embodiment of a molecule encoder in accordance with the present invention.

FIG. 47A is a schematic block diagram of an embodiment of a molecule encoder 540 that includes a set of translators 1-$n$ and a formatting module 620. Each translator and the formatting module 620 may be implemented utilizing a processing module (e.g., the processing module 84 of FIG. 3). The molecule encoder 540 functions to translate a plurality of sets of encoded data slices into molecule encoding information 556 in accordance with a translation approach, where the translation approach includes translation without regards to previously stored data. The molecule encoding information 556 includes encoding patterns for a plurality of molecules.

In an example of operation, each translator maps a bit pattern of a portion of a corresponding encoded data slice of a set of encoded data slices 1-$n$ to a set of genes. The mapping includes one or more of performing a lookup, initiating a query, receiving a query response, and applying a deterministic function. A number of portions of the encoded data slice may be based on a slice size, where a number of permutations of each portion is less than a number of permutations of an available number of genes per molecule. For example, the translator 1 maps the encoded data slice 1 to a gene identifier (ID) set 1, the translator 2 maps the encoded data slice 2 to a gene ID set 2, etc.

Having mapped the bit pattern of the portion of the corresponding encoded data slice to the set of genes, the translator obtains identification information (e.g., a slice name) for the encoded data slice. The obtaining includes one or more of receiving the identification information, extracting the identification information from the encoded data slice, and subsequently extracting the identification information from a reproduced data segment. For example, the translator 1 obtains identification (ID) information 1 for the encoded data slice 1 as ID info 1, the translator 2 obtains ID information 2 for the encoded data slice 1 as ID info 2, etc.

Having received the sets of gene identifiers and identification information from the set of translators 1-$n$, the formatting module 620 translates each gene identifier set and corresponding ID information into a portion of the molecule encoding information 556 in accordance with the translation approach of FIG. 46A. For example, the formatting module maps a combination of genes and identifier information of each gene identifier set to produce a corresponding molecule encoding, where the mapping is in accordance with a mapping of gene combinations and identifier information to molecule encodings.

FIG. 47B is a schematic block diagram of another embodiment of a molecule encoder 540 that includes the set of translators 1-$n$ of FIG. 47A, a set of correlators 1-$n$, and a formatting module 622. Each correlator and the formatting module 622 may be implemented utilizing a processing module. The molecule encoder 540 functions to translate a plurality of sets of encoded data slices into molecule encoding information 556 in accordance with a translation approach, where the translation approach includes translation with regards to previously stored data. The molecule encoding information 556 includes encoding patterns for a plurality of molecules.

In an example of operation, each translator maps a bit pattern of a portion of a corresponding encoded data slice of a set of encoded data slices 1-$n$ to a set of genes. For example, the translator 1 maps the encoded data slice 1 to a gene identifier (ID) set 1, the translator 2 maps the encoded data slice 2 to a gene ID set 2, etc.

Having mapped the bit pattern of the portion of the corresponding encoded data slice to the set of genes, the translator obtains identification information (e.g., a slice name) for the encoded data slice. For example, the translator 1 obtains identification (ID) information 1 for the encoded data slice 1 as ID info 1, the translator 2 obtains ID information 2 for the encoded data slice 1 as ID info 2, etc.

Having received a gene identifier set and corresponding identification information, each correlator identifies a similar gene ID set associated with the stored data. The identifying includes comparing the gene ID set to stored gene ID set information 624 (e.g., a directory or list of previously stored gene ID sets) and identifying a closest matching gene ID set (e.g., highest percentage of matching to similar genes). The identifying may further include obtaining the stored gene ID set information 624. The obtaining includes at least one of retrieving from a directory, retrieving from a dispersed hierarchical index, and retrieving from a molecule storage facility.

Having identified the closest matching gene ID set, the correlator determines a difference gene ID set based on the gene ID set and the closest matching gene ID set. For example, the correlator identifies a gene as a distance gene between a gene of the gene ID set an identified gene of the closest matching gene ID set based on a numerical difference between gene identifiers of the gene and the identified gene of the closest matching gene ID set. For example, correlator 1 correlates the gene ID set 1 to stored gene ID set information to produce a difference gene ID set 1.

Having determined the difference gene ID set, each correlator updates corresponding ID information to produce updated ID information. The updating includes generating a pointer to the closest matching gene set and appending the pointer to the ID information to produce the updated ID information. For example, the correlator 1 identifies the closest matching gene identifier set, obtains storage location information for the identified closest matching gene identifier set, appends the location information to the identifier information 1 to produce updated identifier information 1, and sends the updated ID information 1 to the formatting module.

Having received the sets of difference gene sets and updated identification information from the set of correlator's 1-$n$, the formatting module 622 translates each difference gene identifier set and updated ID information into a portion of the molecule encoding information 556 in accordance with the translation approach of FIG. 46A. For example, the formatting module 622 maps a combination of difference genes and the updated identifier information of each difference gene identifier set to produce a corresponding molecule encoding, where the mapping is in accordance with a mapping of gene combinations and identifier information to molecule encodings.

Figure 47C:
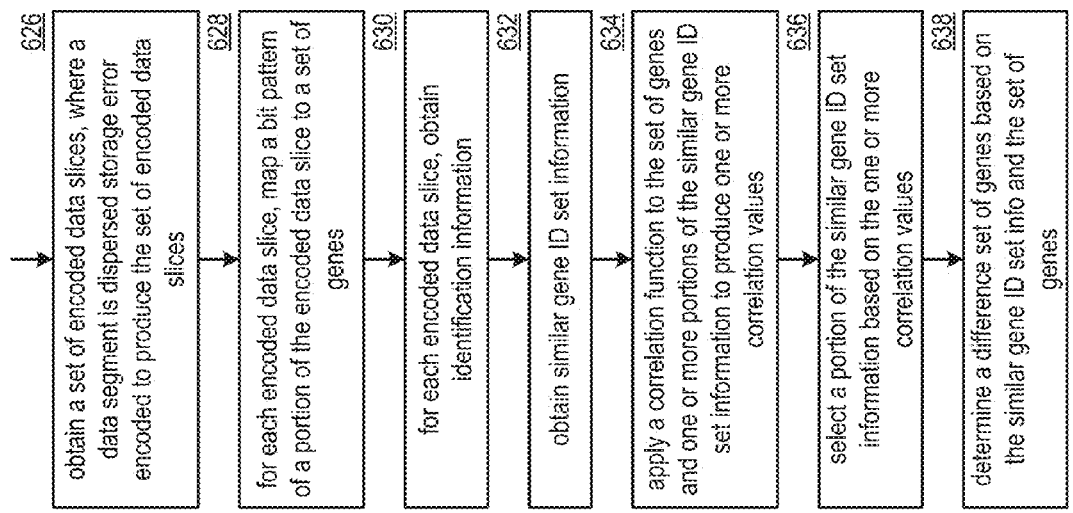
FIG. 47C is a flowchart illustrating an example of generating molecule encoding information in accordance with the present invention.

FIG. 47C is a flowchart illustrating an example of generating molecule encoding information. The method begins or continues at step 626 where a processing module (e.g., of a molecule encoder) obtains a set of encoded data slices, where a data segment is dispersed storage error encoded to produce the set of encoded data slices. For each encoded data slice, the method continues at step 628 where the processing module maps a bit pattern of a portion of the encoded data slice to a set of genes. For example, the processing module applies a deterministic function to the bit pattern to produce and identifier of a set of genes.

For each encoded data slice, the method continues at step 630 where the processing module obtains identification information. For example, the processing module extracts the identification information from one or more of the set of encoded data slices. The method continues at step 632 where the processing module obtains similar gene identification (ID) set information. The obtaining includes at least one of receiving and performing a lookup based on one or more of the identification information and identifiers of one or more of the sets of genes. For example, the processing module performs a deterministic function on the set of genes to produce a search factor and compares the search factor to factors associated with stored gene sets.

The method continues at step 634 where the processing module applies a correlation function to the set of genes and one or more portions of the similar gene ID set information to produce one or more correlation values. For example, the processing module identifies a gene ID set of the similar gene ID set information that is substantially the same as the set of genes. As another example, the processing module identifies another gene ID set of the similar gene ID set information that is less than 10% different than the set of genes.

The method continues at step 636 where the processing module selects a portion of the similar gene ID set information based on the one or more correlation values. The selecting includes identifying favorable correlation values (e.g., correlation is greater than a correlation threshold level), rank ordering the favorable correlation values, selecting a most favorable correlation value, and identifying the portion of the similar gene ID set information that corresponds to the selected most favorable correlation value.

The method continues at step 638 where the processing module determines a difference set of genes based on the similar gene ID set information and the set of genes. For example, the processing module calculates differences between gene identifiers of the similar gene ID information of the set of genes to produce the difference set of genes. Alternatively, or in addition to, the processing module updates the ID information to include addressing information of the selected portion of the similar gene ID set information. The method may further include translating each of the difference set of genes and updated ID information to produce molecule encoding information.

FIGS. 48A, B, C are schematic block diagrams of another embodiment of a dispersed storage network (DSN) illustrating an example of maintaining critical information. The DSN includes a set of distributed storage and task (DST) execution units 1-*n* and the network 24 of FIG. 1. Each DST execution unit includes the DST client module 34 of FIG. 1 and the memory 88 of FIG. 3. The memory 88 includes a plurality of memory devices 1-*m*. Each DST execution unit may be implemented utilizing the DST execution unit 36 of FIG. 1.

The DSN functions to maintain storage of critical information, where the critical information is required for operation of one or more of the DST execution units to perform further functions of the DSN (e.g., accessing data). The critical information includes one or more of BIOS software, bootstrap software, operating system software, important application software, a high priority encoded data slice, configuration information (e.g., number of memories, type of memory, input/output parameters, DSN address range assignment, storage error address range scanning assignment), system registry information, access list information, security information (an encryption key, an encryption algorithm indicator, a signed certificate), slice storage location information (slice name, a memory device ID, memory offset), and an index node file.

FIG. 48A illustrates initial steps of the example of the maintaining the critical information, where for each memory device 1-*m* of the DST execution unit 1, the DST client module 34 of the DST execution unit 1 identifies critical information stored in the memory device. The identifying includes at least one of searching by a critical information type, receiving a list, initiating a query, and receiving a query response. Having identified the critical information, the DST client module 34 aggregates the identified critical information from each memory device to produce aggregated critical information.

Having produced the aggregated critical information, the DST client module 34 dispersed storage error encodes the aggregated critical information to produce one or more sets of encoded critical slices 650. Having produced the one or more sets of encoded critical slices 650, the DST client module 34 selects a set of storage locations in accordance with a storage location selection scheme. The selecting includes obtaining the selection scheme based on retrieving from a list, utilizing a predetermination, interpreting a portion of a system registry, initiating a query, and receiving a query response.

The storage location selection scheme includes at least one of storing within a common computing device (e.g., DST execution unit 1), storing within computing devices at a common present site, and storing within computing devices of one or more sites. For example, the DST client module 34 selects a third memory device of the set of memory devices 1-*m* of the DST execution unit 1 as a first storage location and selects remaining DST execution units 2-*n* of the set of DST execution units as remaining storage locations of the set of storage locations.

Having selected the set of storage locations, the DST client module 34 facilitates storage of the one or more sets of encoded critical slices 650 at the selected set of storage locations. For example, the DST client module 34 writes a first encoded critical slice 652 in the third memory device of the DST execution unit 1 and sends remaining encoded critical slices 652 of the encoded critical slice set 650 to the DST execution units 2-*n*. For instance, the DST client module 34 issues a write slice request to DST execution unit 2, where the write slice request includes encoded critical slice 2.

FIG. 48B illustrates further steps of the example of the maintaining the critical information, where the DST client module 34 identifies unavailable critical information associated with a memory device of the DST execution unit 1. The identifying includes at least one of detecting a failure of the memory device, detecting removal of the memory device, interpreting an error message, and detecting a storage error. For example, the DST client module 34 detects a failure of memory device 2 of the memory 88. Having identified the failed memory device, the DST client module 34 identifies the unavailable critical information that is associated with the identified failed memory device. The identifying may be based on one or more of a lookup, accessing a directory, interpreting a portion of system registry information, interpreting an error message, and receiving a request.

Having identified the unavailable critical information, the DST client module 34 determines whether to remedy the unavailable critical information. The determining may be based on one or more of detecting activation of a replacement memory, detecting operation of the previously identified failed memory, and receiving a request. For example, the DST client module 34 detects replacement of the memory device 2 with a replacement memory device 2.

When remedying the unavailable critical information, the DST client module 34 identifies the set of storage locations in accordance with the storage location selection scheme. For example, the DST client module 34 accesses BIOS information to retrieve the set of storage locations. Having identified the set of storage locations, the DST client module 34 facilitates retrieval of at least a decode threshold number of encoded critical slices 652 for each set of encoded critical slices corresponding to the critical information. For example, the DST client module 34 retrieves one or more encoded critical slices 652 from the memory 88, issues read slice requests to the remaining DST execution units 2-*n*, and receives read slice responses that includes encoded critical slices 652.

FIG. 48C illustrates still further steps of the example of the maintaining the critical information, where, for each of the at least a decode threshold number of encoded critical slices, the DST client module 34 dispersed storage error decodes the at least a decode threshold number of encoded critical slices to reproduce the aggregated critical information. Having reproduced the aggregated critical information, the DST client module 34 extracts the critical information from the aggregated critical information. For example, the DST client module 34 extracts the critical information 2 that is associated with the memory device 2 of the unavailable information.

Having extracted the critical information, the DST client module 34 identifies a storage location for the extracted critical information. The identifying includes at least one of identifying the memory device that is now available, identifying the replacement memory device, and identifying another suitable memory device. For example, the DST client module 34 identifies a memory device 2 as the replacement memory device. Having identified storage location, the DST client module 34 facilitates storage of the extracted critical information in the identified storage location. For example, the DST client module 34 writes the critical information 2 to the memory device 2.

FIG. 48D is a flowchart illustrating an example of maintaining critical information. The method begins or continues, when storing critical information, at step 656 where a processing module (e.g., of a distributed storage and task (DST) client module) identifies the critical information stored in one or more memory devices of a computing device. The identifying includes at least one of searching, comparing stored data to a list, initiating a query, and receiving a query response. The method continues at step 658 where the processing module obtains identified critical information from the one or more memory devices. The obtaining includes at least one of reading, issuing a read request, and receiving a read response.

The method continues at step 660 where the processing module dispersed storage error encodes the identifying critical information to produce one or more sets of encoded critical slices. For example, the processing module aggregates the identifying critical information to produce aggregated critical information and dispersed storage error encodes the aggregated critical information to produce the one or more sets of encoded critical slices.

The method continues at step 662 where the processing module selects a set of storage units in accordance with a storage location selection scheme. The selection may be based on one or more of storage location availability, a predetermination, a system registry information, and bios information. The method continues at step 664 where the processing module facilitates storage of the one or more sets of encoded critical slices in the selected set of storage locations. The facilitating includes writing an encoded critical slice to a memory device and issuing a write slice request to a storage unit, where the write slice request includes another encoded critical slice.

The method continues, when restoring the critical information, at step 666 where the processing module identifies unavailable critical information of a corresponding memory device. The identifying includes one or more of interpreting a test result, receiving an error message, detecting removal of a memory device, and detecting a failure of a memory device. The method continues at step 668 where the processing module determines whether to remedy the unavailable critical information. For example, the processing module indicates to remedy when detecting that a replacement memory device has been configured to replace the corresponding memory device. As another example, the processing module indicates to remedy when receiving a request to remedy. As yet another example, the processing module indicates to remedy when detecting that the corresponding memory device is now available.

When remedying the unavailable critical information, the method continues at step 670 where the processing module identifies the set of storage locations. For example, the processing module interprets a directory entry. As another example, the processing module interprets retrieval of a portion of BIOS information. The method continues at step 672 where the processing module facilitates retrieval of at least a decode threshold number of encoded critical slices per set of encoded critical slices corresponding to the unavailable critical information. For example, the processing module utilizes the identified set of storage locations to read from a local memory, issues read slice requests to storage units, and receives read slice responses from at least some of the storage units.

The method continues at step 674 where, for each set, the processing module dispersed storage error decodes each of at least a decode threshold number of encoded critical slices to produce rebuilt critical information. For example, the processing module decodes each decode threshold number of encoded critical slices to reproduce one or more data segments and aggregates the one or more data segments to produce the rebuilt critical information corresponding to the unavailable critical information.

The method continues at step 676 where the processing module identifies a storage location for the rebuilt critical information. For example, the processing module interprets a directory entry to identify the storage location. As another example, the processing module accesses the bios information to identify the storage location. As yet another example, the processing module identifies a replacement memory device as the storage location for the rebuilt critical information.

The method continues at step 678 where the processing module facilitates storage of the rebuilt critical information in the identified storage location. The facilitating includes, when storing in a local memory, writing the rebuilt critical information to the local memory. When utilizing a storage unit, the facilitating includes sending the critical information to the storage unit.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc., described with reference to one or more of the embodiments discussed herein. Further, from figure to figure, the embodiments may incorporate the same or similarly named functions, steps, modules, etc., that may use the same or different reference numbers and, as such, the functions, steps, modules, etc., may be the same or similar functions, steps, modules, etc., or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by one or more processing modules of one or more computing devices, the method comprises:

for each encoded data slice of a set of encoded data slices, wherein a data segment is dispersed storage error encoded into the set of encoded data slices and wherein a decode threshold number of encoded data slices of the set of encoded data slices is needed to recover the data segment:
  generating a number based on the encoded data slice;
  identifying a deoxyribonucleic acid (DNA) molecule structure based on the number to produce an identified DNA molecule, wherein the identified DNA molecule structure includes at least one oligonucleotide; and
  creating a linking identifier that links the encoded data slice to the identified DNA molecule, wherein, for the set of encoded data slices, a set of identified DNA molecules and a set of linking identifiers are created; and
generating molecular encoding information from the set of identified DNA molecules and the set of linking identifiers, wherein the molecular encoding information is used to create a molecular storage structure for each identified DNA molecule of the set of identified DNA molecules yielding a set of molecular storage structures.

2. The method of claim 1 further comprises:
converting data of the encoded data slice of the set of encoded data slices into the number; and
using the number as a DNA molecule identifier to identify the DNA molecule structure.

3. The method of claim 1 further comprises:
performing a mathematical function on data of the encoded data slice of the set of encoded data slices to produce the number; and
using the number as a DNA molecule identifier to identify the DNA molecule structure.

4. The method of claim 1 further comprises:
converting data of the encoded data slice of the set of encoded data slices into a plurality of numbers, wherein the plurality of numbers includes the number;
generating a plurality of DNA molecule identifiers from the plurality of numbers;
using the plurality of DNA molecule identifiers to identify a plurality of DNA molecules, wherein the plurality of DNA molecules includes the identified DNA molecule; and
creating the linking identifier that links the encoded data slice to the plurality of identified DNA molecules.

5. The method of claim 1 further comprises:
generating a preliminary number based on the encoded data slice;
determining whether the preliminary number substantially matches a known DNA molecule identifier;
when the preliminary number substantially matches the known DNA molecule identifier, setting the number to the preliminary number;
when the preliminary number does not substantially match the known DNA molecule identifier, performing a function on the preliminary number to produce the number; and
creating the linking identifier that links the encoded data slice to the identified DNA molecule and identifies the function performed on the preliminary number.

6. The method of claim 1 further comprises:
verifying storage of the set of identified DNA molecules in the set of molecular storage structures by:
  accessing at least a test decode threshold number of molecular storage structures of the set of molecular storage structures to retrieve at least a test decode threshold number of identified DNA molecules of the set of identified DNA molecules;
  recovering at least a test decode threshold number of test encoded data slices from the at least the test decode threshold number of identified DNA molecules;
  reconstructing another data segment from the at least a test decode threshold number of test encoded data slices to produce a reconstructed data segment; and
  when the reconstructed data segment substantially matches the data segment, indicating a level of verifiable storage.

7. A non-transitory computer readable storage medium comprises:
at least one memory section that stores operational instructions that, when executed by one or more processing modules of one or more computing devices, causes the one or more computing devices to:
for each encoded data slice of a set of encoded data slices, wherein a data segment is dispersed storage error encoded into the set of encoded data slices and wherein a decode threshold number of encoded data slices of the set of encoded data slices is needed to recover the data segment:
  generate a number based on the encoded data slice;
  identify a deoxyribonucleic acid (DNA) molecule structure based on the number to produce an identified DNA molecule, wherein the identified DNA molecule structure includes at least one oligonucleotide; and
  create a linking identifier that links the encoded data slice to the identified DNA molecule, wherein, for the set of encoded data slices, a set of identified DNA molecules and a set of linking identifiers are created; and
generate molecular encoding information from the set of identified DNA molecules and the set of linking identifiers, wherein the molecular encoding information is used to create a molecular storage structure for each identified DNA molecule of the set of identified DNA molecules yielding a set of molecular storage structures.

8. The non-transitory computer readable storage medium of claim 7 further comprises:
the at least one memory section stores further operational instructions that, when executed by the one or more processing modules, causes the one or more computing devices to:
convert data of the encoded data slice of the set of encoded data slices into the number; and
use the number as a DNA molecule identifier to identify the DNA molecule structure.

9. The non-transitory computer readable storage medium of claim 7 further comprises:
the at least one memory section stores further operational instructions that, when executed by the one or more processing modules, causes the one or more computing devices to:
perform a mathematical function on data of the encoded data slice of the set of encoded data slices to produce the number; and
use the number as a DNA molecule identifier to identify the DNA molecule structure.

10. The non-transitory computer readable storage medium of claim 7 further comprises:

the at least one memory section stores further operational instructions that, when executed by the one or more processing modules, causes the one or more computing devices to:
convert data of the encoded data slice of the set of encoded data slices into a plurality of numbers, wherein the plurality of numbers includes the number;
generate a plurality of DNA molecule identifiers from the plurality of numbers;
use the plurality of DNA molecule identifiers to identify a plurality of DNA molecules, wherein the plurality of DNA molecules includes the identified DNA molecule; and
create the linking identifier that links the encoded data slice to the plurality of identified DNA molecules.

11. The non-transitory computer readable storage medium of claim 7 further comprises:
the at least one memory section stores further operational instructions that, when executed by the one or more processing modules, causes the one or more computing devices to:
generate a preliminary number based on the encoded data slice;
determine whether the preliminary number substantially matches a known DNA molecule identifier;
when the preliminary number substantially matches the known DNA molecule identifier, set the number to the preliminary number;
when the preliminary number does not substantially match the known DNA molecule identifier, perform a function on the preliminary number to produce the number; and
create the linking identifier that links the encoded data slice to the identified DNA molecule and identifies the function performed on the preliminary number.

12. The non-transitory computer readable storage medium of claim 7 further comprises:
the at least one memory section stores further operational instructions that, when executed by the one or more processing modules, causes the one or more computing devices to:
verify storage of the set of identified DNA molecules in the set of molecular storage structures by:
accessing at least a test decode threshold number of molecular storage structures of the set of molecular storage structures to retrieve at least a test decode threshold number of identified DNA molecules of the set of identified DNA molecules;
recovering at least a test decode threshold number of test encoded data slices from the at least the test decode threshold number of identified DNA molecules;
reconstructing another data segment from the at least a test decode threshold number of test encoded data slices to produce a reconstructed data segment; and
when the reconstructed data segment substantially matches the data segment, indicating a level of verifiable storage.

13. A computing device of a group of computing devices, the computing device comprises:
an interface;
a local memory; and
a processing module operably coupled to the interface and the local memory, wherein the processing module functions to:
for each encoded data slice of a set of encoded data slices, wherein a data segment is dispersed storage error encoded into the set of encoded data slices and wherein a decode threshold number of encoded data slices of the set of encoded data slices is needed to recover the data segment:
generate a number based on the encoded data slice;
identify a deoxyribonucleic acid (DNA) molecule structure based on the number to produce an identified DNA molecule, wherein the identified DNA molecule structure includes at least one oligonucleotide; and
create a linking identifier that links the encoded data slice to the identified DNA molecule, wherein, for the set of encoded data slices, a set of identified DNA molecules and a set of linking identifiers are created; and
generate molecular encoding information from the set of identified DNA molecules and the set of linking identifiers, wherein the molecular encoding information is used to create a molecular storage structure for each identified DNA molecule of the set of identified DNA molecules yielding a set of molecular storage structures.

14. The computing device of claim 13, wherein the processing module further functions to:
convert data of the encoded data slice of the set of encoded data slices into the number; and
use the number as a DNA molecule identifier to identify the DNA molecule structure.

15. The computing device of claim 13, wherein the processing module further functions to:
perform a mathematical function on data of the encoded data slice of the set of encoded data slices to produce the number; and
use the number as a DNA molecule identifier to identify the DNA molecule structure.

16. The computing device of claim 13, wherein the processing module further functions to:
convert data of the encoded data slice of the set of encoded data slices into a plurality of numbers, wherein the plurality of numbers includes the number;
generate a plurality of DNA molecule identifiers from the plurality of numbers;
use the plurality of DNA molecule identifiers to identify a plurality of DNA molecules, wherein the plurality of DNA molecules includes the identified DNA molecule; and
create the linking identifier that links the encoded data slice to the plurality of identified DNA molecules.

17. The computing device of claim 13, wherein the processing module further functions to:
generate a preliminary number based on the encoded data slice;
determine whether the preliminary number substantially matches a known DNA molecule identifier;
when the preliminary number substantially matches the known DNA molecule identifier, set the number to the preliminary number;
when the preliminary number does not substantially match the known DNA molecule identifier, perform a function on the preliminary number to produce the number; and
create the linking identifier that links the encoded data slice to the identified DNA molecule and identifies the function performed on the preliminary number.

18. The computing device of claim 13, wherein the processing module further functions to:

verify storage of the set of identified DNA molecules in the set of molecular storage structures by:
  accessing, via the interface, at least a test decode threshold number of molecular storage structures of the set of molecular storage structures to retrieve at least a test decode threshold number of identified DNA molecules of the set of identified DNA molecules;
  recovering at least a test decode threshold number of test encoded data slices from the at least the test decode threshold number of identified DNA molecules;
  reconstructing another data segment from the at least a test decode threshold number of test encoded data slices to produce a reconstructed data segment; and
  when the reconstructed data segment substantially matches the data segment, indicating a level of verifiable storage.

\* \* \* \* \*